(12) United States Patent
Jung et al.

(10) Patent No.: US 11,973,307 B2
(45) Date of Patent: Apr. 30, 2024

(54) SURFACE-EMITTING LASER DEVICE

(71) Applicant: SUZHOU LEKIN SEMICONDUCTOR CO., LTD., Taicang (CN)

(72) Inventors: Se Yeon Jung, Seoul (KR); Yong Gyeong Lee, Seoul (KR); Seung Hwan Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 768 days.

(21) Appl. No.: 17/043,338

(22) PCT Filed: Apr. 12, 2019

(86) PCT No.: PCT/KR2019/004437
§ 371 (c)(1),
(2) Date: Sep. 29, 2020

(87) PCT Pub. No.: WO2019/199117
PCT Pub. Date: Oct. 17, 2019

(65) Prior Publication Data
US 2021/0028604 A1 Jan. 28, 2021

(30) Foreign Application Priority Data

Apr. 12, 2018 (KR) .................. 10-2018-0042771
May 23, 2018 (KR) .................. 10-2018-0058238
Jul. 20, 2018 (KR) .................. 10-2018-0084685

(51) Int. Cl.
*H01S 5/00* (2006.01)
*H01S 5/042* (2006.01)
(Continued)

(52) U.S. Cl.
CPC .......... *H01S 5/0021* (2013.01); *H01S 5/0425* (2013.01); *H01S 5/04252* (2019.08);
(Continued)

(58) Field of Classification Search
CPC .. H01S 5/0021; H01S 5/0425; H01S 5/04252; H01S 5/04253; H01S 5/18; H01S 5/423
See application file for complete search history.

(56) References Cited

U.S. PATENT DOCUMENTS 5,115,441 A    5/1992  Kopf et al.
6,529,541 B1*  3/2003  Ueki .................. H01S 5/18394
                                                       372/96
(Continued)

FOREIGN PATENT DOCUMENTS

JP    2009-259857 A    11/2009
JP    2010-183071 A    8/2010
(Continued)

*Primary Examiner* — Kinam Park
(74) *Attorney, Agent, or Firm* — Birch, Stewart, Kolasch & Birch, LLP

(57) ABSTRACT

This surface-emitting laser device comprises: a first reflective layer; an active region disposed over the first reflective layer; an aperture region which is disposed over the active region and comprises an aperture and an insulating region; a second reflective layer disposed over the aperture region; and a second electrode electrically connected to the second reflective layer. The second electrode comprises first to sixth conductive layers. The first conductive layer may comprises Ti, and the sixth conductive layer may comprise Au.

20 Claims, 41 Drawing Sheets

(51) Int. Cl.
*H01S 5/18* (2021.01)
*H01S 5/42* (2006.01)
*H01S 5/183* (2006.01)

(52) U.S. Cl.
CPC ............ H01S 5/04253 (2019.08); H01S 5/18 (2013.01); H01S 5/423 (2013.01); *H01S 5/18377* (2013.01); *H01S 5/18394* (2013.01)

(56) References Cited

U.S. PATENT DOCUMENTS

| | | | |
|---|---|---|---|
| 7,515,623 B2 * | 4/2009 | Watanabe | H01S 5/18388 |
| | | | 372/50.23 |
| 8,774,242 B2 | 7/2014 | Itoh et al. | |
| 9,203,215 B2 * | 12/2015 | Makino | H01S 5/18311 |
| 2006/0284163 A1 | 12/2006 | Bour et al. | |
| 2010/0232465 A1 * | 9/2010 | Tsukiji | H01S 5/04252 |
| | | | 438/22 |
| 2013/0188659 A1 | 7/2013 | Kondo et al. | |
| 2016/0064900 A1 * | 3/2016 | Takeda | H01S 5/18361 |
| | | | 372/45.01 |
| 2021/0135428 A1 * | 5/2021 | Hamaguchi | H01S 5/18369 |

FOREIGN PATENT DOCUMENTS

| | | |
|---|---|---|
| JP | 2012-113134 A | 6/2012 |
| JP | 2016-25292 A | 2/2016 |
| JP | 2016-46453 A | 4/2016 |
| KR | 2003-0047421 A | 6/2003 |
| KR | 10-0538213 B1 | 12/2005 |
| KR | 10-2006-0131652 A | 12/2006 |
| KR | 10-2011-0085609 A | 7/2011 |
| KR | 10-2011-0088469 A | 8/2011 |
| KR | 10-2015-0064206 A | 6/2015 |
| KR | 10-2017-0125640 A | 11/2017 |
| KR | 10-2018-0005827 A | 1/2018 |

* cited by examiner

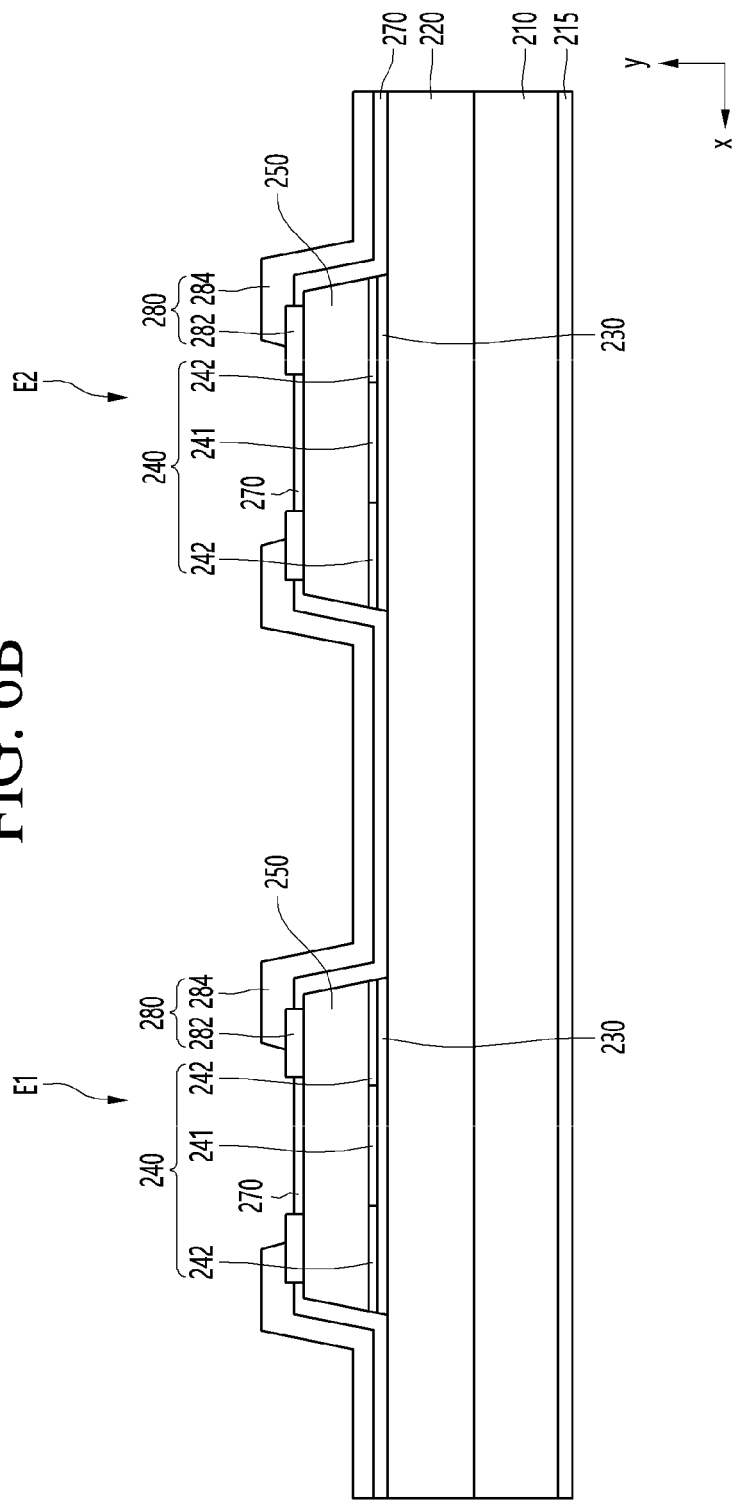

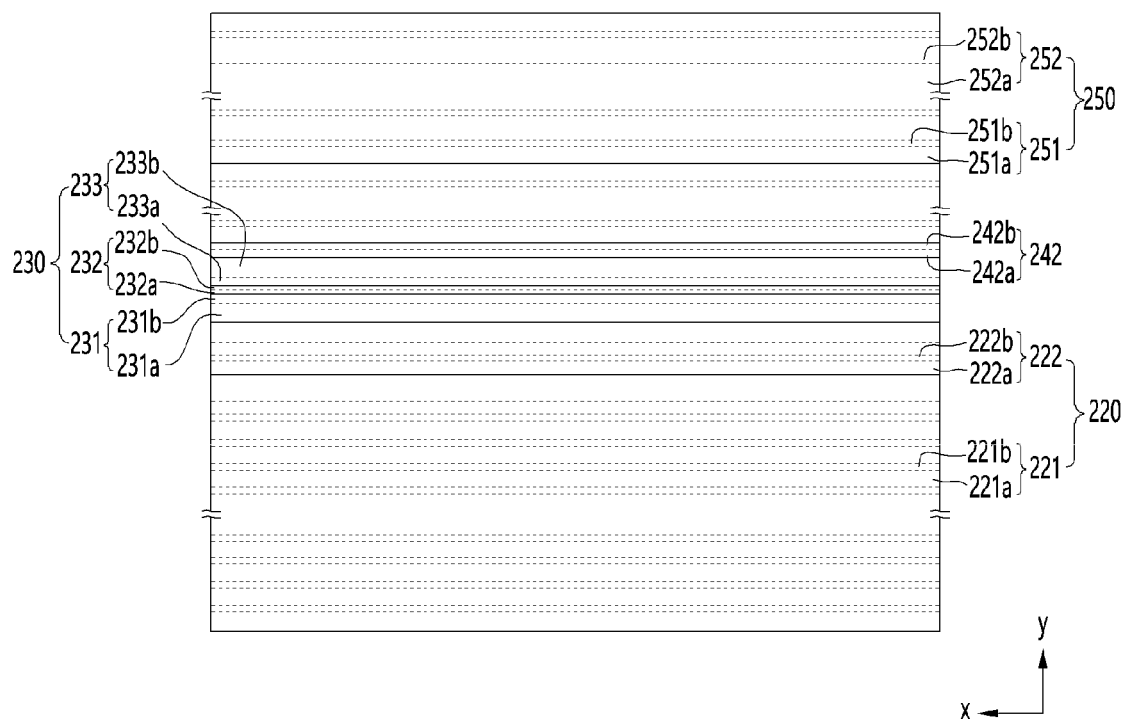

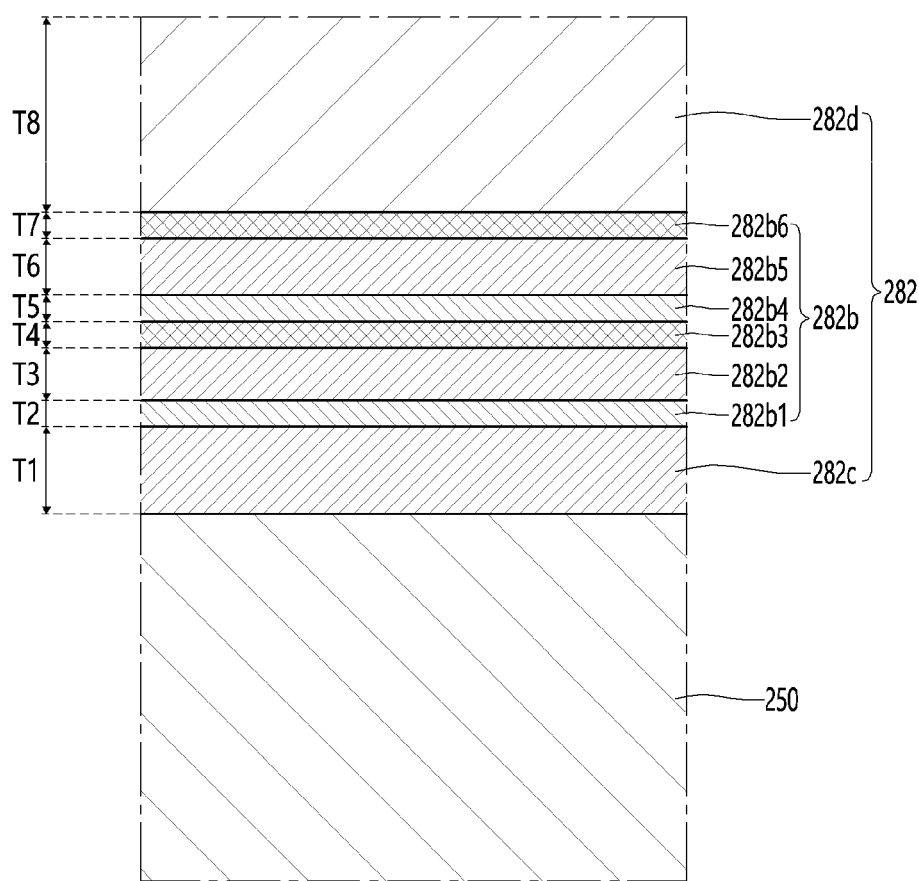

|  | CONTACT RESISTANCE(ohm.com2) |
|---|---|
| RELATED ART | 1.46E-5 |
| EMBODIMENT | 8.34E-6 |

SURFACE-EMITTING LASER DEVICE

CROSS REFERENCE TO RELATED APPLICATIONS

This application is the National Phase of PCT/KR2019/004437 filed on Apr. 12, 2019, which claims priority under 35 U.S.C. § 119(a) to Patent Application Nos. 10-2018-0042771; 10-2018-0058238; and 10-2018-0084685 filed in the Republic of Korea on Apr. 12, 2018; May 23, 2018; and Jul. 20, 2018, respectively, all of which are hereby expressly incorporated by reference into the present application.

TECHNICAL FIELD

Embodiments relate to a surface-emitting laser device.

BACKGROUND ART

Semiconductor devices including compounds such as GaN or AlGaN have many advantages such as wide and easily-adjustable band gap energy and thus may be variously used in light emitting devices, light receiving devices and various types of diodes.

In particular, light emitting devices such as light emitting diodes or laser diodes using Group III-V or II-VI compound semiconductor materials may implement various colors such as red, green, blue and ultraviolet rays with development of thin-film growth technology and device materials, implement efficient white rays by using fluorescent materials or combining colors, and have advantages such as low power consumption, semi-permanent life, fast response speed, safety and eco friendliness as compared to existing light sources such as fluorescent lamps and incandescent lamps.

In addition, when light receiving devices such as photodetectors or solar cells are manufactured using Group III-V or II-VI compound semiconductor materials, thanks to development of device materials, light in various wavelength ranges may be absorbed to generate photo current, thereby using light in various wavelength ranges from gamma rays to radio wavelength ranges. In addition, such light receiving devices have advantages such as fast response speed, safety, eco friendliness or easy adjustment of device materials, thereby being easily used in power control, ultrahigh frequency circuits or communication modules.

Accordingly, applications are expanding to transmission modules of optical communication units, light emitting diode backlights which replace cold cathode fluorescence lamps (CCFLs) configuring the backlights of liquid crystal display (LCD) display devices, white light emitting diode lighting devices which may replace the fluorescent or incandescent light lamps, automobile headlights and traffic lights and sensors for detecting gas or fire.

In addition, applications may expand to high-frequency application circuits, other power control apparatuses or communication modules. For example, conventional semiconductor light source device technologies include verticalcavity surface-emitting lasers (VCSELs), which are used in optical communication, optical parallel processing, optical connection, etc. Meanwhile, laser diodes used in the communication modules are designed to operate at low current.

Meanwhile, in the existing structures for data optical communication, response speed has been important. However, recently, due to applications to high power packages (PKGs) for sensors, optical output and voltage efficiency are becoming important characteristics.

For example, a three-dimensional (3D) sensing camera may capture depth information of an object and has recently been in the spotlight in conjunction with augmented reality. Meanwhile, for depth sensing of a camera module, a separate sensor is mounted. In addition, there are structured light (SL) method and a time of flight (ToF) method.

In the SL method, after a laser having a specific pattern is radiated onto a subject, depth is calculated by analyzing a degree of deformation of the pattern according to the shape of the surface of the subject and then combination with a picture taken by an image sensor is performed, thereby obtaining a 3D shooting result.

On the other hand, in the ToF method, depth is calculated by measuring a time required for a laser to reflect from a subject and return and then combination with a picture taken by an image sensor is performed, thereby obtaining a 3D shooting result.

In the SL method, the laser needs to be located very accurately. However, the ToF technology depends on an improved image sensor and thus has an advantage in mass production. It is possible to employ one or both of these methods in one mobile phone.

For example, it is possible to implement a 3D camera called True Depth on a front surface of the mobile phone using the SL method and to apply the ToF method to a rear surface of the mobile phone.

Meanwhile, when a VCSEL is applied to a structured light sensor, a time of flight (ToF) sensor or laser diode autofocus (LDAF), this operates at high current. Therefore, optical output may decrease or threshold current may increase.

INVENTION

Technical Problem

Embodiments provide a surface-emitting laser device having a new structure.

Embodiments provide a surface-emitting laser device having an electrode structure having high reliability.

Embodiments provide a surface-emitting laser device capable of solving optical problems such as pattern division of emitted beams or increase in divergence angle of emitted beams.

Embodiments provide a surface-emitting laser device capable of improving ohmic characteristics.

Embodiments provide a surface-emitting laser device capable of improving ohmic characteristics.

Embodiments provide a surface-emitting laser device capable of preventing apertures from being damaged or the divergence angle of emitted beams from increasing.

Embodiments provide a surface-emitting laser device capable of minimizing contact resistance.

Embodiments provide a surface-emitting laser device having high output.

Embodiments provide a surface-emitting laser device capable of reducing power consumption.

Technical Solution

According to an aspect for achieving the above-described objects, a surface-emitting laser device includes a first reflective layer, an active region disposed on the first reflective layer, an aperture region disposed on the active region and including an aperture and an insulating region, a second reflective layer disposed on the aperture region, and a second electrode electrically connected to the second reflective layer. The second electrode includes a first conductive layer, a second conductive layer on the first conductive layer, a third conductive layer on the second conductive layer, a fourth conductive layer on the third conductive layer, a fifth conductive layer on the fourth conductive layer, and a sixth conductive layer on the fifth conductive layer. The first conductive layer includes Ti, and the sixth conductive layer includes Au.

Effect of the Invention

Embodiments provide a surface-emitting laser device having an electrode structure having high reliability.

For example, by controlling a second barrier layer 282b2 including a Ti layer to be in a tensile stress (TS) state and a first barrier layer 282b1 including a Ni layer to be in a compressive stress (CS) state, it is possible to prevent internal stress from occurring in a barrier layer 282b including the first barrier layer 282b1 and the second barrier layer 282b2. Therefore, it is possible to provide a surface-emitting laser device including an electrode structure having high reliability even in a state in which current density is high.

Embodiments provide a surface-emitting laser device capable of solving optical problems such as pattern division of emitted beams or increase in divergence angle of emitted beams.

Embodiments provide a surface-emitting laser device capable of improving ohmic characteristics.

In an embodiment, in a structure in which a first electrode layer of a second electrode is disposed on a second reflective layer, the first electrode layer of the second electrode is formed of metal having a work function similar to that of the second reflective layer, thereby reducing contact resistance. Therefore, it is possible to emit light with higher output power even at a lower operating voltage.

In an embodiment, in a structure in which a first electrode layer and a second electrode layer of a second electrode is disposed on a second reflective layer, since the first reflective layer is formed with a plurality of nano patterns such that the second electrode layer is adhered not only to the second reflective layer but also to the first electrode layer, the adhesive force of the second electrode layer may be improved, thereby preventing the second electrode from being detached or removed.

In an embodiment, since the first reflective layer is formed with nano patterns having a random shape and the second electrode layer is adhered to the surfaces of the nano patterns, the adhesion area of the second electrode may increase, thereby further improving the adhesive force of the second electrode layer.

In an embodiment, since a portion of the second electrode layer having excellent electrical conductivity is in contact with the second reflective layer, current may directly flow from the second electrode layer to the second reflective layer, and, since another portion of the second electrode layer includes metal which minimizes the contact resistance with the second reflective layer, current may flow to the second reflective layer through the first electrode layer, thereby preventing current loss and reducing power consumption.

DESCRIPTION OF DRAWINGS

FIG. 6b is a second cross-sectional view of the surface-light laser device according to the first embodiment shown in FIG. 5, taken along line A3-A4.

FIG. 7 is a cross-sectional view of a portion B1 of an epi region of the surface-light laser device according to the first embodiment shown in FIG. 6a.

FIG. 8 is a cross-sectional view showing a first example of a first region P1 of the surface-light laser device according to the first embodiment shown in FIG. 6a.

FIG. 10 is a cross-sectional view showing a second example of the first region P1 of the surface-light laser device according to the first embodiment shown in FIG. 6a.

BEST MODE

Hereinafter, exemplary embodiments will be described in detail with reference to the accompanying drawings. However, the technical spirit of the embodiments is not limited to some embodiments to be described, but may be implemented in various different forms, and one or more of the constituent elements of the embodiments may be selectively combined or substituted within the technical spirit of the embodiments. All terms including technical or scientific terms have the same meanings as generally understood by a person having ordinary skill in the art to which the present invention pertains unless mentioned otherwise. Generally used terms, such as terms defined in a dictionary, should be interpreted to coincide with meanings of the related art from the context. Unless obviously defined in the present invention, such terms are not interpreted as ideal or excessively formal meanings. In addition, terms used in the embodiments are to illustrate the embodiments and are not intended to limit the embodiments. In the present specification, the singular form may include the plural form unless specifically stated in the phrase, and "at least one (or more than one) of A, B and C" may include one or more of all combinations of A, B, and C. In describing the constituent elements of the embodiments, terms such as first, second, A, B (a) and (b) may be used. These terms are only use to distinguish constituent elements from other constituent elements, and the natures, order or sequence of the constituent elements are not limited by the terms. It will be understood that when one element is referred to as "being connected to", "being coupled to", or "accessing" another element, one element may "be connected to", "be coupled to", or "access" another element via a further element although one element may be directly connected to or may directly access another element. In addition, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

Figure 1:
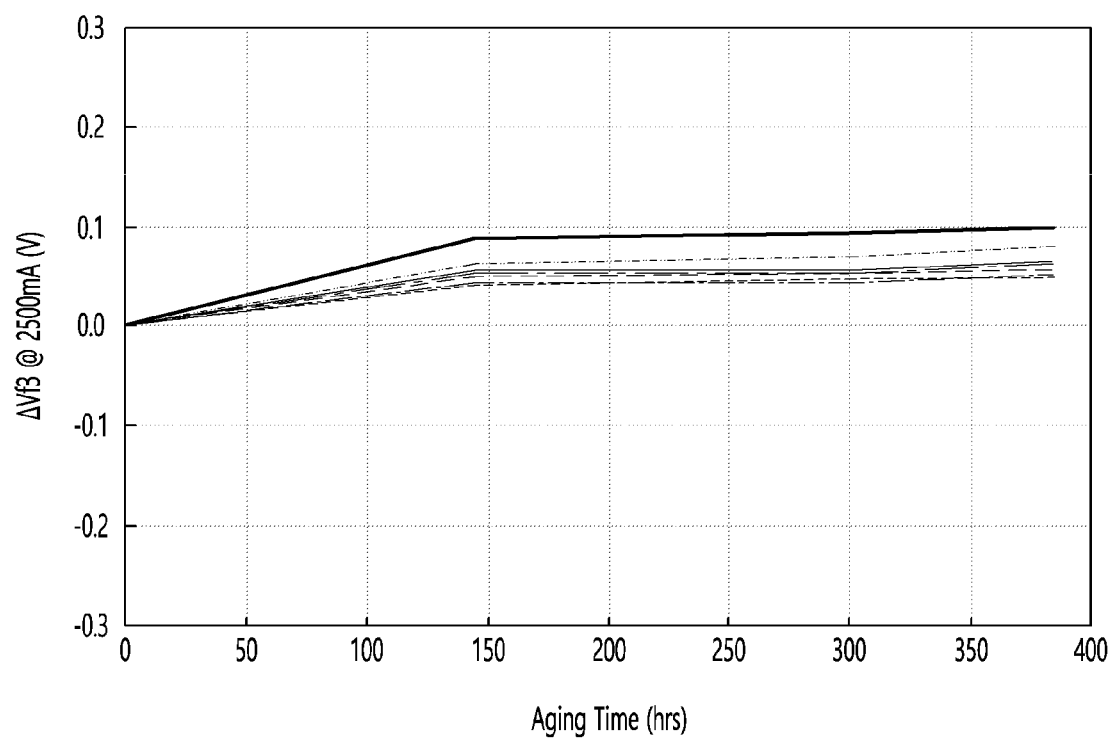
FIG. 1 is a view showing threshold voltage Vf3 change data in the related art.
Figure 2:
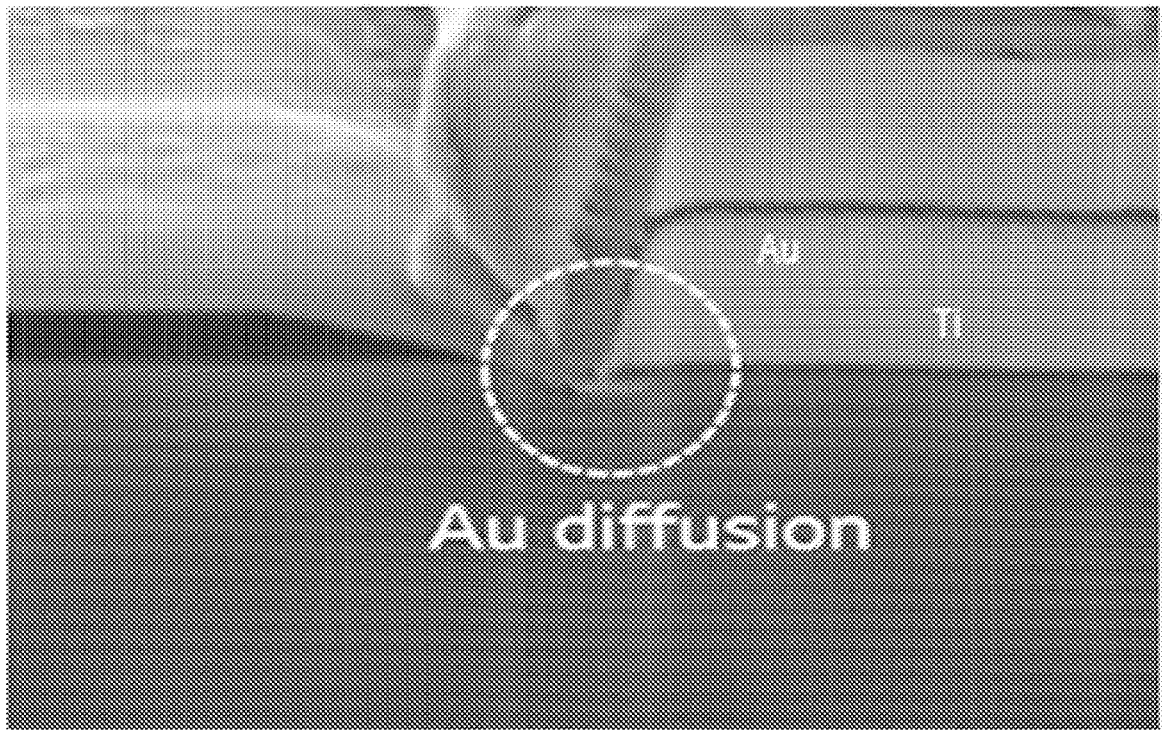
FIG. 2 is a photograph of Au diffusion in the related art.

FIG. 1 is a view showing threshold voltage Vf3 change data in the related art. FIG. 2 is a photograph of Au diffusion in the related art.

Unlike an LED, a VCSEL has very high current density and thus needs to be designed to have a robust pad from the viewpoint of high reliability. For example, the current density is about 7 to 50 A/cm$^2$ in the LED, but is about 7000 A/cm$^2$ in the VCSEL.

As shown in FIG. 2, in the related art, due to a heating phenomenon caused by high current density of a pad region, there is a high possibility of diffusion in the pad structure, which causes an increase in threshold voltage Vf3.

Figure 3:
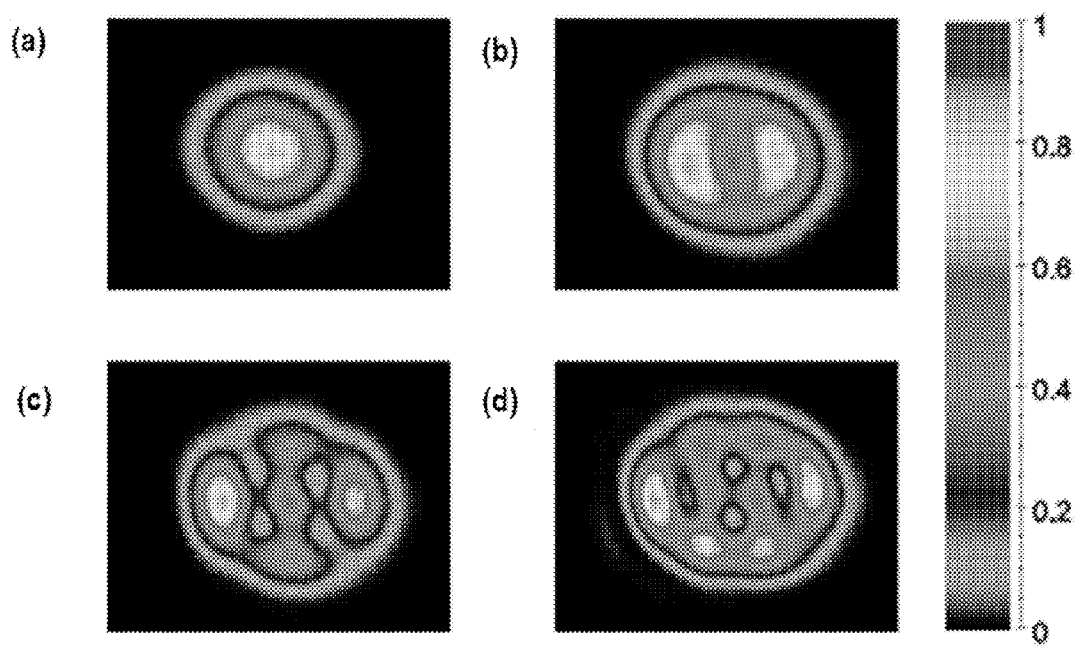
FIG. 3 is a view showing higher mode shift data according to increase in applied current in an aperture of a conventional VCSEL.

Next, in FIG. 3, a higher mode shift phenomenon wherein an oscillation mode changes from (a) to (d) according to increase in applied current in an aperture of a conventional VCSEL is generated and thus the beam pattern of an emitted beam is divided.

For example, according to the related art, as high current is applied, current crowding occurs in an aperture edge. At this time, as diffusion occurs in the pad structure or the aperture which is a laser emitting region is damaged, a dominant mode oscillates at low current and, as high current is applied, higher mode oscillation occurs, thereby causing optical problems such as division of the beam pattern of the emitted beams or increase in divergence angle of emitted beams.

First Embodiment

Figure 4:
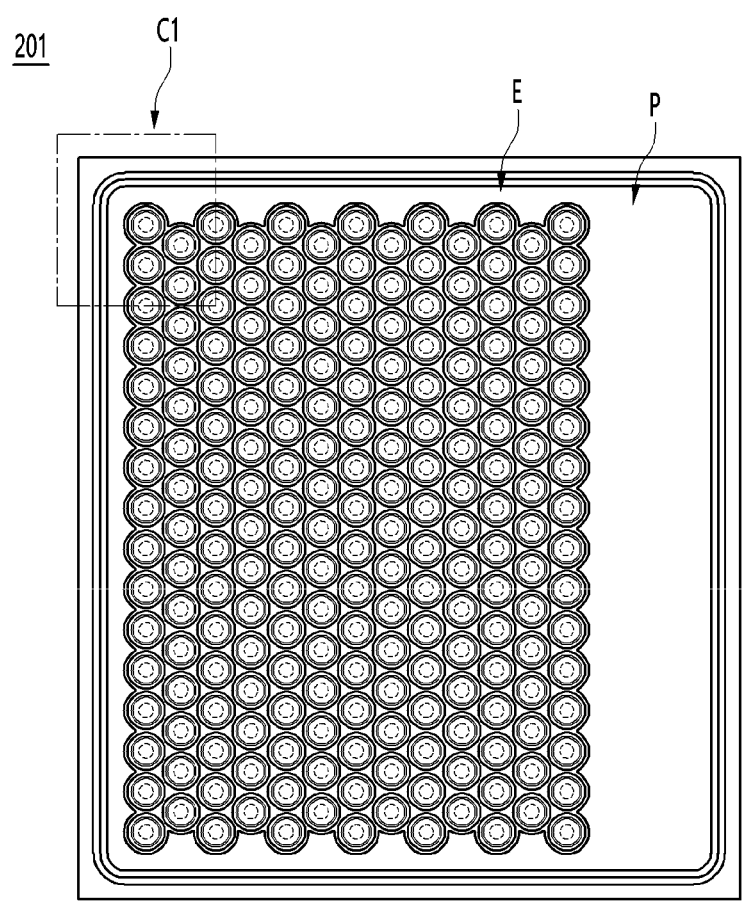
FIG. 4 is a plan view of a surface-emitting laser device according to a first embodiment.
Figure 5:
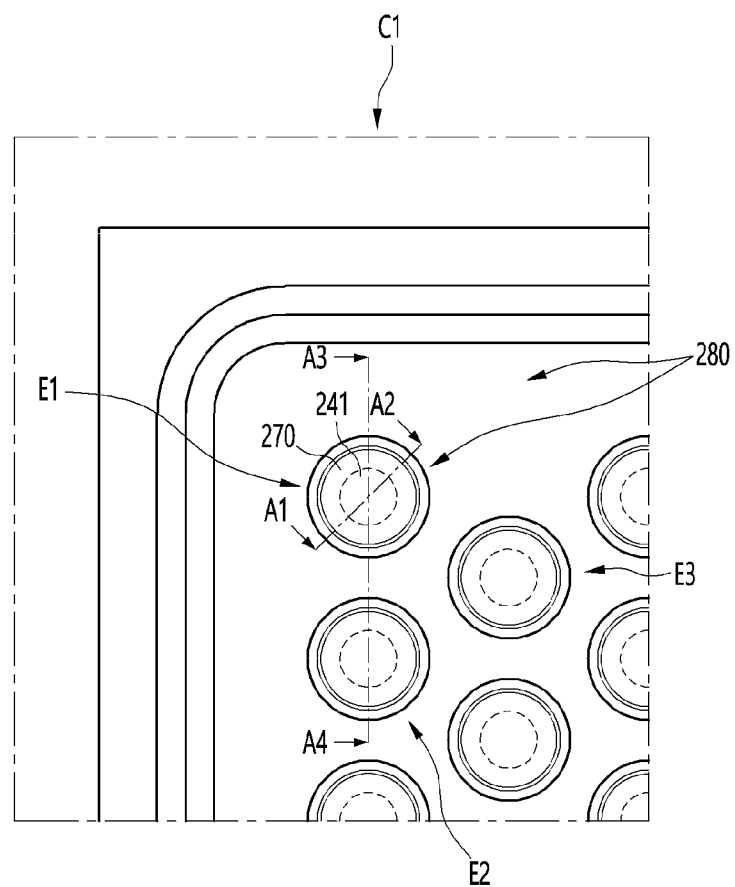
FIG. 5 is an enlarged view of a first region C1 of a surface-emitting laser device according to the first embodiment shown in FIG. 4.

FIG. 4 is a plan view of a surface-emitting laser device 201 according to a first embodiment. FIG. 5 is an enlarged view of a first region C1 of a surface-emitting laser device according to the first embodiment shown in FIG. 4.

Referring to FIG. 4, the surface-emitting laser device 201 according to the first embodiment may include a light emitting portion E and a pad potion P. The light emitting portion E may include a plurality of light emitters E1, E2 and E3 as shown in FIG. 5 and may include several tens to several hundreds of light emitters.

Referring to FIG. 5, in the surface-emitting laser device 201 of the first embodiment, a second electrode 280 may be disposed in a region other than an aperture 241 which is an opening, and a passivation layer 270 may be disposed on a surface corresponding to the aperture 241.

Figure 6A:
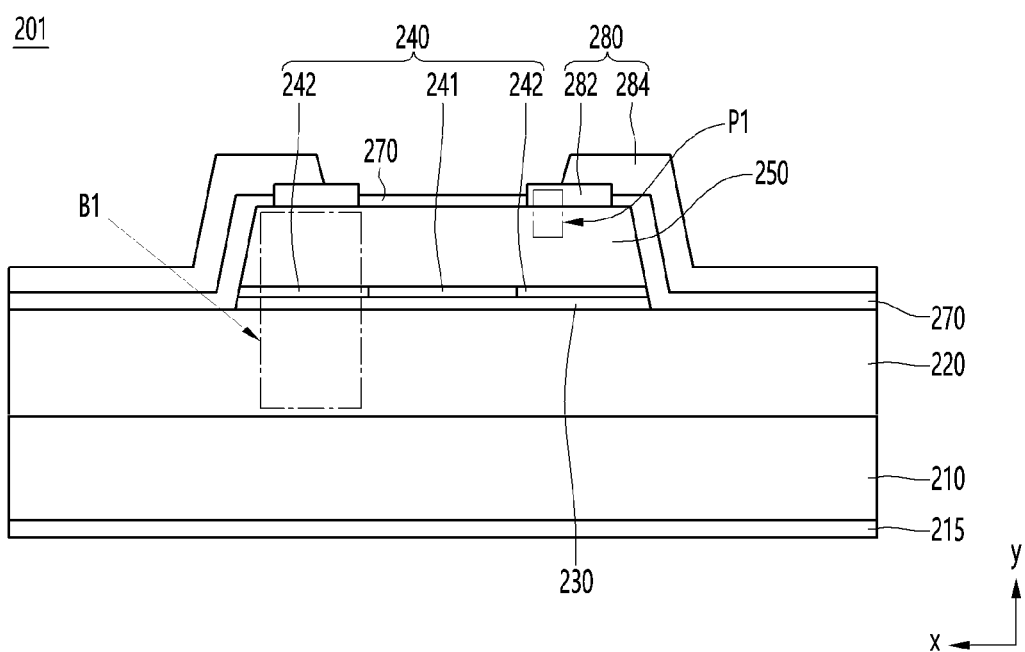
FIG. 6a is a first cross-sectional view of the surface-light laser device according to the first embodiment shown in FIG. 5, taken along line A1-A2.

Next, FIG. 6a is a first cross-sectional view of the surface-light laser device according to the first embodiment shown in FIG. 5, taken along line A1-A2. FIG. 6b is a second cross-sectional view of the surface-light laser device according to the first embodiment shown in FIG. 5, taken along line A3-A4.

Referring to FIGS. 6a and 6b, the surface-emitting laser device 201 of the first embodiment may include one or more of a first electrode 215, a substrate 210, a first reflective layer 220, an active region 230, an aperture region 240, a second reflective layer 250, a second electrode 280 and a passivation layer 270.

The aperture region 240 may include an aperture 241 which is an opening and an insulating region 242. The insulating region 242 may perform a current blocking function and may be referred to as an oxide layer, and the aperture region 240 may be referred to as an oxide region, but is not limited thereto.

A second electrode 280 may include a contact electrode 282 and a pad electrode 284.

Next, FIG. 7 is an enlarged cross-sectional view of a portion B1 of an epi region of the surface-light laser device according to the embodiment shown in FIG. 6a.

Hereinafter, the technical features of the surface-emitting laser device 201 according to the embodiment will be described with reference to FIGS. 6a and 7, and the technical effects thereof will be described with reference to FIGS. 8 to 19. In the drawings of the embodiment, an x-axis may be parallel to the longitudinal direction of the substrate 210 and a y-axis may be perpendicular to the x-axis.

<Substrate and First Electrode>

First, referring to FIG. 6a, in the embodiment, the substrate 210 may be a conductive substrate or a non-conductive substrate. When the conductive substrate is used, metal having excellent electrical conductivity may be used. In addition, since heat generated during operation of the surface-emitting laser device 201 needs to be sufficiently dissipated, a GaAs substrate having high thermal conductivity, a metal substrate or a silicon (Si) substrate may be used.

When the non-conductive substrate is used, an AlN substrate, a sapphire ($Al_2O_3$) substrate or a ceramic substrate may be used.

In the embodiment, the first electrode 215 may be disposed under the substrate 210, and the first electrode 215 may be formed of a single layer or multiple layers of conductive materials. For example, the first electrode 215 may be formed of metal, may include at least one of aluminum (Al), titanium (Ti), chromium (Cr), nickel (Ni), copper (Cu) or gold (Au), and may be formed in a single-layer or multi-layer structure, thereby improving electrical characteristics and increasing light output.

<First Reflective Layer and Second Reflective Layer>

Referring to FIG. 7, the first reflective layer 220 may be doped with a first conductive type dopant. For example, the first conductive dopant may include an n-type dopant such as Si, Ge, Sn, Se and Te.

In addition, the first reflective layer 220 may include a gallium based compound, such as AlGaAs, but is not limited thereto. The first reflective layer 220 may be a distributed bragg reflector (DBR). For example, the first reflective layer 220 may have a structure in which a first layer and a second layer made of materials having different refractive indices are alternately stacked at least once or more.

For example, as shown in FIG. 7, the first reflective layer 220 may include a first-group first reflective layer 221 disposed on the substrate 210 and a second-group first reflective layer 222 disposed on the first-group first reflective layer 221.

The first-group first reflective layer 221 and the second-group first reflective layer 222 may include a plurality of layers made of a semiconductor material having a formula of $Al_xGa_{(1-x)}As$ (0<x<1). When Al in each layer increases, the refractive index of each layer decreases and, when Ga increases, the refractive index of each layer may increase.

In addition, the thickness of each layer may be $\lambda/4n$. Here, $\lambda$ may be the wavelength of light generated in the active region 230 and n may be the refractive index of each layer for the light having the above-described wavelength. Here, $\lambda$ may be 650 to 980 nm, and n may be the refractive index of each layer. The first reflective layer 220 having such a structure may have reflectivity of 99.999% for light having a wavelength region of about 940 nm.

The thickness of the layer of the first reflective layer 220 may be determined according to the wavelength $\lambda$ of the light emitted from the active region 230 and the refractive index thereof.

In addition, as shown in FIG. 7, each of the first-group first reflective layer 221 and the second-group first reflective layer 222 may be formed of a single layer or a plurality of layers.

For example, the first-group first reflective layer 221 may include about 30 to 40 pairs of first-group (1-1)-th layers 221a and first-group (1-2)-th layers 221b. The first-group (1-1)-th layer 221a may be thicker than the first-group (1-2)-th layer 221b. For example, the first-group (1-1)-th layer 221a may have a thickness of about 40 to 60 nm, and the first-group (1-2)-th layer 221b may have a thickness of about 20 to 30 nm.

In addition, the second-group first reflective layer 222 may also include about 5 to 15 pairs of second-group (1-1)-th layers 222a and second-group (1-2)-th layers 222b. The second-group (1-1)-th layer 222a may be thicker than the second-group (1-2)-th layer 222b. For example, the second-group (1-1)-th layer 222a may have a thickness of about 40 to 60 nm, and the second-group (1-2)-th layer 222b may have a thickness of about 20 to 30 nm.

In addition, as shown in FIG. 7, the second reflective layer 250 may include a gallium based compound such as AlGaAs, and the second reflective layer 250 may be doped with a second conductive type dopant. The second conductive type dopant may be a p-type dopant such as Mg, Zn, Ca, Sr or Ba. Meanwhile, the first reflective layer 220 may be doped with the p-type dopant, and the second reflective layer 250 may be doped with the n-type dopant.

The second reflective layer 250 may also be a distributed bragg reflector (DBR). For example, the second reflective layer 250 may have a structure in which a first layer and a second layer made of materials having different refractive indices are alternately laminated at least once or more.

Each layer of the second reflective layer 250 may include AlGaAs, and, more specifically, include a semiconductor material having a formula of $Al_xGa_{(1-x)}As$ (0<x<1). Here, when Al increases, the refractive index of each layer decreases and, when Ga increases, the refractive index of each layer may increase. In addition, the thickness of each layer of the second reflective layer 250 may be $\lambda/4n$. Here, $\lambda$ may be the wavelength of light generated in the active region and n may be the refractive index of each layer for the light having the above-described wavelength.

The second reflective layer 250 having such a structure may have reflectivity of 99.999% for light having a wavelength region of about 940 nm.

The second reflective layer 250 may be formed by alternately stacking layers, the number of pairs of layers in the first reflective layer 220 may be greater than the number of pairs of layers in the second reflective layer 250. At this time, as described above, the reflectivity of the first reflective layer 220 is about 99.999%, which may be greater than 99.9% which is the reflectivity of the second reflective layer 250.

In the embodiment, the second reflective layer 250 may include a first-group second reflective layer 251 disposed adjacent to the active region 230 and a second-group second reflective layer 252 spaced apart from the active region 230 as compared to the first-group second reflective layer 251.

As shown in FIG. 7, each of the first-group second reflective layer 251 and the second-group second reflective layer 252 may be formed of a single layer or multiple layers.

For example, the first-group second reflective layer 251 may include about one to five pairs of first-group (2-1)-th layers 251a and first-group (2-2)-th layers 251b. The first-group (2-1)-th layer 251a may be thicker than the first-group (2-2)-th layer 251b. For example, the first-group (2-1)-th layer 251a may have a thickness of about 40 to 60 nm, and the first-group (2-2)-th layer 251b may have a thickness of about 20 to 30 nm.

In addition, the second-group second reflective layer 252 may also include about 5 to 15 pairs of second-group (2-1)-th layers 252a and second-group (2-2)-th layers 252b. The second-group (2-1)-th layer 252a may be thicker than the second-group (2-2)-th layer 252b. For example, the second-group (2-1)-th layer 252a may have a thickness of about 40 to 60 nm, and the second-group (2-2)-th layer 252*b* may have a thickness of about 20 to 30 nm.

<Active Region>

Referring to FIG. 7 continuously, the active region 230 may be disposed between the first reflective layer 220 and the second reflective layer 250.

The active region 230 may include an active layer 232 and one or more cavities 231 and 233. For example, the active region 230 may include the active layer 232, the first cavity 231 disposed under the active layer 232 and the second cavity 233 disposed on the active layer. The active region 230 of the embodiment may include one or both of the first cavity 231 and the second cavity 233.

The active layer 232 may include any one of a single well structure, a multi well structure, a single quantum well structure, a multi quantum well (MQW) structure, a quantum dot structure or a quantum line structure.

The active layer 232 may include a quantum well layer 232*a* and a quantum wall layer 232*b* using a compound semiconductor material of Group III-V elements. The quantum well layer 232*a* may be formed of a material having an energy band gap less than that of the quantization wall layer 232*b*. The active layer 232 may be formed in a structure of one to three pairs of InGaAs/AlxGaAs, AlGaInP/GaInP, AlGaAs/AlGaAs, AlGaAs/GaAs, or GaAs/InGaAs, but is not limited thereto. The active layer 232 may not be doped with a dopant.

Next, the first cavity 231 and the second cavity 233 may be formed of a material having $Al_yGa_{(1-y)}As$ (0<y<1) but is not limited thereto. For example, each of the first cavity 231 and the second cavity 233 may include a plurality of layers having $Al_yGa_{(1-y)}As$.

For example, the first cavity 231 may include a (1-1)-th cavity layer 231*a* and a (1-2)-th cavity layer 231*b*. The (1-1)-th cavity layer 231*a* may be more spaced apart from the active layer 232 than the (1-2)-th cavity layer 231*b*. The (1-1)-th cavity layer 231*a* may be thicker than the (1-2)-th cavity layer 231*b* but is not limited thereto.

For example, the (1-1)-th cavity layer 231*a* may have a thickness of about 60 to 70 nm and the (1-2)-th cavity layer 231*b* may have a thickness of 40 to 55 nm, but is not limited thereto.

In addition, the second cavity 233 may include a (2-1)-th cavity layer 233*a* and a (2-2)-th cavity layer 233*b*. The (2-2)-th cavity layer 233*b* may be more spaced apart from the active layer 232 than the (2-1)-th cavity layer 233*a*. The (2-2)-th cavity layer 233*b* may be thicker than the (2-1)-th cavity layer 233*a*, but is not limited thereto. For example, the (2-2)-th cavity layer 233*b* may have a thickness of about 60 to 70 nm and the (2-1)-th cavity layer 233*a* may have a thickness of about 40 to 55 nm, but is not limited thereto.

<Aperture Region>

Referring to FIG. 6*a* again, in the embodiment, the aperture region 240 may include an insulating region 242 and an aperture 241. the aperture 241 may be referred to as an opening and the aperture region 240 may be referred to as an opening region.

The insulating region 242 may function as an insulating layer, for example, a current blocking region made of aluminum oxide, and the aperture 241 which is a light emission region may be defined by the insulating region 242.

For example, when the aperture region 240 includes AlGaAs (aluminum gallium arsenide), AlGaAs of the aperture region 240 reacts with $H_2O$ such that an edge thereof turns into aluminum oxide ($Al_2O_3$). Therefore, the insulating region 242 may be formed, and a central region, in which reaction with $H_2O$ does not occur, may become the aperture 241 made of AlGaAs.

According to the embodiment, light emitted in the active region 230 through the aperture 241 may be emitted to an upper region, and light transmittance of the aperture 241 may be superior to that of the insulating region 242.

Referring to FIG. 7, the insulating region 242 may include a plurality of layers, and, for example, the insulating region 242 may include a first insulating layer 242*a* and a second insulating layer 242*b*. The thickness of the first insulating layer 242*a* may be equal to or different from that of the second insulating layer 242*b*.

<Second Electrode, Ohmic Contact Layer and Passivation Layer>

Referring to FIG. 6*a* again, in the surface-emitting laser device 201 according to the embodiment, an emitter may be defined by performing mesa etching from the second reflective layer 250 to the aperture region 240 and the active region 230. In addition, even a portion of the first reflective layer 220 may be mesa-etched.

The second electrode 280 may be disposed on the second reflective layer 250, and the second electrode 280 may include a contact electrode 282 and a pad electrode 284.

A passivation layer 270 may be disposed in a region in which the second reflective layer 250 is exposed inside the contact electrode 282, and may vertically correspond to the aperture 241. The contact electrode 282 may improve ohmic contact characteristics between the second reflective layer 250 and the pad electrode 284.

The second electrode 280 may be formed of a conductive material such as metal. For example, the second electrode 280 may include at least one of aluminum (Al), titanium (Ti), chromium (Cr), platinum (Pt), nickel (Ni), copper (Cu), and gold (Au), and may be formed in a single layer or multilayer structure.

In FIG. 6*a*, the passivation layer 270 may be disposed on the side and upper surfaces of the mesa-etched light emitting structure and the upper surface of the first reflective layer 220. The passivation layer 270 may be disposed on the side surface of the surface-emitting laser device 201 separated in device units, thereby protecting and insulating the surface-emitting laser device 201. The passivation layer 270 may be formed of an insulating material, such as nitride or oxide. For example, the passivation layer 270 may include at least one of polyimide, silica ($SiO_2$) or silicon nitride ($Si_3N_4$).

The thickness of the passivation layer 270 on the upper surface of the light emitting structure may be less than that of the contact electrode 282, thereby exposing the contact electrode 282 over the passivation layer 270. The pad electrode 284 may be disposed to be electrically connected to the exposed contact electrode 282, and the pad electrode 284 may extend to the upper portion of the passivation layer 270 to receive current from the outside.

One of the objects of the embodiments is to provide a surface-emitting laser diode including an electrode structure having high reliability.

One of the objects of the embodiments is to provide a surface-emitting laser diode capable of solving optical problems such as pattern division of emitted beams or increase in divergence angle of emitted beams.

Figure 8:
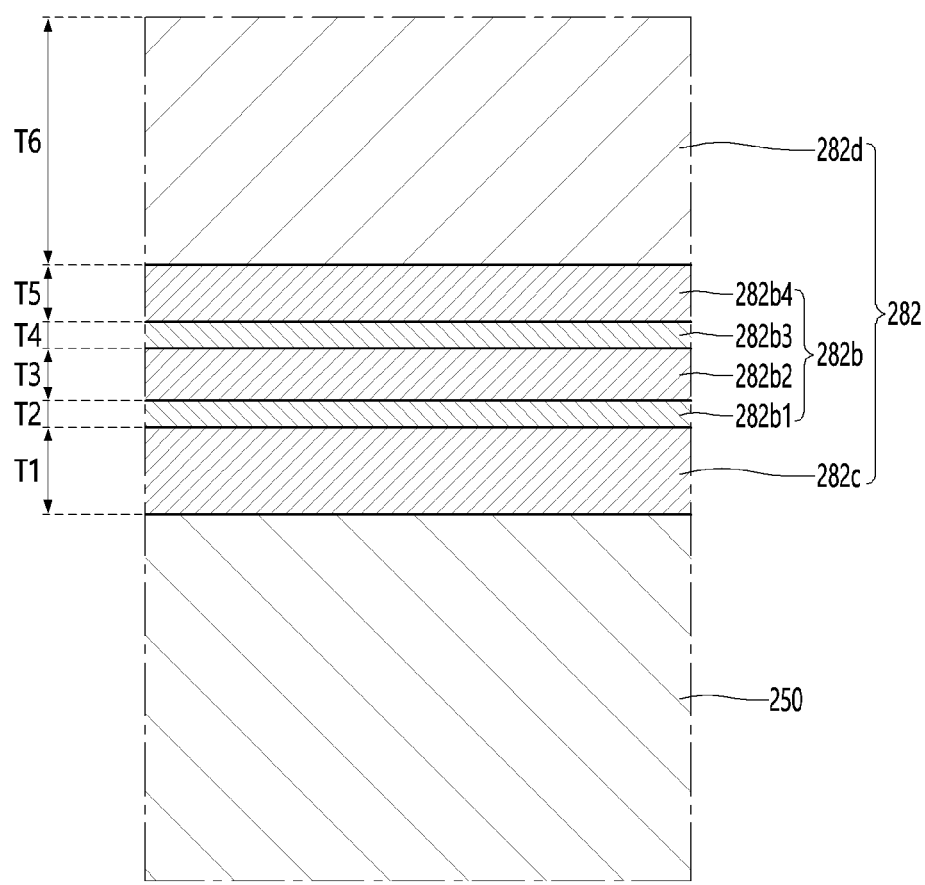
Figure 9A:
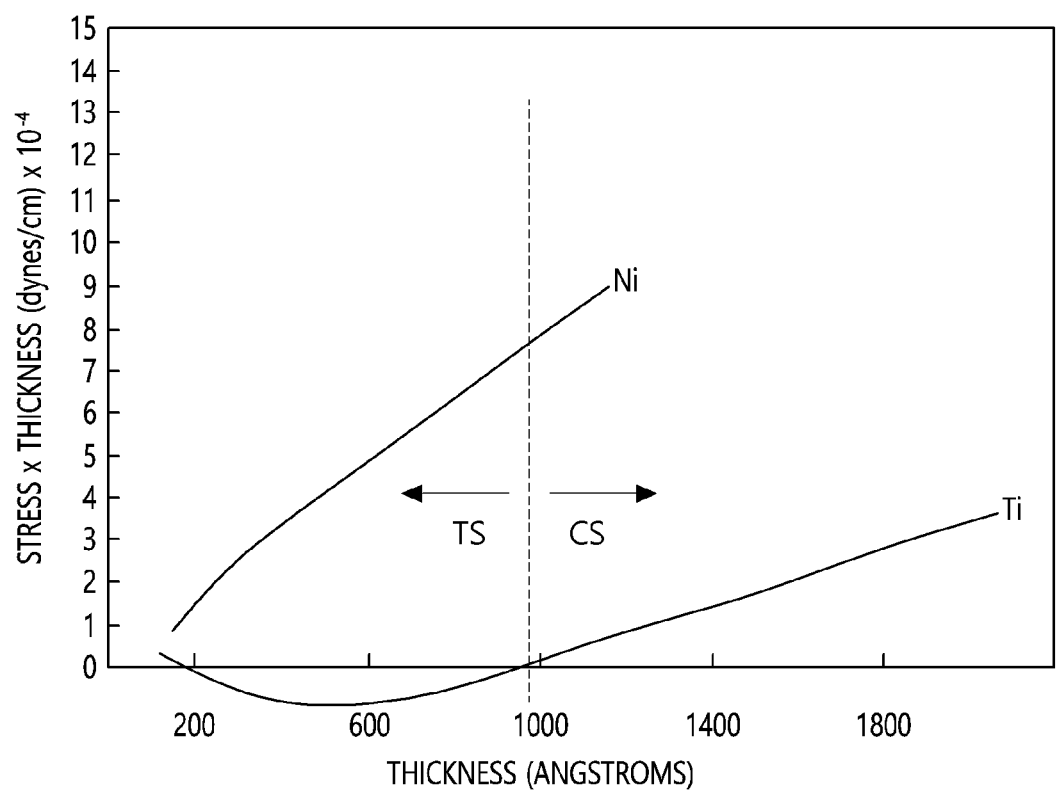
FIG. 9a is a view showing stress according to thickness in the surface-emitting laser device according to the first embodiment.
Figure 9B:
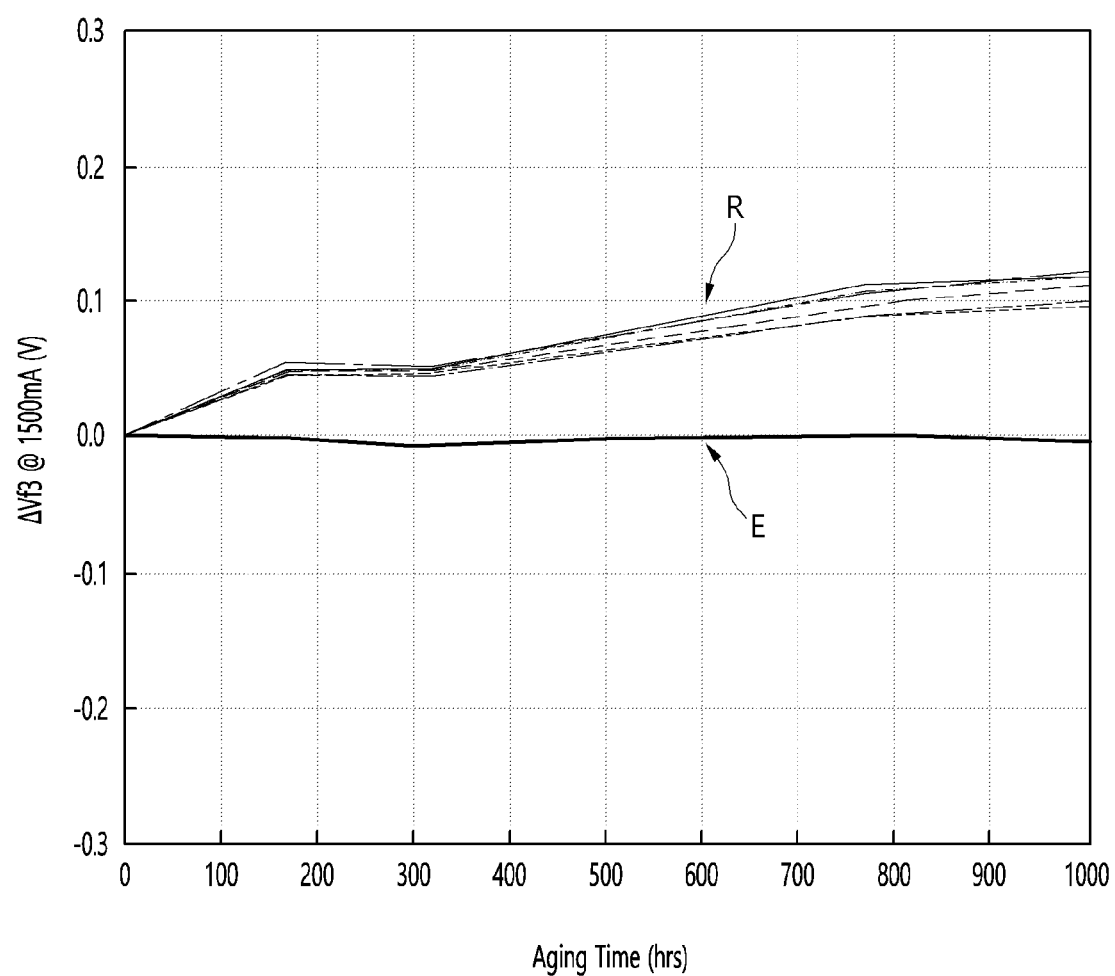
FIG. 9b is a view showing operating voltages of the surface-emitting laser device according to the first embodiment and a comparative example.

FIG. 8 is a cross-sectional view showing a first example of a first region P1 of the surface-light laser device according to the first embodiment shown in FIG. 6*a*. FIG. 9*a* is a view showing stress according to thickness in the surface-emitting laser device according to the first embodiment. FIG. 9*b* is a view showing operating voltages of the surface-emitting laser device according to the first embodiment and a comparative example. FIG. 10 is a cross-sectional view showing a second example of the first region P1 of the surface-light laser device according to the first embodiment shown in FIG. 6a.

In the embodiment, the second electrode 280 may include a first conductive layer 282c disposed on the second reflective layer 250, a second conductive layer 282b1, a third conductive layer 282b2, a fourth conductive layer 282b3, a fifth conductive layer 282b4 and a sixth conductive layer 282d. The first conductive layer 282c, the second conductive layer 282b1, the third conductive layer 282b2, the fourth conductive layer 282b3, the fifth conductive layer 282b4 and the sixth conductive layer 282d may include a metal material but is not limited thereto. These layers may include at least one of aluminum (Al), titanium (Ti), chromium (Cr), nickel (Ni), copper (Cu) or gold (Au), and may be formed in a single-layer or multi-layer structure.

The first conductive layer 282c may be referred to as a bonding layer, but is not limited thereto. The second conductive layer 282b1, the third conductive layer 282b2, the fourth conductive layer 282b3 and the fifth conductive layer 282b4 may be referred to as a barrier layer 282b, but is not limited thereto. The sixth conductive layer 282d may be referred to as a current spreading layer or a bonding layer, but is not limited thereto.

As a first example, the first conductive layer 282c may include Ti, the second conductive layer 282b1 and the fourth conductive layer 282b3 may include Ni, the third conductive layer 282b2 and the fifth conductive layer 282b4 may include Ti, and the sixth conductive layer 282d may include Au. The first conductive layer 282c may employ a metal material having excellent ohmic characteristics and bonding characteristics, that is, Ti. A plurality of pairs of second conductive layer 282b1 and third conductive layers 282b2 and a plurality of pairs of fourth conductive layer 282b3 and fifth conductive layer 282b4 may be alternatively stacked.

As a second example, the first conductive layer 282c may include Ti, the second conductive layer 282b1 may include Au, the third conductive layer 282b2 may include Ti, the fourth conductive layer 282b3 may include Au, the fifth conductive layer 282b4 may include Ti, and the sixth conductive layer 282d may include Au. A plurality of pairs of first conductive layer 282c and second conductive layer 282b1, a plurality of pairs of third conductive layer 282b2 and fourth conductive layer 282b3 and a plurality of pairs of fifth conductive layer 282b4 and sixth conductive layer 282d may be alternately stacked. The thickness T1 of the first conductive layer 282c may be about 20 nm to 150 nm, the thickness T2 of the second conductive layer 282b1 may be about 30 nm to 2000 nm, the thickness T3 of the third conductive layer 282b2 may be about 50 nm to 1500 nm, the thickness T4 of the fourth conductive layer 282b3 may be about 30 nm to 1200 nm, the thickness T5 of the fifth conductive layer 282b4 may be about 30 nm to 150 nm, and the thickness T6 of the sixth conductive layer 282d may be about 800 nm to 4000 nm.

As a third example, the first conductive layer 282c may include Ti, the second conductive layer 282b1 may include Pt, the third conductive layer 282b2 may include Au, the fourth conductive layer 282b3 may include Ti, the fifth conductive layer 282b4 may include Pt, and the sixth conductive layer 282d may include Au. A plurality of sets of first conductive layers 282c, second conductive layers 282b1 and third conductive layers 282b2 and a plurality of sets of fourth conductive layers 282b3, fifth conductive layers 282b4 and sixth conductive layers 282d may be alternately stacked. The thickness T1 of the first conductive layer 282c may be about 20 nm to 150 nm, the thickness T2 of the second conductive layer 282b1 may be about 30 nm to 1200 nm, the thickness T3 of the third conductive layer 282b2 may be about 80 nm to 1500 nm, the thickness T5 of the fourth conductive layer 282b3 may be about 30 nm to 1200 nm, the thickness T5 of the fifth conductive layer 282b4 may be about 30 nm to 150 nm, and the thickness T6 of the sixth conductive layer 282d may be about 800 nm to 2000 nm.

As a fourth example, although not shown, a seventh conductive layer may be disposed between the third conductive layer 282b2 and the fourth conductive layer 282b3. In this case, the first conductive layer 282c may include Ti, the second conductive layer 282b1 may include Pt, the third conductive layer 282b2 may include Au, the seventh conductive layer may include W, the fourth conductive layer 282b3 may include Ti, the fifth conductive layer 282b4 may include Pt, and the sixth conductive layer 282d may include Au. A set of first conductive layer 282c, second conductive layer 282b1 and the third conductive layer 282b2 and a set of fourth conductive layer 282b3, fifth conductive layer 282b4 and the sixth conductive layer 282d may be disposed at both sides of the seventh conductive layer. The thickness T1 of the first conductive layer 282c may be about 20 nm to 150 nm, the thickness T2 of the second conductive layer 282b1 may be about 30 nm to 1200 nm, the thickness T3 of the third conductive layer 282b2 may be about 80 nm to 200 nm, the thickness of the seventh conductive layer may be about 70 nm to 200 nm, the thickness T5 of the fourth conductive layer 282b3 may be about 30 nm to 1200 nm, the thickness T5 of the fifth conductive layer 282b4 may be about 30 nm to 150 nm, and the thickness T6 of the sixth conductive layer 282d may be about 800 nm to 4000 nm.

FIG. 9a is a view showing stress according to thickness in the surface-emitting laser device according to the first embodiment.

In the embodiment, the thickness T2 of the first barrier layer 282b1 including an Ni layer may be in a range from ⅑ to ⅓ of the thickness T3 of the second barrier layer 282b2 including a Ti layer.

For example, the thickness of the first barrier layer 282b1 including the Ni layer may be about 10 nm to 50 nm, and the thickness of the second barrier layer 282b2 including the Ti layer may be in a range from about 30 nm to 90 nm.

Referring to FIG. 9a, in the embodiment, when the thickness of the second barrier layer 282b2 including the Ti layer is in a range about 30 nm to 90 nm (900 Å), it is in a tensile stress (TS) state and, when the thickness of the second barrier layer 282b2 including the Ti layer exceeds about 90 nm (900 Å), it is in a compressive stress (CS) state.

In contrast, when the thickness of the second barrier layer 282b2 including the Ti layer is in a range about 10 nm to 50 nm, it is in the CS state.

Accordingly, by controlling the second barrier layer 282b2 including the Ti layer to be in the TS state and the first barrier layer 282b1 including the Ni layer to be in the CS state, it is possible to prevent of internal stress from occurring in the barrier layer 292b including the first barrier layer 282b1 and the second barrier layer 282b2. Therefore, it is possible to provide a surface-emitting laser device including an electrode structure having high reliability even in a state in which current density is high.

For example, FIG. 9b shows operating voltage data of a surface-emitting laser device according to a first embodiment and a comparative example and shows a result of experimenting the operating voltage through ten samples in the comparative example and the first embodiment.

The operating voltage data R of the comparative example increases by about 0.1 V or more with the passage of an aging time. However, the operating voltage data E of the surface-emitting laser device according to the first embodiment hardly increases or changes, thereby providing high reliability.

In addition, in the embodiment, as two to 25 pairs of first barrier layers 282b1 and second barrier layers 282b2 are alternately stacked, it is possible to prevent internal stress in the barrier layer 282b and to prevent diffusion of the current spreading layer 282d by separation between the bonding layer and the current spreading layer 282d.

In addition, according to the embodiment, by preventing current crowding in the second electrode 280 or preventing diffusion of an electrode material, it is possible to improve reliability of the electrode region, to prevent division of a beam pattern due to current diffusion, and to prevent the divergence angle of emitted beams from increasing.

Next, FIG. 10 is a cross-sectional view showing a second example of the first region P1 of the surface-light laser device according to the first embodiment shown in FIG. 6a.

Referring to FIG. 10, the first conductive layer 282c disposed on the second reflective layer 250, the second conductive layer 282b1, the third conductive layer 282b2, the fourth conductive layer 282b3, the fifth conductive layer 282b4, the sixth conductive layer 282b5, the seventh conductive layer 282b6 and an eighth conductive layer 282d may be included. The first conductive layer 282c, the second conductive layer 282b1, the third conductive layer 282b2, the fourth conductive layer 282b3, the fifth conductive layer 282b4, the sixth conductive layer 282b5, the seventh conductive layer 282b6 and the eighth conductive layer 282d may include a metal material, but is not limited thereto. These layers may include at least one of aluminum (Al), titanium (Ti), chromium (Cr), nickel (Ni), copper (Cu) or gold (Au), and may be formed in a single-layer or multi-layer structure.

The first conductive layer 282c may be referred to as a bonding layer but is not limited thereto. The second conductive layer 282b1, the third conductive layer 282b2, the fourth conductive layer 282b3, the fifth conductive layer 282b4, the sixth conductive layer 282b5 and the seventh conductive layer 282b6 may be referred to as a barrier layer 282b but is not limited thereto. The eighth conductive layer 282d may be referred to as a current spreading layer but is not limited thereto.

As a first example, the first conductive layer 282c may include Ti, the second conductive layer 282b1 may include Au, the third conductive layer 282b2 may include Ti, the fourth conductive layer 282b3 may include Au. In addition, the fifth conductive layer 282b4 may include Ti, the sixth conductive layer 282b5 may include Au, the seventh conductive layer 282b6 may include Ti, the eighth conductive layer 282d may include Au. A plurality of pairs of first conductive layers 282c and second conductive layers 282b1, a plurality of pairs of third conductive layers 282b2 and fourth conductive layers 282b3, a plurality of pairs of fifth conductive layers 282b4 and sixth conductive layers 282b5, and a plurality of pairs of seventh conductive layer 282b6 and eighth conductive layers 282d may be alternately stacked. The thickness T1 of the first conductive layer 282c may be about 20 nm to 150 nm, the thickness T2 of the second conductive layer 282b1 may be about 300 nm to 1200 nm, the thickness T3 of the third conductive layer 282b2 may be about 80 nm to 150 nm, the thickness T4 of the fourth conductive layer 282b3 may be about 100 nm to 1200 nm, the thickness T5 of the fifth conductive layer 282b4 may be about 80 nm to 400 nm, the thickness T6 of the sixth conductive layer 282b5 may be about 100 nm to 1500 nm, the thickness T7 of the seventh conductive layer 282b6 may be about 200 nm to 600 nm, and the thickness T8 of the eighth conductive layer 282d may be about 300 nm to 600 nm.

As a second example, although not shown, the fourth conductive layer 282b3 may be omitted. In this case, the fifth conductive layer 282b4 may be in contact with the third conductive layer 282b2. The first conductive layer 282c may include Ti, the second conductive layer 282b1 may include Pt, and the third conductive layer 282b2 may include Au. In addition, the fifth conductive layer 282b4 may include Ti, the sixth conductive layer 282b5 may include Au, the seventh conductive layer 282b6 may include Ti, and the eighth conductive layer 282d may include Au. A plurality of pairs of fifth conductive layer 282b4 and sixth conductive layers 282b5 and a plurality of pairs of seventh conductive layer 282b6 and eighth conductive layers 282d may be alternately stacked. The thickness T1 of the first conductive layer 282c may be 20 nm to 150 nm, the thickness T2 of the second conductive layer 282b1 may be about 20 nm to 200 nm, the thickness T3 of the third conductive layer 282b2 may be about 100 nm to 300 nm, the thickness T5 of the fifth conductive layer 282b4 may be about 30 nm to 300 nm, the thickness T6 of the sixth conductive layer 282b5 may be about 50 nm to 200 nm, the thickness T7 of the seventh conductive layer 282b6 may be about 100 nm to 200 nm, and the thickness T8 of the eighth conductive layer 282d may be about 800 nm to 5000 nm.

As a third example, although not shown, the second conductive layer 282b1, the third conductive layer 282b2, and the fifth to seventh conductive layers 282b4 to 282b6 may be omitted. In this case, the lower surface of the fourth conductive layer 282b3 may be in contact with the first conductive layer 282c, and the upper surface of the fourth conductive layer 282b3 may be in contact with the eighth conductive layer 282d. The first conductive layer 282c may include Ti, the fourth conductive layer 282b3 may include Pt, and the eighth conductive layer 282d may include Au. The thickness T1 of the first conductive layer 282c may be about 20 nm to 150 nm, the thickness T4 of the fourth conductive layer 282b3 may be 20 nm to 150 nm, and the thickness T8 of the eighth conductive layer 282d may be about 800 nm to 3000 nm.

Second Embodiment

Figure 11:
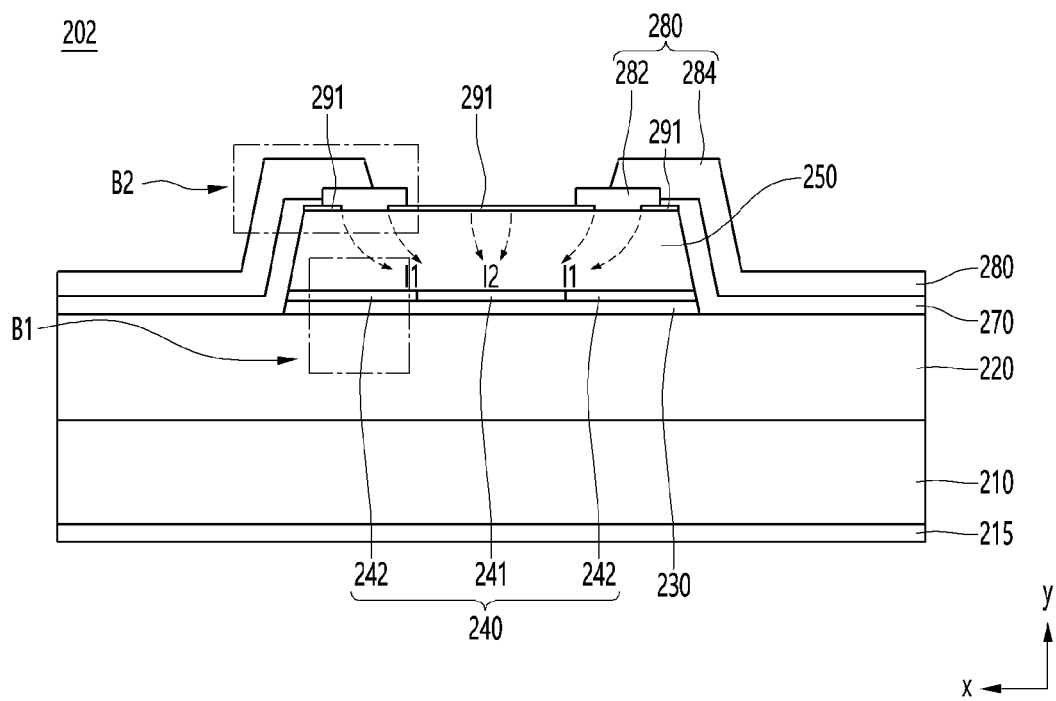
FIG. 11 is a cross-sectional view of a surface-emitting laser device according to a second embodiment.

FIG. 11 is a cross-sectional view of a surface-emitting laser device 201 according to a second embodiment. Referring to FIG. 11, the surface-emitting laser device 201 according to the second embodiment may include one or more of a first electrode 215, a substrate 210, a first reflective layer 220, an active region 230, an aperture region 240, a second reflective layer 250, an ohmic contact layer 291, a second electrode 280 and a passivation layer 270. The aperture region 240 may include an aperture 241 and an insulating region 242. The insulating region 242 may be referred to as an oxide layer, and the aperture region 240 may be referred to as an oxide region, but is not limited thereto. The second electrode 280 may include a contact electrode 282 and a pad electrode 284. In addition, the second electrode 280 may include the ohmic contact layer 291.

For example, the surface-emitting laser device 201 according to the embodiment may include the first electrode 215, the first reflective layer 220 on the first electrode 215, the active region 230 on the first reflective layer 220, the second reflective layer 250 on the active region 230, and the second electrode 280 on the second reflective layer 250.

In addition, the embodiment may include the ohmic contact layer 291 disposed between the second reflective layer 250 and the second electrode 280, and the ohmic contact layer 291 may be directly in contact with the second reflective layer 250.

The embodiment provide a surface-emitting laser device capable of improving ohmic characteristics.

In addition, the embodiment provides a surface-emitting laser device capable of preventing the aperture from being damaged or preventing the divergence angle of the mitted beams from increasing.

Hereinafter, the technical features of the surface-emitting laser device 201 according to the embodiment will be described with reference to FIG. 11 and technical effects will also be described with reference to FIGS. 12 to 15c. In the drawings of the embodiment, an x-axis direction may be parallel to the longitudinal direction of the substrate 210 and a y-axis direction may be perpendicular to the x-axis.

Figure 12:
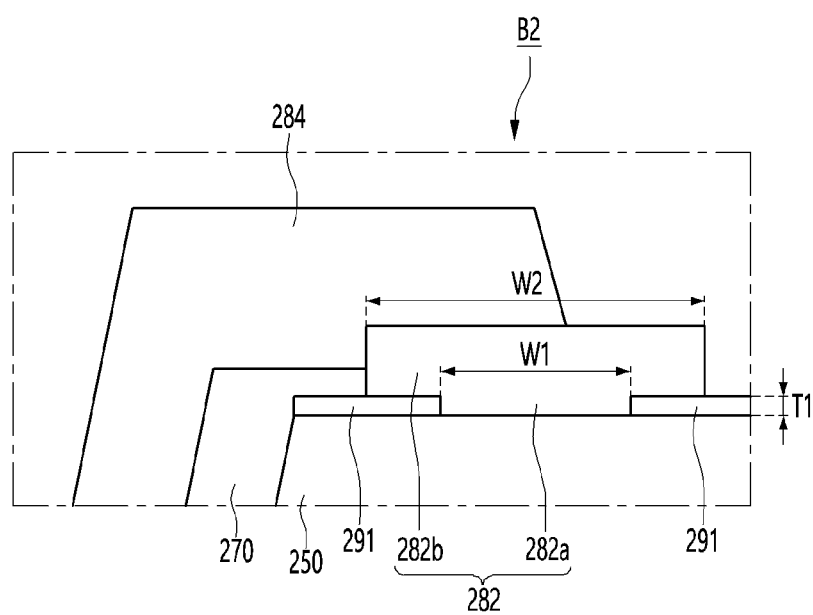
FIG. 12 is an enlarged view of a second region B2 of the surface-emitting laser device according to the second embodiment.

FIG. 12 is an enlarged view of a second region B2 of the surface-emitting laser device according to the second embodiment.

Referring to FIG. 12, in the embodiment, in order to solve the technical problems, the ohmic contact layer 291 disposed between the second reflective layer 250 and the second electrode 280 may be included, the ohmic contact layer 291 may be directly in contact with the second reflective layer 250 to form ohmic contact between the second reflective layer 250 and the ohmic contact layer 291, thereby improving electrical characteristics.

For example, the second electrode 280 may include the contact electrode 282 and the pad electrode 284, and the contact electrode 282 may be electrically connected to the second reflective layer 250 through the ohmic contact layer 291.

The ohmic contact layer 291 may include one or more of ITO, AZO, GZO, ZnO, $Y_2O_3$ and $ZrO_2$.

In addition, a portion of the second electrode 280 may be directly in contact with the second reflective layer 250 by penetrating the ohmic contact layer 291.

For example, the second electrode 280 may include the contact electrode 282 and the pad electrode 284, and the contact electrode 282 may include a lower contact electrode portion 282a and an upper contact electrode portion 282b, the lower contact electrode portion 282a may be directly in contact with the second reflective layer 250, and the upper contact electrode portion 282b may be directly in contact with the ohmic contact layer 291.

For example, the contact electrode 282 of the second electrode 280 may include the lower contact electrode portion 282a having a first width W1 and the upper contact electrode portion 282b having a second width W2 greater than the first width W1.

The lower contact electrode portion 282a of the contact electrode 282 may be directly in contact with the second reflective layer 250, and the upper contact electrode portion 282b of the contact electrode 282 may be disposed on the ohmic contact layer 291 such that the ohmic contact layer 291 is directly in contact with the second reflective layer 250, thereby being electrically connected with the second reflective layer 250 through the ohmic contact layer 291.

Referring to FIG. 1, according to the embodiment, in the second electrode 280, the lower contact electrode portion 282a of the contact electrode 282 may be in contact with the second reflective layer 250, such that first current I1 is injected into the aperture 241, and the upper contact electrode portion 282b of the contact electrode 282 may be electrically connected with the second reflective layer 250 through the ohmic contact layer 291, such that second current I2 may be efficiently injected into the aperture 241.

Figure 13:
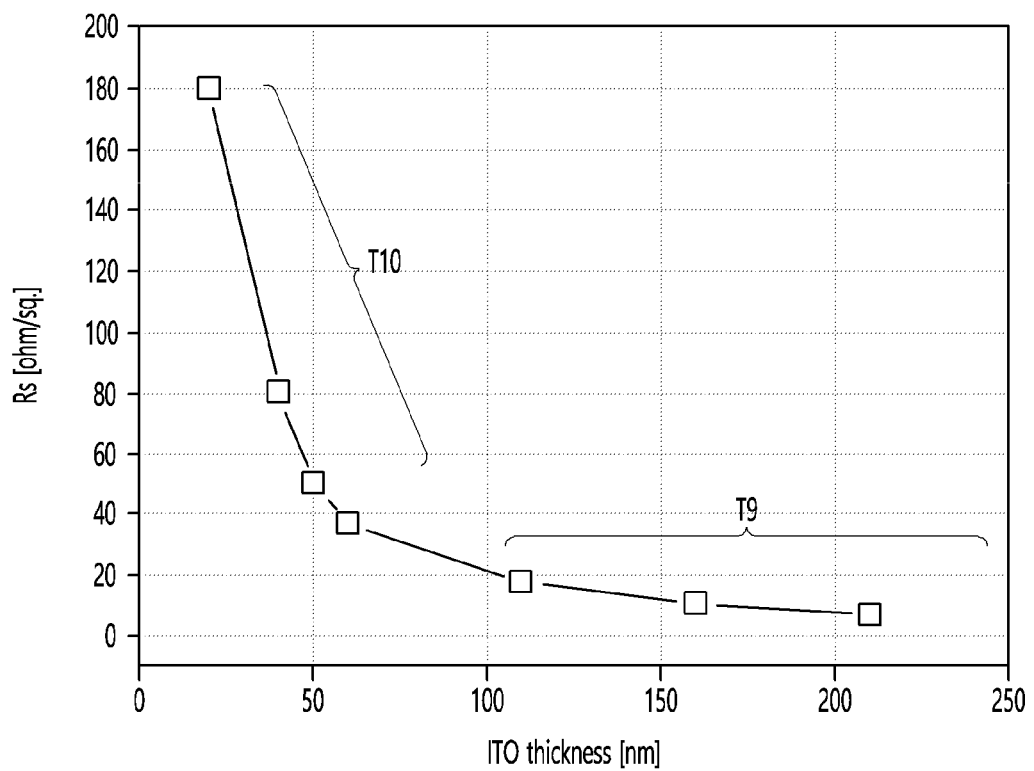
FIG. 13 is a view showing resistance according to the thickness of an ohmic contact layer in a surface-emitting laser device according to an embodiment.

FIG. 13 is a view showing resistance according to the thickness of an ohmic contact layer in a surface-emitting laser device according to an embodiment.

According to the embodiment, by controlling a first thickness of the ohmic contact layer 291 to the first thickness T9 which is about 100 nm to about 250 nm, it is possible to obtain high ohmic characteristics between the ohmic contact layer 291 and the second reflective layer 250 and to significantly lowering sheet resistance Rs.

Meanwhile, in the comparative example, when the thickness of the ohmic contact layer 291 is a second thickness T10, the ohmic characteristics may not be implemented and sheet resistance may be high.

For example, as shown in Table 1 below and FIG. 13, in the comparative example, when the thickness of the ohmic contact layer is 20 nm to 60 m, sheet resistance is as high as 180 to 37 ohm/sq.

However, as in the embodiment, when the thickness of the ohmic contact layer 291 is controlled to 100 nm to 250 nm, it is possible to control sheet resistance to be remarkably low. For example, when the thickness of the ohmic contact layer 291 is controlled to 110 nm to 210 nm, it is possible to control sheet resistance to be remarkably as low as 18 to 7 ohm/sq.

TABLE 1

| ITO thickness (nm) | 20 | 40 | 50 | 60 | 110 | 160 | 210 |
|---|---|---|---|---|---|---|---|
| Sheet resistance (ohm/sq) | 180 | 80 | 50 | 37 | 18 | 11 | 7 |

Next, FIG. 14 and Table 2 below show the ohmic characteristic data of the surface-emitting laser device according to the embodiment. In Table 2, E-04 may mean $10^{-4}$.

TABLE 2

| | p-GaAs/ITO | | | |
|---|---|---|---|---|
| Heat treatment | As-dep (comparative example) | 250° C. | 350° C. | 450° C. |
| Contact resistance (ohm*cm²) | Non-Ohmic | 2.7E−04 | 1.0E−04 | 1.0E−04 |

First, in the embodiment, the second reflective layer 250 may be a p-type reflective layer, and the ohmic contact layer 291 may have n-type conductivity. Therefore, in the related art, there is a technical limitation in that n-type conductive IOT cannot be employed on a p-type reflective layer as an ohmic contact layer.

Figure 14:
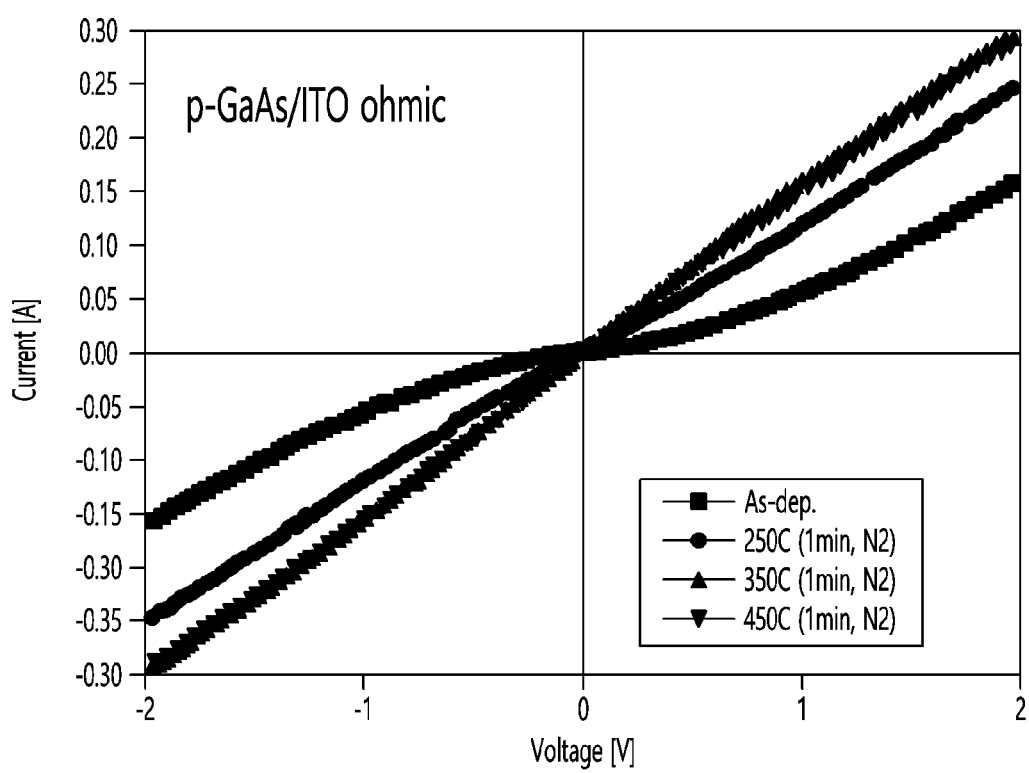
FIG. 14 is a view showing the ohmic characteristics of a surface-emitting laser device according to an embodiment.

For example, as shown in Table 2 and FIG. 14, in the case of the comparative example (As-dep) in which no other measures are taken after ITO is formed on a p-type reflective layer, for example p-GaAS, a non-ohmic result is obtained.

In contrast, as in the embodiment, when predetermined annealing is performed after ITO is formed on a p-type reflective layer, for example, p-GaAs, it is possible to implement high ohmic characteristics at a thickness of 100 nm to 250 nm.

For example, when predetermined annealing is performed at 200° C. to 500° C. after ITO is formed on p-GaAs, which is the second reflective layer 250, as the ohmic contact layer 291, it is possible to implement high ohmic characteristics.

For example, when predetermined annealing is performed at 250° C. to 450° C. after ITO is formed on p-GaAs, which is the second reflective layer 250, as the ohmic contact layer 291, it is possible to implement higher ohmic characteristics.

More specifically, the work function Φ of each material needs to be considered as the physical condition of the ohmic characteristics. In order to achieve the ohmic characteristics, the work function of the ohmic layer needs to be greater than that of the p-type reflective layer.

However, generally, since the work function of the ITO is about 4.3 eV and the work function of p-GaAs is about 5.5 eV, the ohmic characteristics are not implemented when the ITO is deposited on p-GaAs.

However, in the embodiment, by performing a predetermined annealing process after ITO is deposited on p-GaAs, it is possible to implement high ohmic characteristics by tunneling effect in ITO having a thickness of 100 nm to 250 nm.

For example, according to the embodiment, by performing a predetermined annealing process at 200° C. to 500° C. in a nitrogen atmosphere after ITO is deposited on p-GaAs, it is possible to implement high ohmic characteristics by tunneling effect in ITO having a thickness of 100 nm to 250 nm.

In addition, for example, according to the embodiment, by performing a predetermined annealing process for a about 1 minute at 250° C. to 450° C. in a nitrogen atmosphere after ITO is deposited on p-GaAs, it is possible to implement higher ohmic characteristics by turning effect in ITO having a thickness of 100 nm to 250 nm.

For example, according to the embodiment, when Ga and indium of ITO are annealed on the surface of p-GaAs, Ga out-diffusion occurs in order to form a Ga—In solid solution and thus a Ga vacancy, that is, an acceptor, may increase on the surface of p-GaAs.

In addition, according to the embodiment, during annealing, a Ga—In—Sn-(Oxide) compound may be formed due to Ga out-diffusion and thus a p-GaAs upper surface layer is formed as a deep acceptor like Ga vacancies, thereby increasing carrier concentration. Therefore, p-GaAs/ITO ohmic formation is possible due to tunneling.

Next, one of objects of the embodiment is to provide a surface-emitting laser device capable of preventing apertures from being damaged or the divergence angle of emitted beams from increasing.

Figure 15A:
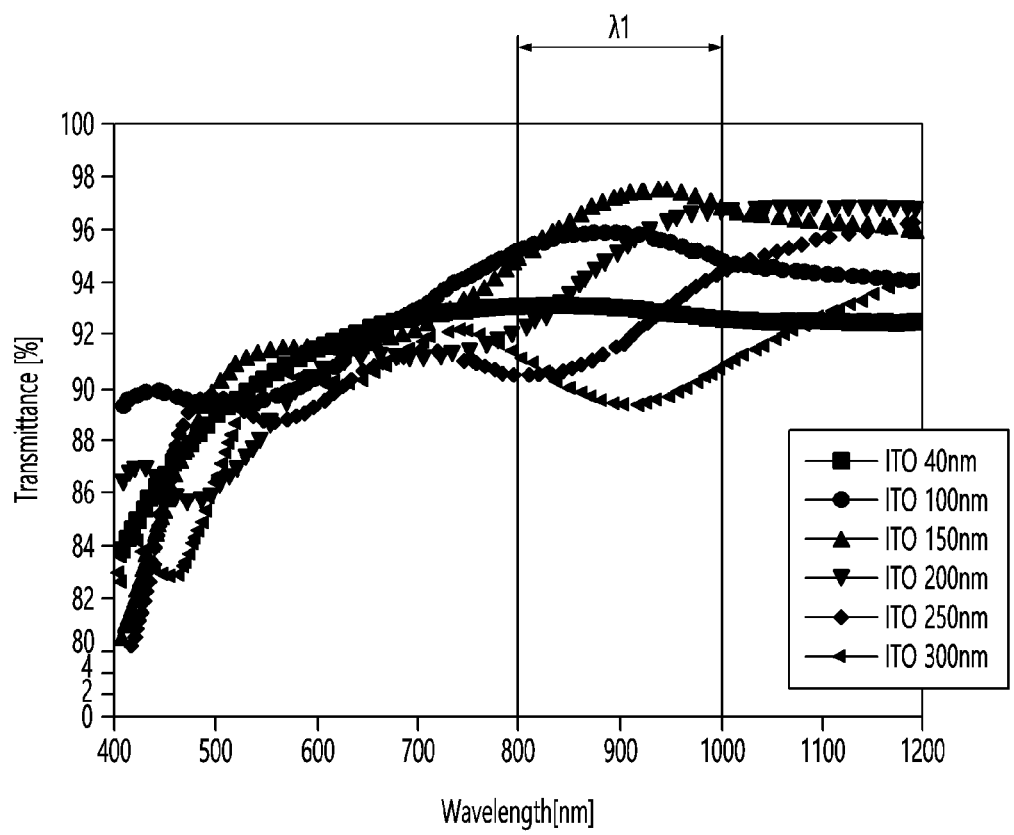
FIG. 15a is a view showing light transmittance in a surface-emitting laser device according to an embodiment.

FIG. 15a is a view showing light transmittance in a surface-emitting laser device according to an embodiment.

As shown in FIG. 15a, according to the embodiment, by forming the ohmic contact layer 291 having a thickness of about 100 nm to 250 nm on the second reflective layer 250, it is possible to significantly improve light transmittance.

For example, when a wavelength λ1 applicable by the surface-emitting laser device according to the embodiment is about 800 nm to 1,000 nm, the refractive index of the ohmic contact layer may be about 1.6 to 2.2, and a dielectric constant k may be equal to or less than about 0.1.

Figure 15B:
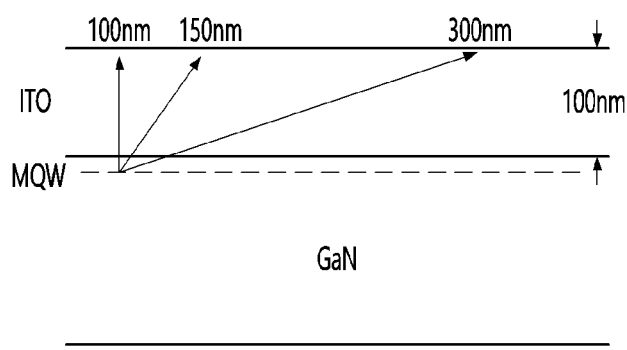
FIGS. 15b and 15c are views showing a comparative examples of light transmittance characteristics between a comparative example and an embodiment.
Figure 15C:
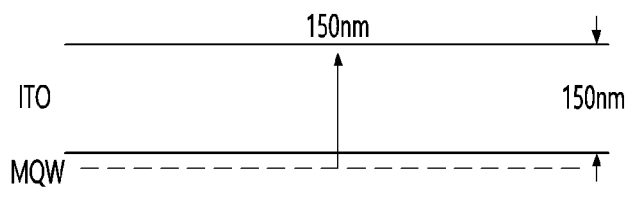

FIGS. 15b and 15c are views showing a comparative examples of light transmittance characteristics between a comparative example and an embodiment.

For example, as shown in FIG. 15b, in the LED technology as the comparative example, when the main wavelength λ2 of the LED is about 450 nm, as shown in FIG. 15a, the thickness of ITO at highest transmittance is about 100 nm.

However, as shown in FIG. 15b, when the actual LED is applied, the thickness of the ITO is about 40 nm, because the LED is a volume light emitting device and thus thin ITO is advantageous and power may be lowered when ITO having a thickness of 100 nm or more is applied.

In contrast, as shown in FIG. 15c, when the surface-emitting laser device according to the embodiment is applied, since only the thickness of a vertical component is considered due to lasing of photon, thick ITO may be considered in consideration of the wavelength of the VCSEL. According to the embodiment, light transmittance is significantly improved at a thickness of about 100 nm to 250 nm.

According to the embodiment, it is possible to improve optical characteristics due to anti-reflection (AR) coating by the ohmic contact layer 291 disposed on the second reflective layer 250.

In addition, the embodiment provides a surface-emitting laser device capable of preventing apertures from being damaged or the divergence angle of emitted beams from increasing.

Therefore, according to the embodiment, by controlling the thickness of the ohmic contact layer 291 to a first thickness T1 of about 100 nm to about 250 nm, there are complex technical effects in which it is possible to obtain high ohmic characteristics between the ohmic contact layer 291 and the second reflective layer 250 and to significantly reduce sheet resistance Rs.

Third Embodiment

Figure 16:
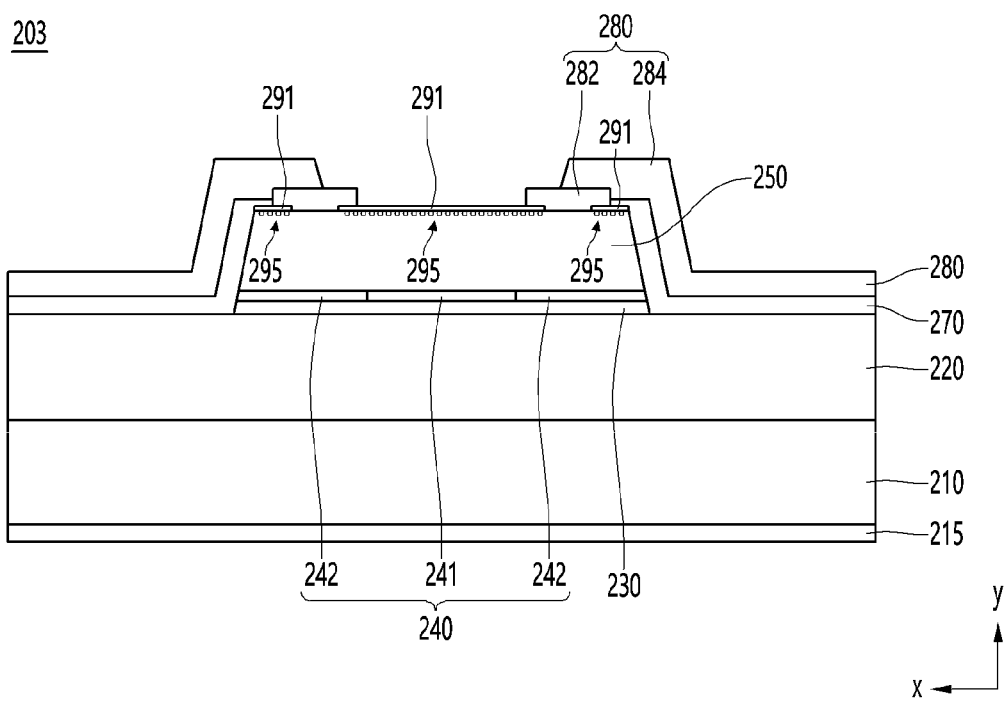
FIG. 16 is a cross-sectional view of a surface-emitting laser device according to a third embodiment.

Next, FIG. 16 is a cross-sectional view of a surface-emitting laser device 202 according to a third embodiment.

The third embodiment may employ the technical features of the second embodiment. Hereinafter, the main features of the third embodiment will be focused upon.

The surface-emitting laser device 202 according to the third embodiment may include conductive dots 295 between the second reflective layer 250 and the ohmic contact layer 291, thereby further improving ohmic characteristics.

For example, the third embodiment include the conductive dots 295, such as Ag or Pt, between the second reflective layer 250 and the ohmic contact layer 291, thereby further improving ohmic characteristics and further improving electrical characteristics. The conductive dots 295 may have a diameter of about 3 nm to 6 nm. If the diameter is less than 3 nm, contribution to ohmic contact may be low and, if the diameter exceeds 6 nm, transmittance may be affected.

Fourth Embodiment

Figure 17A:
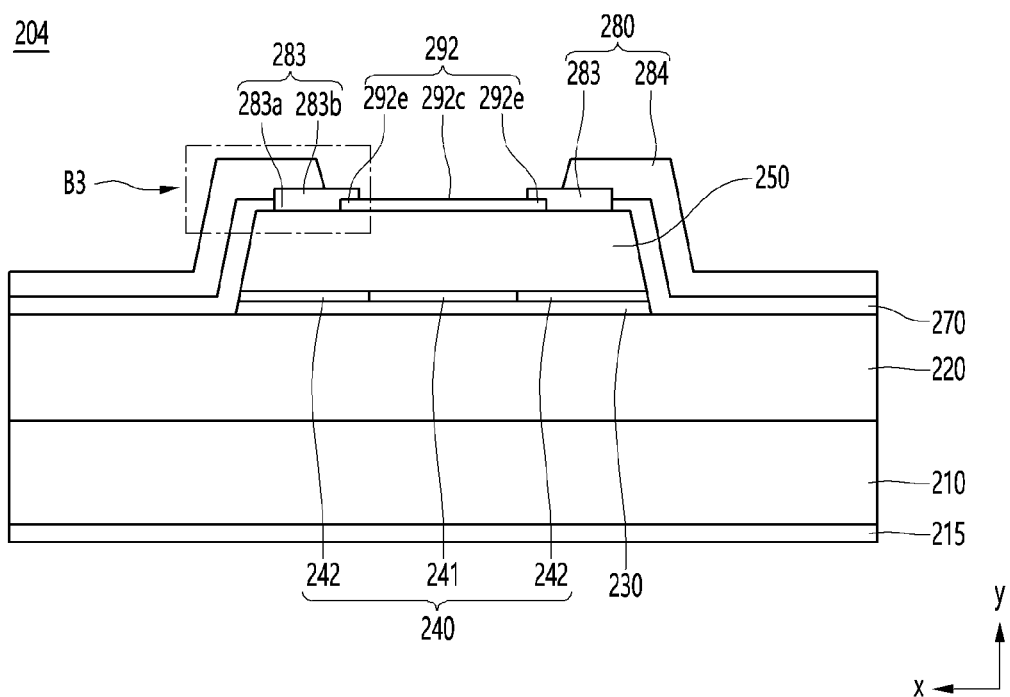
FIG. 17a is a cross-sectional view of a surface-emitting laser device according to a fourth embodiment.
Figure 17B:
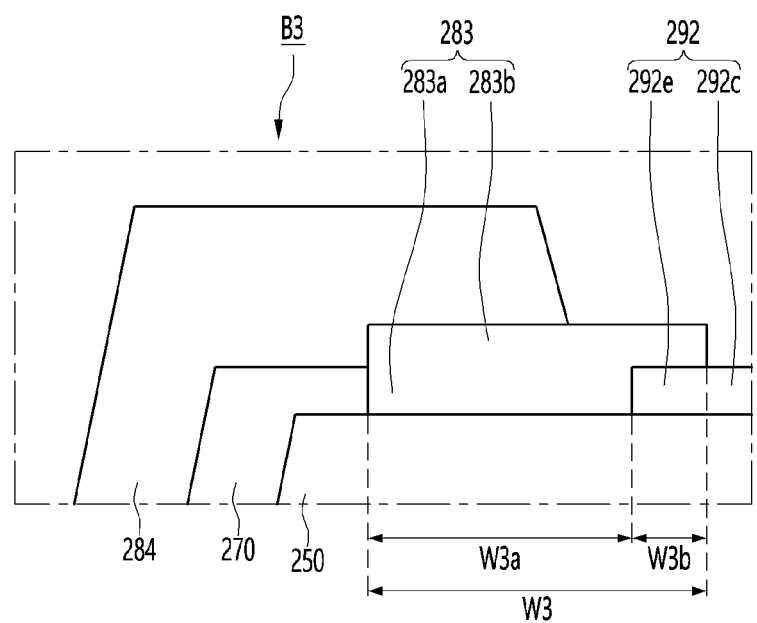
FIG. 17b is an enlarged view of a third region B3 of the surface-emitting laser device according to the fourth embodiment.

FIG. 17 is a cross-sectional view of a surface-emitting laser device 203 according to a fourth embodiment. FIG. 17b is an enlarged cross-sectional view of a third region B3 of the surface-emitting laser device 203 according to the fourth embodiment shown in FIG. 17a.

The fourth embodiment may employ the technical features of the second embodiment and the third embodiment. Hereinafter, the main features of the fourth embodiment will be focused upon.

In the fourth embodiment, the second electrode 280 includes a second contact electrode 283 on a second ohmic contact layer 292, and the third contact electrode 283 may be electrically connected to the second reflective layer 250 without penetrating the second ohmic contact layer 292.

Referring to FIGS. 17a and 17b, according to the fourth embodiment, the second ohmic contact layer 292 may include a central portion 292c and an edge portion 292e. The central portion 292c of the second ohmic contact layer may be disposed on the second reflective layer 250 to vertically overlap the aperture 241, and the edge portion 292e of the second ohmic contact layer may be disposed to vertically overlap the second contact electrode 283.

The edge portion 292e of the second ohmic contact layer may be disposed not to vertically overlap the pad electrode 284.

At this time, the passivation layer 270 may be spaced apart from the second ohmic contact layer 292.

According to the fourth embodiment, the second contact electrode 283 may be directly in contact with the second reflective layer 250 as wide as possible, and the edge portion 292e of the second ohmic contact layer 292 may be disposed to be spaced apart from the passivation layer 270, thereby preventing current from being diffused to the outside of the aperture. In addition, the second ohmic contact layer 292 may be disposed in a region corresponding to the aperture 241, thereby improving current injection efficiency.

TABLE 3

|  | p-GaAs/ITO | | | | p-GaAs/p-Pad |
| --- | --- | --- | --- | --- | --- |
| Heat treatment | As-dep | 250° C. | 350° C. | 450° C. | As-dep. ~350° C. |
| Contact resistance (ohm*cm$^2$) | Non-Ohmic | 2.7E−04 | 1.0E−04 | 1.0E−04 | 1.4E−05 |

Table 3 below shows ohmic characteristic data between the second reflective layer 250, for example, p-GaAs, and ITO and ohmic characteristic data between p-GaAs and p-Pad.

According to the application of the embodiment, it is possible to improve the ohmic characteristics of the second ohmic contact layer 292 and it is possible to more complexly use the ohmic characteristics of the second contact electrode 283 at the outside.

That is, it is possible to improve current injection efficiency by disposing the second ohmic contact layer 292 in a region corresponding to the aperture 241 and to improve current injection efficiency by disposing the second contact electrode 283 in a region which does not correspond to the aperture 241 to reduce resistance.

For example, referring to FIG. 17b, in the fourth embodiment, the second ohmic contact layer 292 may be disposed to vertically overlap the second contact electrode 283, and a (3-2)-th width W3b of a portion overlapping the second ohmic contact layer 292 of the third width W3 of the second contact electrode 283 may be designed not to be greater than a (3-1)-th width of a portion which does not overlap the second ohmic contact layer 292.

For example, the (3-2)-th width W3b of a portion, which overlaps the second ohmic contact layer 292, of the second contact electrode 283 may be controlled to be equal to or less than 50% of the third width W3 of the second contact electrode 283.

Therefore, the second contact electrode 283 may be directly in contact with the second reflective layer 250 as wide as possible, and the edge portion 292e of the second ohmic contact layer 292 may be disposed to be spaced apart from the passivation layer 270, thereby preventing current from being diffused to the outside of the aperture. In addition, the second ohmic contact layer 292 may be disposed on the second reflective layer 250 to overlap the second contact electrode 292 in a region corresponding to the aperture 241, thereby improving current injection efficiency.

Hereinafter, a process of manufacturing a surface-emitting laser device according to an embodiment will be described with reference to FIGS. 18a to 22c.

Figure 18A:
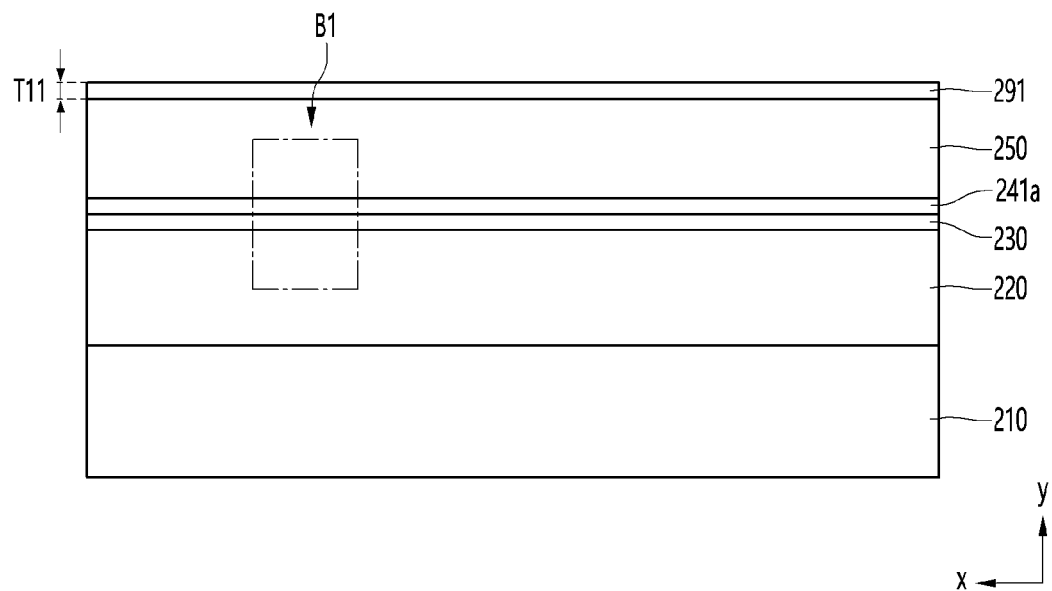
FIGS. 18a to 22c are views showing a method of manufacturing a surface-emitting laser device according to an embodiment.

First, as shown in FIG. 18a, a light emitting structure including the first reflective layer 220, the active region 230 and the second reflective layer 250 is formed on the substrate 210.

The substrate 210 may be formed of a material suitable for semiconductor material growth or a carrier wafer, may be formed of a material having excellent thermal conductivity, and include a conductive substrate or an insulating substrate.

For example, when the substrate 210 is a conductive substrate, metal having excellent electrical conductivity may be used. In addition, since heat generated during operation of the surface-emitting laser device 200 needs to be sufficiently dissipated, a GaAs substrate having high thermal conductivity, a metal substrate or a silicon (Si) substrate may be used.

In addition, when the substrate 210 is a non-conductive substrate, an AlN substrate, a sapphire ($Al_2O_3$) substrate or a ceramic substrate may be used.

In addition, in the embodiment, as the substrate 210, a substrate of the same type as the first reflective layer 220 may be used. For example, when the substrate 210 is a GaAs substrate of the same type as the first reflective layer 220, since the lattice constant thereof is equal to that of the first reflective layer 210, defects such as lattice mismatching may not occur in the first reflective layer 220.

Figure 18B:
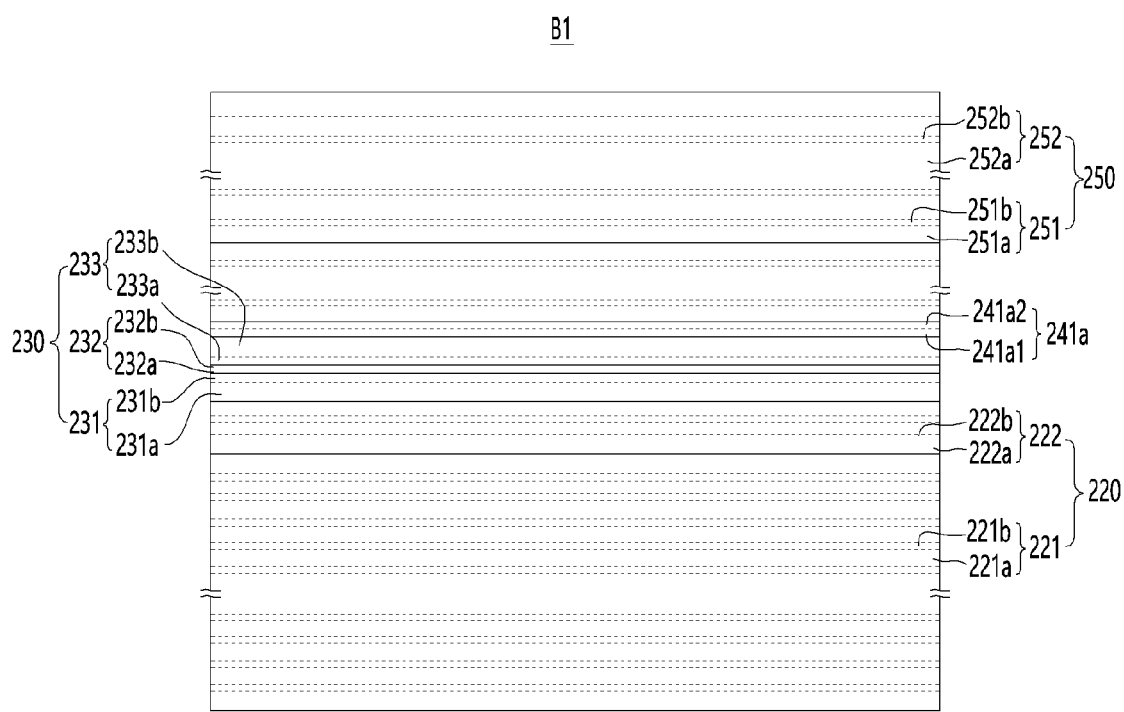

Next, the first reflective layer 220 may be formed on the substrate 210. FIG. 18b is an enlarged view of a (1-2)-th region D2 of the surface-emitting laser device according to the embodiment shown in FIG. 18a.

Hereinafter, the surface-emitting laser device according to the embodiment will be described with reference to FIGS. 18a and 18b.

The first reflective layer 220 may be grown using a chemical vapor deposition (CVD), molecular beam epitaxy (MBE), sputtering or hydride vapor phase epitaxy (HVPE).

The first reflective layer 220 may be doped with a first conductive type dopant. For example, the first conductive dopant may include an n-type dopant such as Si, Ge, Sn, Se and Te.

The first reflective layer 220 may include a gallium based compound, such as AlGaAs, but is not limited thereto. The first reflective layer 220 may be a distributed bragg reflector (DBR). For example, the first reflective layer 220 may have a structure in which layers made of materials having different refractive indices are alternately stacked at least once or more.

For example, as shown in FIG. 18b, the first reflective layer 220 may include the first-group first reflective layer 221 disposed on the substrate 210 and the second-group first reflective layer 222 disposed on the first-group first reflective layer 221.

The first-group first reflective layer 221 and the second-group first reflective layer 222 may include a plurality of layers made of a semiconductor material having a formula of $Al_xGa_{(1-x)}As$ (0<x<1). When Al in each layer increases, the refractive index of each layer decreases and, when Ga increases, the refractive index of each layer may increase.

In addition, as shown in FIG. 18b, each of the first-group first reflective layer 221 and the second-group first reflective layer 222 may be formed of a single layer or a plurality of layers. For example, the first-group first reflective layer 221 may include about 30 to 40 pairs of first-group (1-1)-th layers 221a and first-group (1-2)-th layers. In addition, the second-group first reflective layer 222 may also include about 5 to 15 pairs of second-group (1-1)-th layers 222a and second-group (1-2)-th layers.

Next, the active region 230 may be formed on the first reflective layer 220.

As shown FIG. 18b, the active region 230 may include the active layer 232, the first cavity 231 disposed under the active layer 232 and the second cavity 233 disposed on the active layer. The active region 230 of the embodiment may include one or both of the first cavity 231 and the second cavity 233.

The active layer 232 may include a well layer 232a and a barrier layer 232b using the compound semiconductor material of Group III-V elements. The active layer 232 may be formed in a structure of one to three pairs of InGaAs/AlxGaAs, AlGaInP/GaInP, AlGaAs/AlGaAs, AlGaAs/GaAs, or GaAs/InGaAs, but is not limited thereto. The active layer 232 may not be doped with a dopant.

The first cavity 231 and the second cavity 233 may be formed of a material having $Al_yGa_{(1-y)}As$ (0<y<1) but is not limited thereto. For example, each of the first cavity 231 and the second cavity 233 may include a plurality of layers having $Al_yGa_{(1-y)}As$.

For example, the first cavity 231 may include the (1-1)-th cavity layer 231a and the (1-2)-th cavity layer 231b. In addition, the second cavity 233 may include the (2-1)-th cavity layer 233a and the (2-2)-th cavity layer 233b.

Next, an AlGa-based layer 241a for forming the aperture region 240 may be formed on the active region 230.

The AlGa-based layer 241a may include a material of $Al_xGa_{(1-x)}As$ (0<z<1) but is not limited thereto.

The AlGa-based layer 241a may include a conductive material, and include a material of the same type as the first reflective layer 220 and the second reflective layer 250 but is not limited thereto.

For example, when the AlGa-based layer 241a includes an AlGaAs-based material, the AlGa-based layer 241a may be made of a semiconductor material having a formula of $Al_xGa_{(1-x)}As$ (0<x<1), and may have a formula of $Al_{0.98}Ga_{0.02}As$ but is not limited thereto.

The AlGa-based layer 241a may include a plurality of layers. For example, the AlGa-based layer 241a may include a first AlGa-based layer 241a1 and a second AlGa-based layer 241a2.

Next, the second reflective layer 250 may be formed on the AlGa-based layer 241a.

The second reflective layer 250 may include a gallium-based compound, for example, AlGaAs. For example, each layer of the second reflective layer 250 may include AlGaAs and specifically may be made of a semiconductor material having a formula of $Al_xGa_{(1-x)}As$ (0<x<1).

The second reflective layer 250 may be doped with a second conductive type dopant. For example, The second conductive type dopant may be a p-type dopant such as Mg, Zn, Ca, Sr or Ba. Meanwhile, the first reflective layer 220 may be doped with the p-type dopant, and the second reflective layer 250 may be doped with the n-type dopant.

The second reflective layer 250 may also be a distributed bragg reflector (DBR). For example, the second reflective layer 250 may have a structure in which a first layer and a second layer made of materials having different refractive indices are alternately laminated at least once or more.

For example, the second reflective layer 250 may include the first-group second reflective layer 251 disposed adjacent to the active region 230 and the second-group second reflective layer 252 spaced apart from the active region 230 as compared to the first-group second reflective layer 251.

In addition, each of the first-group second reflective layer 251 and the second-group second reflective layer 252 may be formed of a single layer or multiple layers. For example, the first-group second reflective layer 251 may include about one to five pairs of first-group (2-1)-th layers 251a and first-group (2-2)-th layers 251b. In addition, the second-group second reflective layer 252 may also include about 5 to 15 pairs of second-group (2-1)-th layers 252a and second-group (2-2)-th layers 252b.

Referring to FIG. 18a again, the ohmic contact layer 291 may be formed on the second reflective layer 250.

The ohmic contact layer 291 may include one or more of ITO, AZO, GZO, ZnO, $Y_2O_3$ and $ZrO_2$.

According to the embodiment, as shown in FIG. 13, by controlling the thickness of the ohmic contact layer 291 to the first thickness T11 (T9 of FIG. 13) which is about 100 nm to about 250 nm, it is possible to obtain high ohmic characteristics between the ohmic contact layer 291 and the second reflective layer 250 and to significantly reducing sheet resistance Rs.

Meanwhile, in the comparative example, when the thickness of the ohmic contact layer 291 is a second thickness T12 (T10 of FIG. 13), the ohmic characteristics may not be implemented and sheet resistance may be high. For example, as shown in FIG. 13, when the thickness of the ohmic contact layer is 20 nm to 60 m, sheet resistance is as high as 180 to 37 ohm/sq.

However, as in the embodiment, when the thickness of the ohmic contact layer is controlled to 100 nm to 250 nm, it is possible to control sheet resistance to be remarkably as low as 18 to 7 ohm/sq.

Next, as shown in FIG. 14, when no other measures are taken after ITO is formed on a p-type reflective layer, for example p-GaAS, a non-ohmic result is obtained.

In contrast, as in the embodiment, when predetermined annealing is performed after ITO is formed on a p-type reflective layer, for example, p-GaAs, it is possible to implement ohmic characteristics at a thickness of 100 nm to 250 nm.

More specifically, the work function Φ of each material needs to be considered as the physical condition of the ohmic characteristics. In order to achieve the ohmic characteristics, the work function of the ohmic layer needs to be greater than that of the p-type reflective layer.

However, generally, since the work function of the ITO is about 4.3 eV and the work function of p-GaAs is about 5.5 eV, the ohmic characteristics are not implemented when the ITO is deposited on p-GaAs.

However, in the embodiment, by performing a predetermined annealing process after ITO is deposited on p-GaAs, it is possible to implement high ohmic characteristics by tunneling effect in ITO having a thickness of 100 nm to 250 nm.

For example, according to the embodiment, by performing a predetermined annealing process at 200° C. to 500° C.

in a nitrogen atmosphere after ITO is deposited on p-GaAs, it is possible to implement high ohmic characteristics by tunneling effect in ITO having a thickness of 100 nm to 250 nm.

In addition, for example, according to the embodiment, by performing a predetermined annealing process for a about 1 minute at 250° C. to 450° C. in a nitrogen atmosphere after ITO is deposited on p-GaAs, it is possible to implement higher ohmic characteristics by turning effect in ITO having a thickness of 100 nm to 250 nm.

For example, according to the embodiment, when Ga and indium of ITO are annealed on the surface of p-GaAs, Ga out-diffusion occurs in order to form a Ga—In solid solution and thus a Ga vacancy, that is, an acceptor, may increase on the surface of p-GaAs.

In addition, according to the embodiment, during annealing, a Ga—In—Sn-(Oxide) compound may be formed due to Ga out-diffusion and thus a p-GaAs upper surface layer is formed as a deep acceptor like Ga vacancies, thereby increasing carrier concentration. Therefore, p-GaAs/ITO ohmic formation is possible due to tunneling.

In addition, according to the embodiment, as shown in FIG. 15a, by forming the ohmic contact layer 291 having a thickness of about 100 nm to 250 nm on the second reflective layer 250, it is possible to significantly improve light transmittance.

For example, when a wavelength λ1 applicable by the surface-emitting laser device according to the embodiment is about 800 nm to 1,000 nm, the refractive index n of the ohmic contact layer may be about 1.6 to 2.2, and an extinction coefficient or absorption index k may be 0.1 or less.

According to the embodiment, it is possible to improve optical characteristics due to anti-reflection (AR) coating by the ohmic contact layer 291 disposed on the second reflective layer 250.

In addition, the embodiment provides a surface-emitting laser device capable of preventing apertures from being damaged or the divergence angle of emitted beams from increasing.

In addition, as described above, according to the embodiment, by controlling the thickness of the ohmic contact layer 291 to a first thickness T1 of about 100 nm to about 250 nm, there are complex technical effects in which it is possible to obtain high ohmic characteristics between the ohmic contact layer 291 and the second reflective layer 250 and to significantly reduce sheet resistance Rs.

Figure 19A:
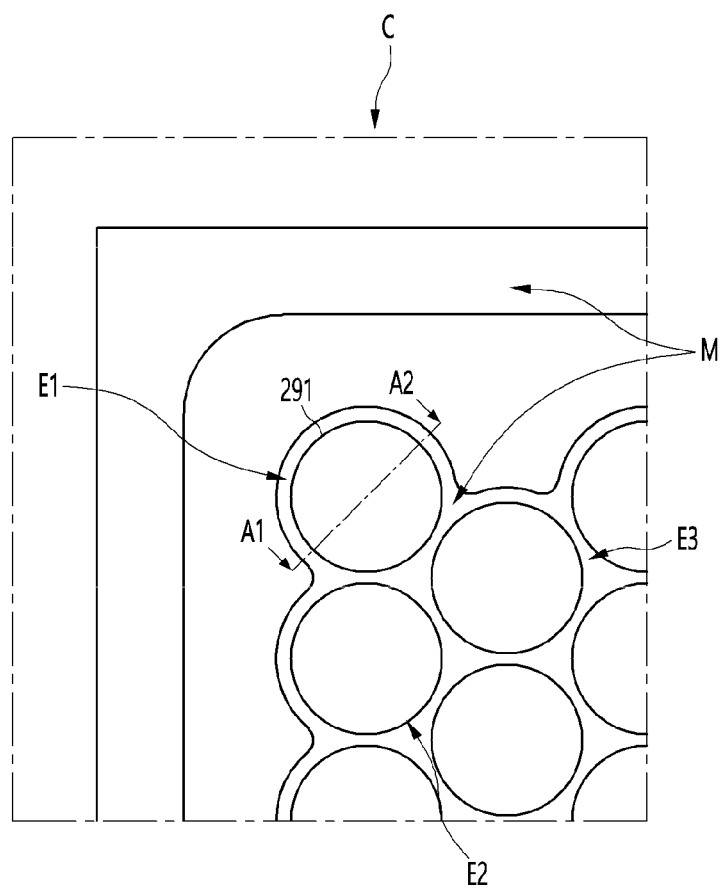
Figure 19B:
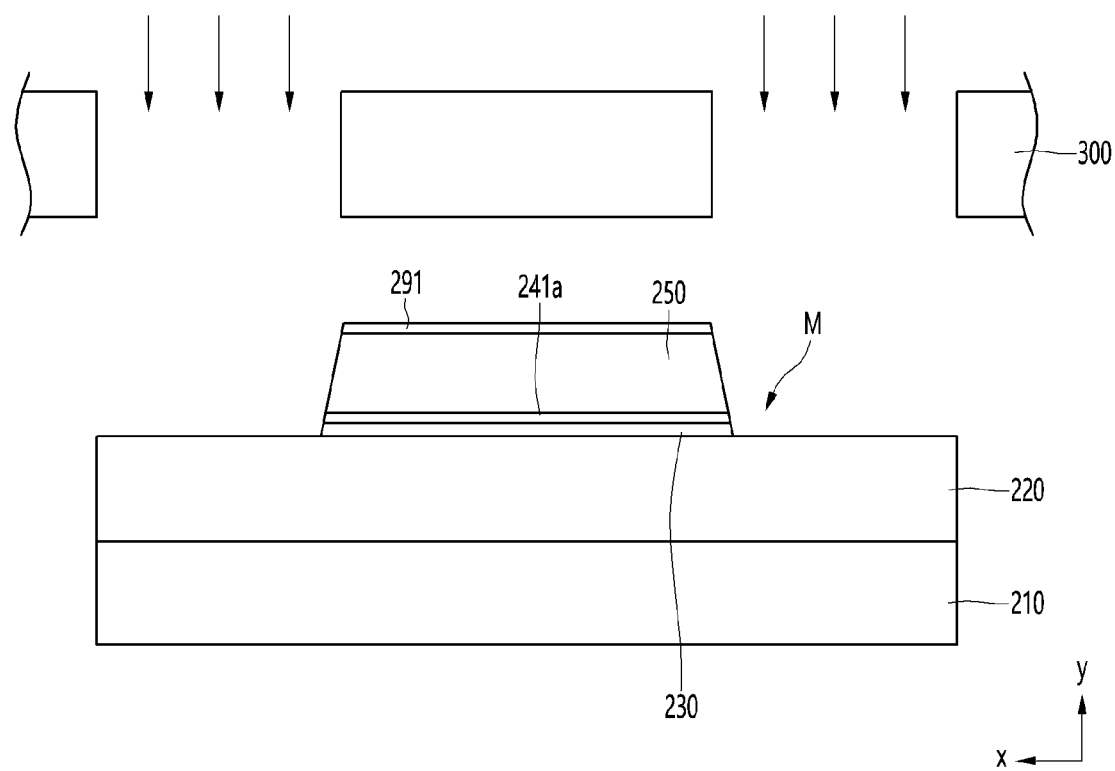

Next, FIG. 19a is an enlarged view of a portion C of the surface-emitting laser device according to the embodiment, and FIG. 19b is a partial cross-sectional view of the surface-emitting laser device according to the embodiment shown in FIG. 19a, taken along line A1-A2.

In the embodiment, as shown in FIG. 19b, a mesa region M may be formed by etching the light emitting structure using a predetermined mask 300. At this time, mesa etching may be performed from the second reflective layer 250 to the AlGa-based layer 241a and the active region 230, and a portion of the first reflective layer 220 may be mesa-etched. In mesa etching, the AlGa-based layer 241a and the active region 230 may be removed from the second reflective layer 250 of a peripheral region using an inductively coupled plasma (ICP) etching method, and a mesa-etched region may be etched such that a side surface thereof has a slope.

Figure 20A:
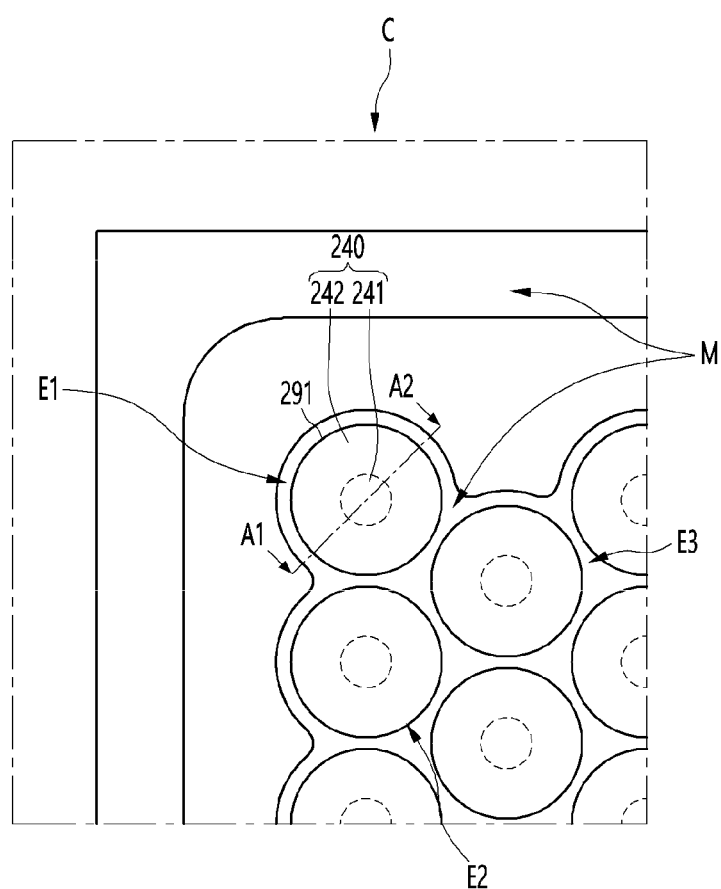
Figure 20B:
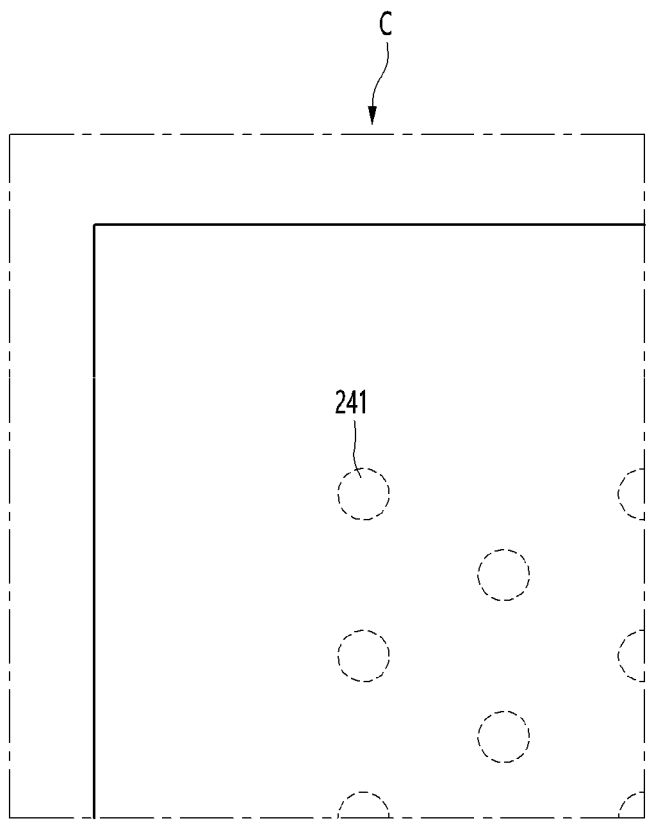
Figure 20C:
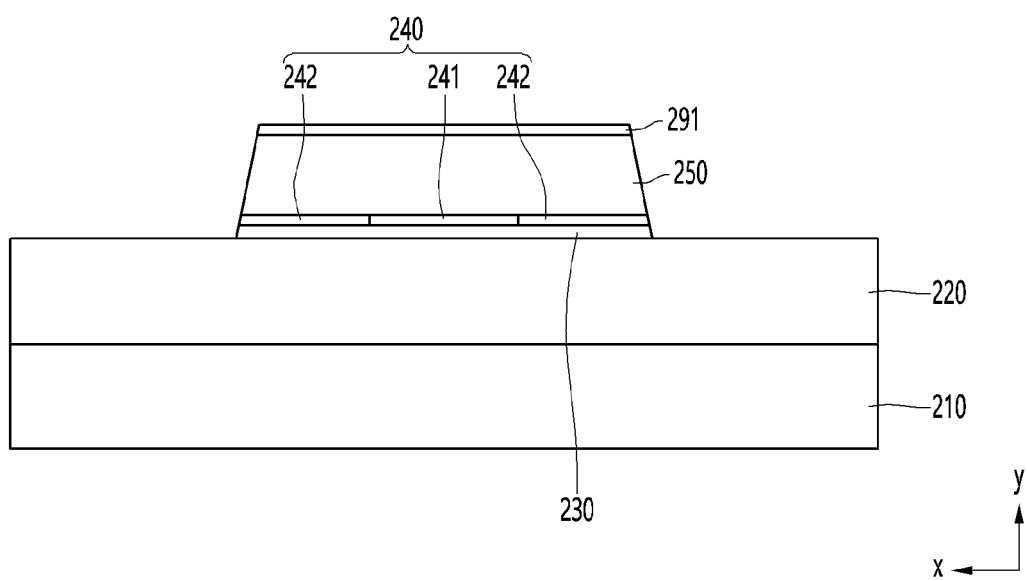

Next, FIG. 20a is an enlarged view of a portion C of the surface-emitting laser device according to the embodiment, FIG. 20b is a view illustrating a unit process of forming the aperture 241 in the surface-emitting laser device according to the embodiment, and FIG. 20c is a partial cross-sectional view of the surface-emitting laser device according to the embodiment shown in FIG. 20a, taken along line A1-A2.

In the embodiment, as shown in FIG. 20c, the edge region of the AlGa-based layer 241a may be changed to the insulating region 242 through, for example, wet oxidation. Therefore, the aperture region 240 including the insulating region 242 and the aperture 241 which is a non-oxide region may be formed.

For example, when oxygen is supplied from the edge region of the AlGa-based layer 241a, AlGaAs which is the AlGa-based layer may react with $H_2O$, thereby forming aluminum oxide $Al_2O_3$. At this time, by adjusting a reaction time, etc., the central region of the AlGa-based layer does not react with oxygen and only the edge region thereof reacts with oxygen, thereby forming the insulating region 242 of aluminum oxide.

In addition, in the embodiment, the edge region of the AlGa-based layer may be changed to the insulating region 242 through ion implantation, without being limited thereto. During ion implantation, photons may be supplied with energy of 300 keV or more.

After the above-described reaction process, AlGaAs having conductivity may be disposed in the central region of the aperture region 240 and $Al_2O_3$ having nonconductivity may be disposed in the edge region of the aperture region 240. AlGaAs of the central region refers to a portion in which light emitted from the active region 230 proceeds to an upper region and may be defined as the aperture 241.

Figure 21A:
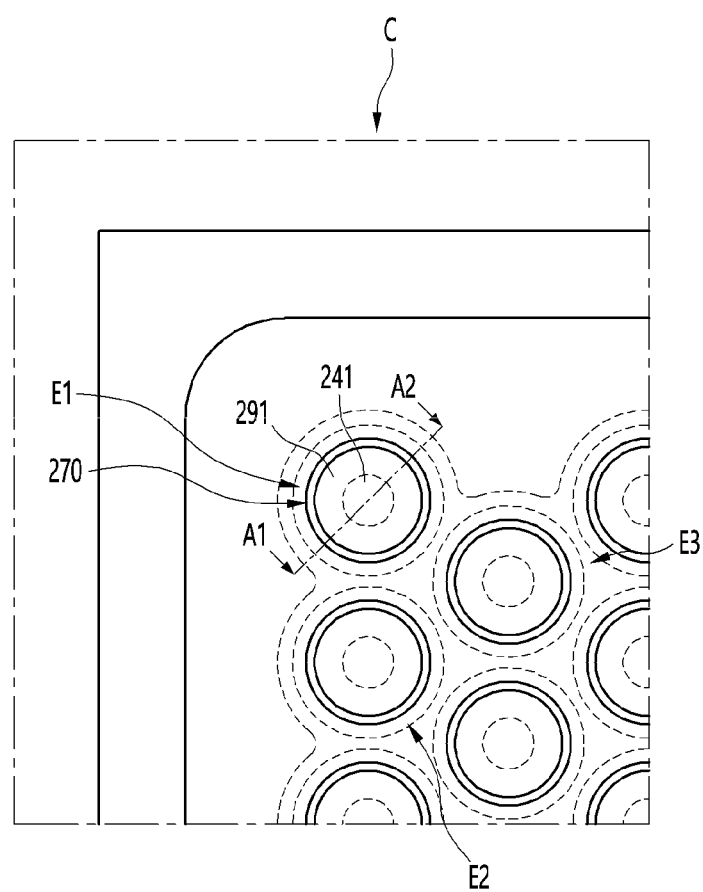
Figure 21B:
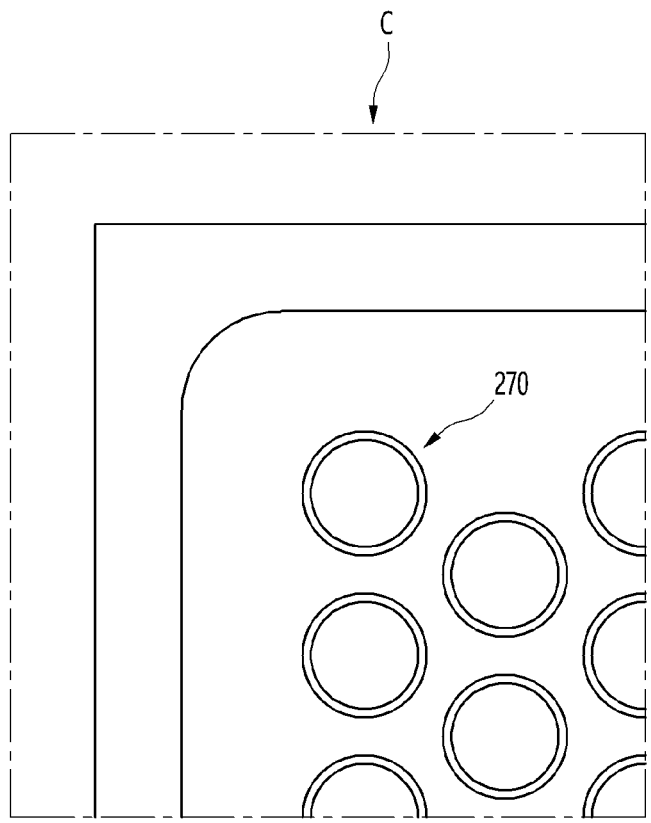
Figure 21C:
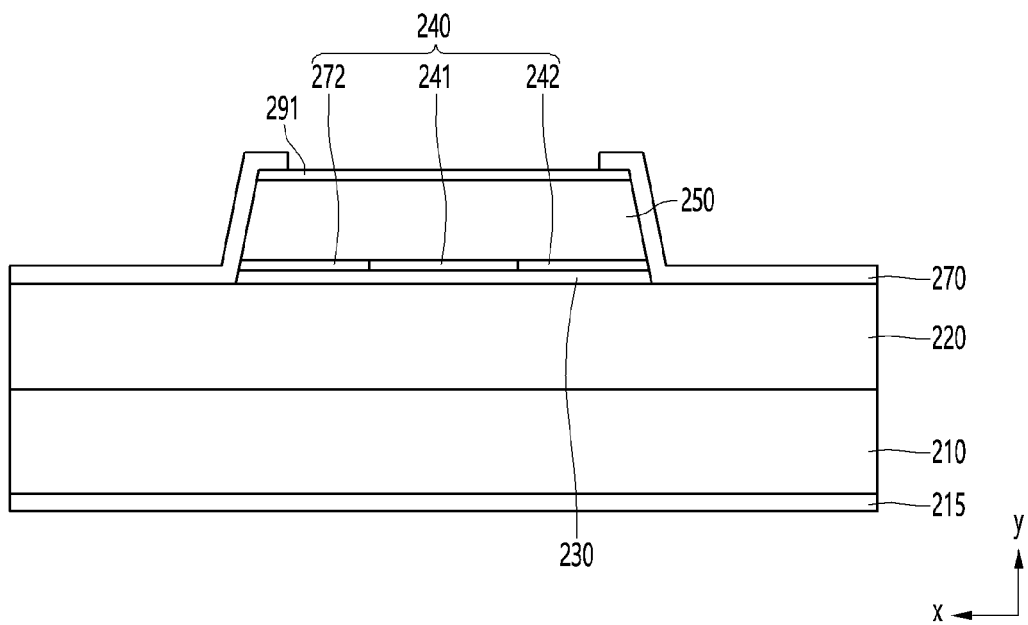

Next, FIG. 21a is an enlarged view of a portion C of the surface-emitting laser device according to the embodiment, FIG. 21b is a view illustrating a unit process of forming the passivation layer 270 in the surface-emitting laser device according to the embodiment, and FIG. 21c is a partial cross-sectional view of the surface-emitting laser device according to the embodiment shown in FIG. 21a, taken along line A1-A2.

As shown in FIG. 21c, the passivation layer 270 may be formed on the upper surface of the light emitting structure, and may be disposed on a portion of the outer side surface of the ohmic contact layer 291.

The passivation layer 270 may include at least one of polyimide, silica ($SiO_2$) or silicon nitride ($Si_3N_4$).

Meanwhile, in the fourth embodiment, the edge of the ohmic contact layer 291 may be removed such that the ohmic contact layer 291 and the passivation layer 270 are spaced apart from each other.

Figure 22A:
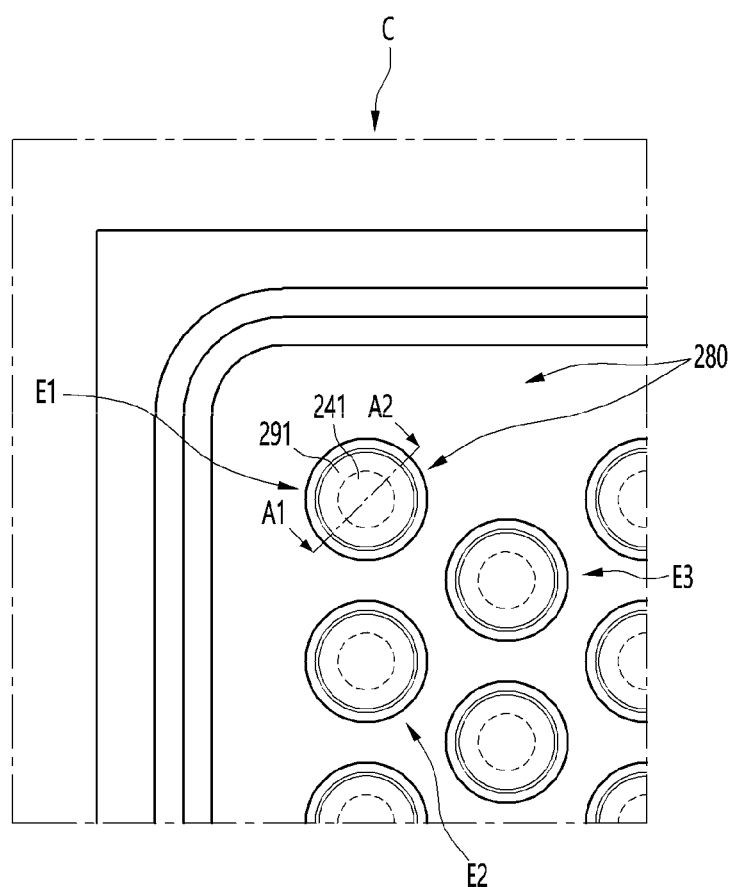
Figure 22B:
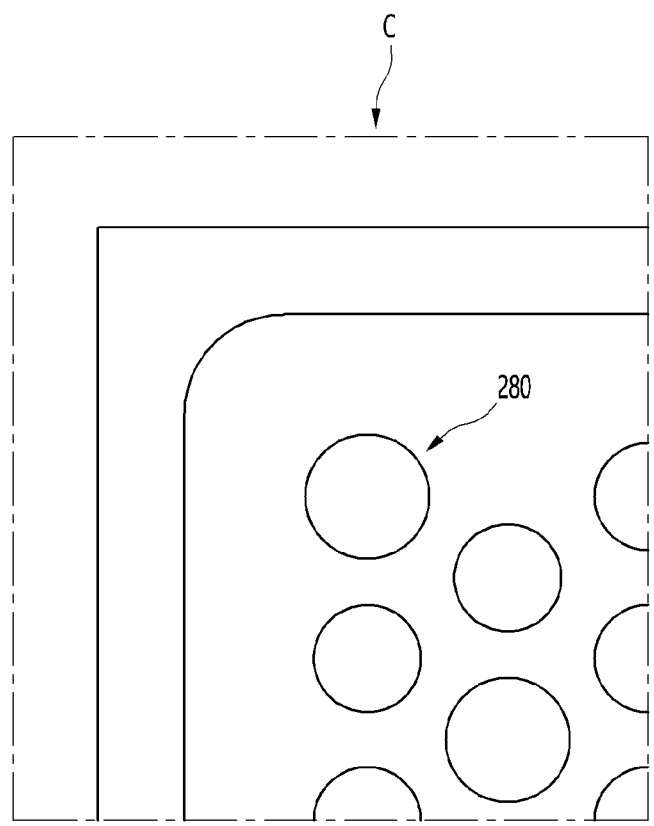
Figure 22C:
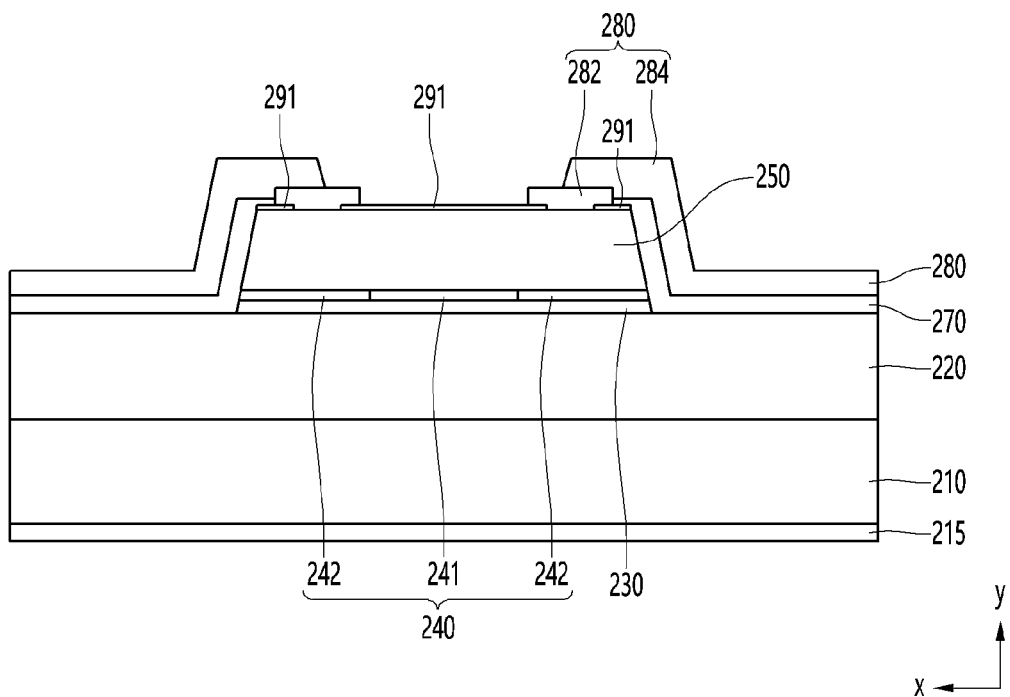

Next, FIG. 22a is an enlarged view of a portion C of the surface-emitting laser device according to the embodiment, FIG. 22b is a view illustrating a unit process of forming the second electrode 280 in the surface-emitting laser device according to the embodiment, and FIG. 22c is a partial cross-sectional view of the surface-emitting laser device according to the embodiment shown in FIG. 22a, taken along line A1-A2.

According to the embodiment, as shown in FIG. 22c, the contact electrodes 282 may be formed on the second reflective layer 250, and a central region in the contact electrode 282 may correspond to the aperture 241. The contact electrode 282 may improve ohmic contact characteristics with the second reflective layer 250.

Before the contact electrode 282 is formed, portions of the ohmic contact layer 291 at a position where the contact electrode 282 will be formed may be removed, such that portions of the second reflective layer 250 are exposed.

Next, the pad electrode 284 which is electrically in contact with the contact electrode 282 may be formed, and the pad electrode 284 may extend to the upper portion of the passivation layer 270 to receive current from the outside.

The contact electrode 282 and the pad electrode 284 may be made of a conductive material. For example, the contact electrode 282 and the pad electrode 284 may include at least one of aluminum (Al), titanium (Ti), chromium (Cr), nickel (Ni), copper (Cu) or gold (Au), and may be formed in a single-layer or multi-layer structure.

Referring to FIG. 2*b* again, portions of the second electrode 280 may be directly in contact with the second reflective layer 250 by penetrating the ohmic contact layer 291.

For example, the second electrode 280 may include the contact electrode 282 and the pad electrode 284, and the contact electrode 282 may include the lower contact electrode portion 282*a* and the upper contact electrode portion 282*b*, the lower contact electrode portion 282*a* may be directly in contact with the second reflective layer 250, and the upper contact electrode portion 282*b* may be directly in contact with the ohmic contact layer 291.

For example, the contact electrode 282 of the second electrode 280 may include the lower contact electrode portion 282*a* having a first width W1 and the upper contact electrode portion 282*b* having a second width W2 greater than the first width W1.

The lower contact electrode portion 282*a* of the contact electrode 282 may be directly in contact with the second reflective layer 250, and the upper contact electrode portion 282*b* of the contact electrode 282 may be disposed on the ohmic contact layer 291, such that the ohmic contact layer 291 is directly in contact with the second reflective layer 250, thereby being electrically connected with the second reflective layer 250 through the ohmic contact layer 291.

According to the embodiment, in the second electrode 280, the lower contact electrode portion 282*a* of the contact electrode 282 may be in contact with the second reflective layer 250, such that first current I1 is injected into the aperture 241, and the upper contact electrode portion 282*b* of the contact electrode 282 may be electrically connected with the second reflective layer 250 through the ohmic contact layer 291, such that second current I2 may be efficiently injected into the aperture 241.

In addition, referring to FIG. 16, the surface-emitting laser device 202 according to the third embodiment may include conductive dots 295 between the second reflective layer 250 and the ohmic contact layer 291, thereby further improving ohmic characteristics.

For example, the third embodiment include the conductive dots 295, such as Ag or Pt, between the second reflective layer 250 and the ohmic contact layer 291, thereby further improving ohmic characteristics and further improving electrical characteristics. The conductive dots 295 may have a diameter of about 3 nm to 6 nm. If the diameter is less than 3 nm, contribution to ohmic contact may be low and, if the diameter exceeds 6 nm, transmittance may be affected.

In addition, referring to FIG. 17, in the fourth embodiment, the second electrode 280 includes the second contact electrode 283 on the second ohmic contact layer 292, and the second contact electrode 283 may be electrically connected to the second reflective layer 250 without penetrating the second ohmic contact layer 292.

According to the fourth embodiment, the second ohmic contact layer 292 may include the central portion 292*c* and the edge portion 292*e*. The central portion 292*c* of the second ohmic contact layer may be disposed on the second reflective layer 250 to vertically overlap the aperture 241, and the edge portion 292*e* of the second ohmic contact layer may be disposed to vertically overlap the second contact electrode 283.

The edge portion 292*e* of the second ohmic contact layer may be disposed not to vertically overlap the pad electrode 284. At this time, the passivation layer 270 may be spaced apart from the second ohmic contact layer 292.

According to the fourth embodiment, the second contact electrode 283 may be directly in contact with the second reflective layer 250 as wide as possible, and the edge portion 292*e* of the second ohmic contact layer 292 may be disposed to be spaced apart from the passivation layer 270, thereby preventing current from being diffused to the outside of the aperture. In addition, the second ohmic contact layer 292 may be disposed in a region corresponding to the aperture 241, thereby improving current injection efficiency.

According to the application of the embodiment, it is possible to improve the ohmic characteristics of the ohmic contact layer and it is possible to use the ohmic characteristics of the contact electrode 282 at the outside.

That is, it is possible to improve current injection efficiency by disposing the second ohmic contact layer 292 in a region corresponding to the aperture 241 and to improve current injection efficiency by disposing the second contact electrode 283 in a region which does not correspond to the aperture 241 to reduce resistance.

Referring to FIG. 22*c* again, the first electrode 215 may be disposed under the substrate 210. Before the first electrode 215 is disposed, a portion of the bottom of the substrate 210 may be removed by a predetermined grinding process, thereby improving heat dissipation efficiency. The first electrode 215 may be made of a conductive material, such as metal. For example, the first electrode 215 may include at least one of aluminum (Al), titanium (Ti), chromium (Cr), nickel (Ni), copper (Cu) or gold (Au), and may be formed in a single-layer or multi-layer structure.

The above-described semiconductor device may be a laser diode, and the inside of two reflective layers may function as a resonator. At this time, when electrons and holes are supplied from the first reflective layer 220 of a first conductive type and the second reflective layer 250 of a second conductive type to an active layer, such that light emitted from the active region 230 is reflected from the inside of the resonator to reach threshold current and is emitted to the outside through the aperture 241.

Light emitted from the semiconductor device according to the embodiment may be light having a single wavelength and a single phase, and a single wavelength region may be changed according to the composition of the first reflective layer 220, the second reflective layer 250 and the active region 230.

Figure 23:
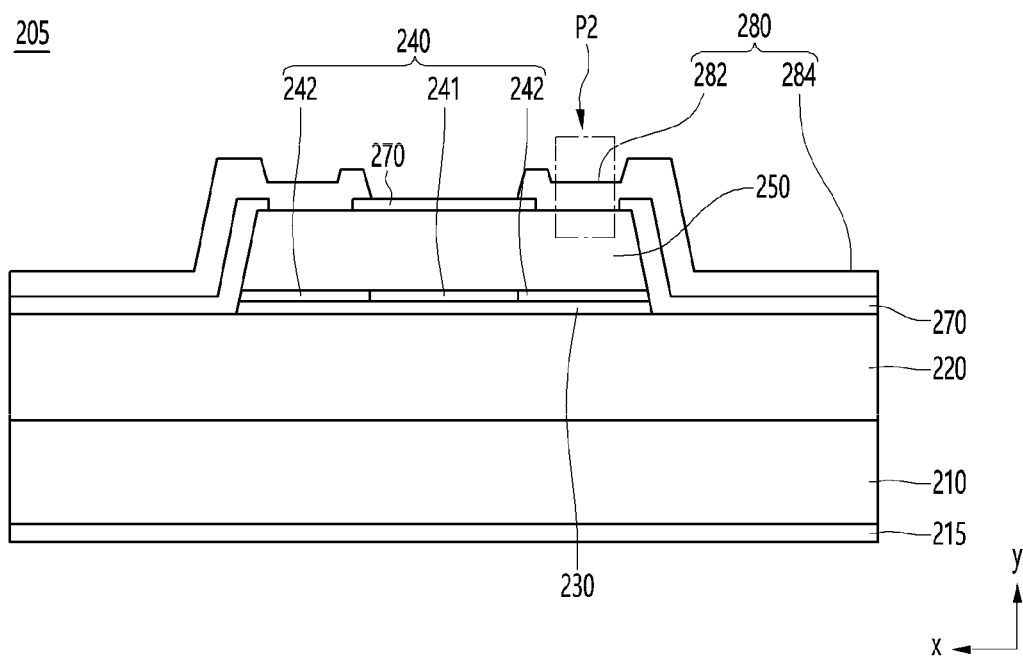
FIG. 23 is a cross-sectional view of a surface-emitting laser device according to a fifth embodiment.

FIG. 23 is a cross-sectional view of a surface-emitting laser device according to a fifth embodiment.

Referring to FIG. 23, the surface-emitting laser device 201 according to the fifth embodiment may include a light emitting portion E and a pad portion P. The light emitting portion E may be a region including the plurality of light emitters E1, E2 and E3 as shown in FIG. 2 and may be a region in which laser beams are emitted. For example, the light emitting portion E may include several tens to several hundreds of light emitters. The pad portion P may be a region in which the light emitters E1, E2 and E3 are not disposed.

The surface-emitting laser device 201 according to the fifth embodiment may include a second electrode 282 defining an opening. That is, in each of the light emitters E1, E2 and E3, the second electrode 282 may be disposed in a region other than the region corresponding to the aperture 241. For example, the second electrode 282 may be disposed in a second region of the second reflective layer 250. A first region of the second reflective layer 250 may be surrounded by the second region and may have a size equal to or greater than that of the aperture 241. Accordingly, the beam generated in the light emitting layer 230 may pass through the aperture 241 and may be emitted to the outside through an opening defined by the second electrode 282.

The surface-emitting laser device 201 according to the fifth embodiment may include one or more of the first electrode 215, the substrate 210, the first reflective layer 220, the light emitting layer 230, the oxide layer 240, the second reflective layer 250, the passivation layer 270 and the second electrode 282.

The oxide layer 240 may include the aperture 241 and the insulating region 242. The aperture 241 may be a passage region, through which current flows. The insulating region 242 may be a blocking region for blocking the flow of current. The insulating region 242 may be referred to as an oxide layer or an oxidation layer.

The surface-emitting laser device 201 according to the fifth embodiment may further include the second electrode 280. The second electrode 280 may be disposed in a region other than the pad portion P, that is, the light emitting portion E. The second electrode 280 may include a contact electrode 282 and a pad electrode 284. The contact electrode 282 may be electrically connected to the pad electrode 284. The contact electrode 282 and the pad electrode 284 may be integrally or separately formed.

Hereinafter, the second electrode 282 will be described in detail.

Figure 24:
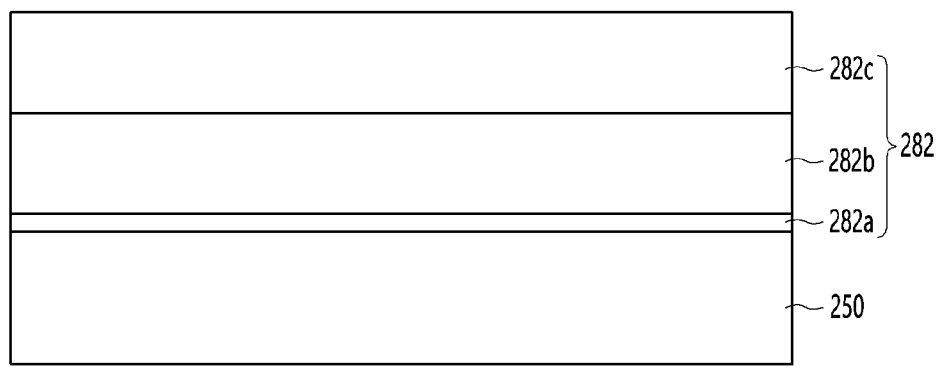
FIG. 24 is a cross-sectional view showing a second electrode of the surface-emitting laser device according to the fifth embodiment.

FIG. 24 is a cross-sectional view showing a second electrode of the surface-emitting laser device according to the fifth embodiment shown in FIG. 23a.

The second electrode 282 of the surface-emitting laser device 201 according to the fifth embodiment may be disposed in a partial region of the second reflective layer 250. For example, the second reflective layer 250 may include a first region and a second region surrounding the first region. The first region may have a size equal to or greater than that of the aperture 241 of the oxide layer 240. In this case, the second electrode 282 may be disposed on the second region of the second reflective layer 250. The second electrode 282 may be electrically connected to the second region of the second reflective layer 250. The second electrode 282 may be in contact with the second region of the second reflective layer 250. The partial region of the passivation layer 270 may be disposed on the first region of the second reflective layer 250. The second reflective layer 250 may be physical or electrically protected by the partial region of the passivation layer 270 disposed on the first region of the second reflective layer 250.

Referring to FIG. 24, the second electrode 282 may include a plurality of electrode layers. The electrode layers may include, for example, a first electrode layer 282a, a second electrode layer 282b and a third electrode layer 282c, without being limited thereto.

The first electrode layer 282a may be disposed on the second reflective layer 250. The first electrode layer 282a may be in contact with the upper surface of the second reflective layer 250. The first electrode layer 282a may improve the ohmic contact characteristics with the second reflective layer 250, thereby reducing contact resistance.

The first electrode layer 282a may include metal having a work function equal to or greater than that of the second reflective layer 250. The work function may be defined as minimum energy required to remove free electrons from metal ions. For example, the second reflective layer 250 may include GaAs having a work function of less than about 5.5. For example, the first electrode layer 282a may include platinum (Pt) having a work function of about less than 5.65 eV, without being limited thereto.

A ratio of the work function of the second reflective layer 250 to the work function of the first electrode layer 282a of the second electrode 282 may be about 1:0.8 to about 1:1.2. For example, when the work function of the second reflective layer 250 is 5.5 eV, the work function of the first electrode layer 282a of the second electrode 282 may be 4.4 eV to 6.6 eV.

When the ratio of the work function of the second reflective layer 250 to the work function of the first electrode layer 282a of the second electrode 282 is less than 1:0.8 or exceeds 1:1.2, a difference between the work function of the second reflective layer 250 and the work function of the first electrode layer 282a of the second electrode 282 may increase, thereby increasing contact resistance.

Figure 25A:
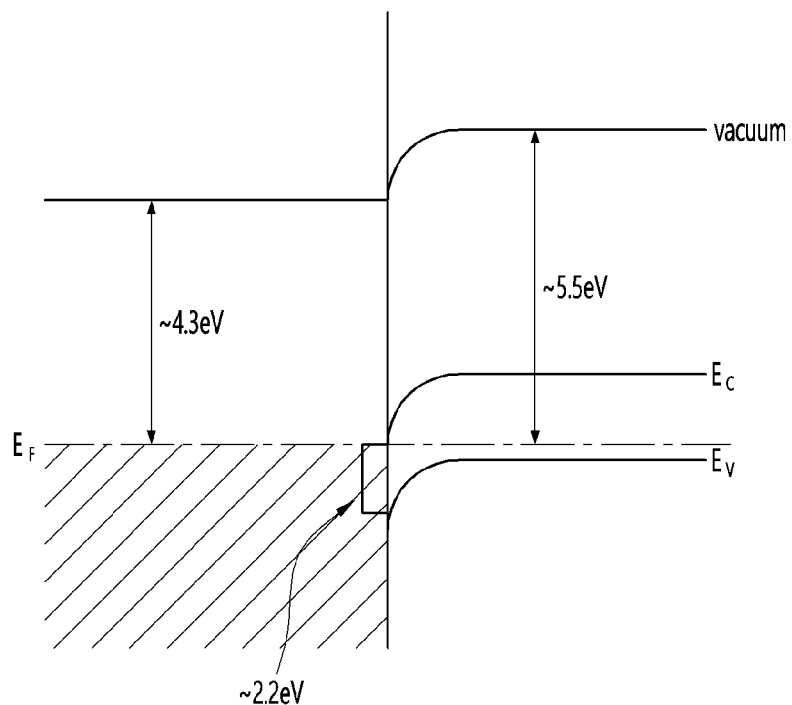
FIGS. 25a and 25b are views illustrating the work functions of the second electrodes of the surface-emitting laser devices according to the related art and the fifth embodiment.
Figure 25B:
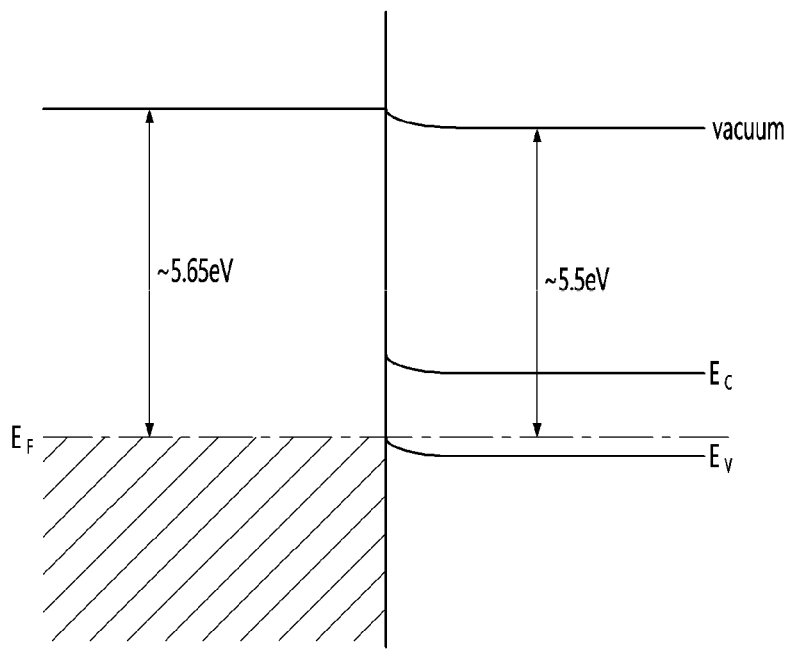

FIG. 25 is a view illustrating the work functions of the second electrodes of the surface-emitting laser devices according to the related art and the fifth embodiment.

As shown in FIG. 25, in the related art, metal which is contact with the second reflective layer 250 is titanium (Ti), and the work function of titanium (Ti) may be less than 4.3 eV. When titanium (Ti) is in contact with the second reflective layer 250, the difference between the work function of the second reflective layer 250 and the work function of titanium (Ti) is as large as 2.2 eV. Due to such a large difference between the work functions, contact resistance between titanium (Ti) and the second reflective layer 250 increases, thereby obstructing the flow of current. Therefore, in order to obtain light with high output power, a high operating voltage needs to be applied.

In contrast, as in the fifth embodiment, when the first electrode layer 282a including platinum (Pt) is in contact with the second reflective layer 250, since the work function of platinum (Pt) is less than 5.65 eV, the work function of platinum (Pt) is slightly larger than that of the second reflective layer 250. That is, since a difference between the work function of platinum (Pt) and the work function of the second reflective layer 250 is less than 0.15 eV and is ignorable, contact resistance between platinum (Pt) and the second reflective layer 250 may decrease, such that current smoothly flows. Therefore, light with high output power can be emitted even when a lower operating voltage is applied.

Figures 26A, 26B:
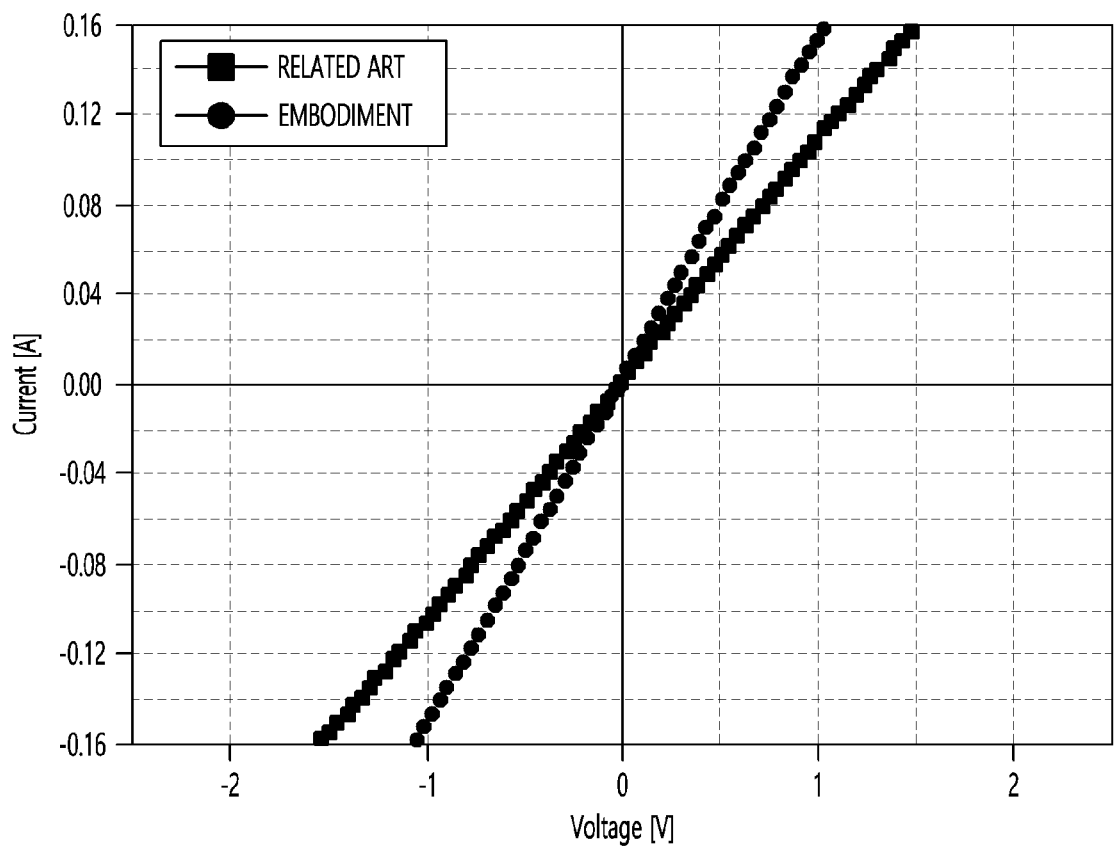
FIG. 26a is a view showing the V-I characteristics of the surface-emitting laser devices according to the related art and the fifth embodiment.
FIG. 26b is a view showing the contact resistance of the surface-emitting laser devices according to the related art and the fifth embodiment.
Figure 27:
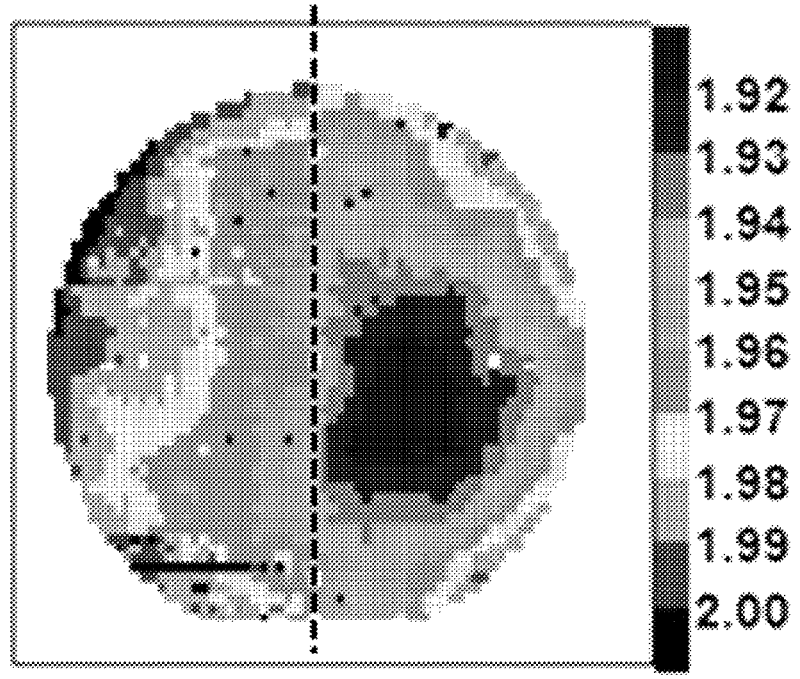
FIG. 27 is a view showing the operating voltage characteristics of the surface-emitting laser devices according to the related art and the fifth embodiment.

Referring to FIGS. 26 and 27, the V-I characteristics, contact resistance characteristics and operating voltage characteristics of the surface-emitting laser devices according to the related art and the fifth embodiment will be described.

FIG. 26a is a view showing the V-I characteristics of the surface-emitting laser devices according to the related art and the fifth embodiment. FIG. 26b is a view showing the contact resistance of the surface-emitting laser devices according to the related art and the fifth embodiment. FIG. 27 is a view showing the operating voltage characteristics of the surface-emitting laser devices according to the related art and the fifth embodiment.

As shown in FIG. 26a, it can be seen that the V-I characteristics of the surface-emitting laser device according to the fifth embodiment is superior to those of the related art. For example, when a voltage of 1V is applied, current of 0.1 A may flow in the related art, but current of 0.16 A may flow in the surface-emitting laser device according to the fifth embodiment. That is, at the same voltage, more current may flow in the surface-emitting laser device according to the fifth embodiment than the related art.

As shown in FIG. 26b, it can be seen that the contact resistance characteristics of the surface-emitting laser device according to the fifth embodiment are superior to those of the related art. The contact resistance of the related art is 1.46E-5, whereas the contact resistance of the surface-emitting laser device according to the fifth embodiment is 8.34E-6. It can be seen that the contact resistance of the surface-emitting laser device according to the fifth embodiment is reduced by almost 50% or more as compared to the related art.

As shown in FIG. 27, in order to emit light with the same high output power, a minimum operating voltage of 1.95 V to 1.97 V is applied in the related art, whereas a minimum operating voltage of 1.92 V or less is applied in the surface-emitting laser device according to the fifth embodiment. In other words, in order to emit light with the same high output power, an operating voltage of at least 1.95 V is required in the related art, whereas an operating voltage of 1.92 V or less is required in the surface-emitting laser device according to the fifth embodiment. That is, in the surface-emitting laser device according to the fifth embodiment, light with the same high output power as the related art may be emitted at a lower operating voltage than the related art.

Meanwhile, the thickness of the first electrode layer 282a may be about 5 nm to about 30 nm. When the thickness of the first electrode layer 282a is less than 5 nm, it is difficult to form a uniform film. When the thickness of the first electrode layer 282a exceeds 30 nm, contact resistance increases.

According to the fifth embodiment, the ratio of the work function of the second reflective layer 250 to the work function of the first electrode layer 282a of the second electrode 282 is 1:0.8 to 1:1.2, the work function of the first electrode layer 282a of the second electrode 282 is similar to the work function of the second reflective layer 250 and thus contact resistance decreases. Therefore, light with higher output power may be emitted even at a lower operating voltage.

According to the fifth embodiment, by setting thickness of the first electrode layer 282a of the second electrode 282 to 5 nm to 30 nm, contact resistance decreases and thus light with higher output power may be emitted at a lower operating voltage.

Referring to FIG. 24 again, the second electrode layer 282b may be disposed on the first electrode layer 282a. For example, the second electrode layer 282b may be in contact with the upper surface of the first electrode layer 282a, without being limited thereto.

The second electrode layer 282b may serve to enhance adhesive force between the first electrode layer 282a and the third electrode layer 282c and to increase electrical conductivity, such that flow flows well. The electrode layer may include at least one of titanium (Ti), nickel (Ni) or tungsten (W).

The thickness of the second electrode layer 282b may be greater than that of the first electrode layer 282a. The thickness of the second electrode layer 282b may be defined as a gap between a lower surface disposed on the second reflective layer 250 and an upper surface disposed under the third electrode layer. A ratio of the thickness of the first electrode layer 282a to the thickness of the second electrode layer 282b may be about 1:3 to about 1:10. When the ratio of the thickness of the first electrode layer 282a to the thickness of the second electrode layer 282b is less than 1:3, adhesive force may weaken. When the ratio of the thickness of the first electrode layer 282a to the thickness of the second electrode layer 282b exceeds 1:10, the thickness may increase.

The third electrode layer 282c may be disposed on the second electrode layer 282b. For example, the third electrode layer 282c may be in contact with the upper surface of the second electrode layer 282b, without being limited thereto.

The third electrode layer 282c may serve to enhance bonding force during wire bonding. For example, the third electrode layer 282c may include gold (Au), without being limited thereto.

The thickness of the third electrode layer 282c may be equal to or greater than that of the second electrode layer 282b.

Sixth Embodiment

Figure 28:
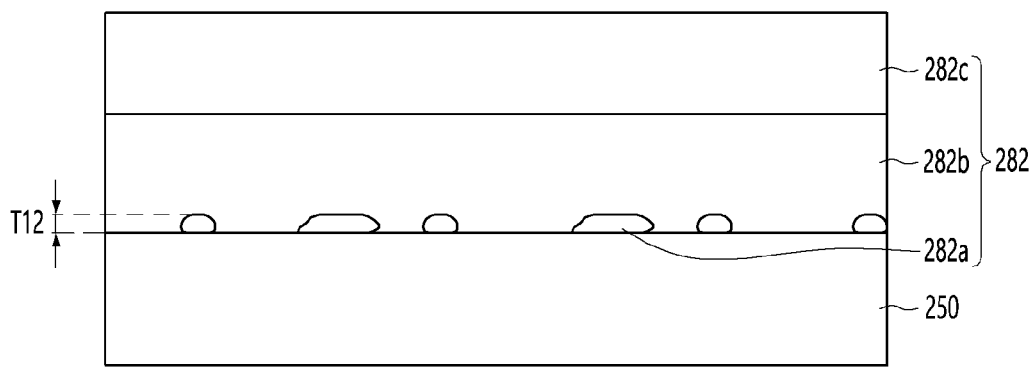
FIG. 28 is a cross-sectional view showing a second electrode of a surface-emitting laser device according to a sixth embodiment.
Figure 29:
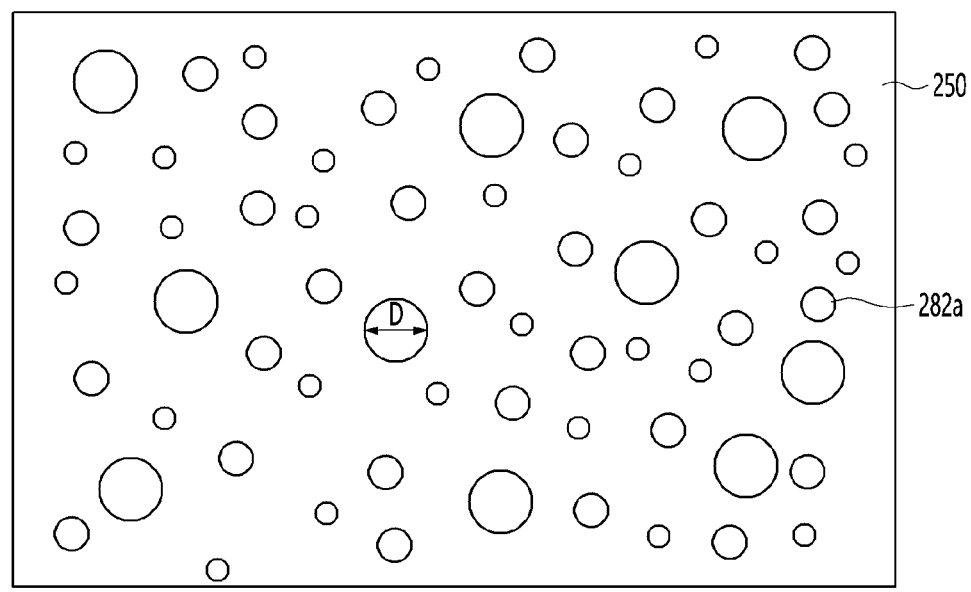
FIG. 29 is a plan view showing a first electrode layer of a second electrode of the surface-emitting laser device according to the sixth embodiment.

FIG. 28 is a cross-sectional view showing a second electrode of a surface-emitting laser device according to a sixth embodiment. FIG. 29 is a plan view showing a first electrode layer of a second electrode of the surface-emitting laser device according to the sixth embodiment.

The sixth embodiment is equal to the fifth embodiment except that the first reflective layer of the second electrode 282 has nano dots. In the sixth embodiment, components having the same functions, shapes and/or structures as the fifth embodiment are denoted by the same reference numerals and the detailed description thereof will be omitted.

Referring to FIGS. 28 and 29, in the surface-emitting laser device 201 according to the sixth embodiment, the second electrode 282 may be disposed on the second reflective layer 250.

The second electrode 282 may include a plurality of electrode layers. The electrode layers may include, for example, the first electrode layer 282a, the second electrode layer 282b and the third electrode layer 282c, but is not limited thereto.

The second electrode layer 282b and the third electrode layer 282c have the same functions, shapes and/or structures as the second electrode layer 282b and the third electrode layer 282c described in the fifth embodiment and thus the detailed description thereof will be omitted.

In the sixth embodiment, the first electrode layer 282a may have a nano-dot structure. The nano-dot structure has a dot form or shape and may mean a plurality of patterns having a fine size (nm). The pattern may include a convex shape, a concave shape, a random shape, etc.

The first electrode layer 282a may include a plurality of nano patterns. The nano pattern may be referred to as a pattern, a dot, a nano dot, a particle, a minute particle, a projection or a protrusion.

The shape of the nano pattern may be random. Accordingly, the sizes of nano patterns may be different from each other. The thicknesses T of the nano patterns may be different from each other. The diameters D of the nano patterns may be different from each other.

For example, the thickness T of the nano pattern may be about 0.5 nm to about 30 nm. For example, the diameter D of the nano pattern may be 0.5 nm to 300 nm. For example, the diameter D of the nano pattern may be 0.5 nm to 100 nm.

The nano patterns may be spaced apart from each other or may be in contact with each other. For example, some nano patterns may be spaced apart from each other and the other nano patterns may be in contact with each other. Accordingly, a nano-pattern group including at least two nano patterns which are in contact with each other may be disposed in a plurality of first regions. A nano-pattern group including at least two nano patterns which are spaced apart from each other at different distances or the same distance may be disposed in a plurality of second regions.

For example, a distance between the nano patterns may be expressed by Equation 1 below.

$$D \leq L \leq 3D \quad \text{Equation 1}$$

where, L may denote the distance between the nano patterns and D may denote the diameter of the nano pattern.

The distance between the nano patterns may be equal to or greater than the diameter of the nano pattern and may be equal to or less than three times of the diameter of the nano pattern. For example, the distance between the nano patterns may be 0.5 nm to 90 nm.

A ratio of the total area of the second reflective layer 250 to the area of the first electrode layer 282a may be about 1:0.5 to about 1:0.9. For example, the ratio of the total area of the second reflective layer 250 to the area of the first electrode layer 282a may be about 1:0.5 to about 1:0.75.

When the ratio of the total area of the second reflective layer 250 to the area of the first electrode layer 282a is less than 1:0.5, the contact area between the first electrode layer 282a and the first reflective layer may decrease and thus the contact resistance cannot decrease. When the ratio of the total area of the second reflective layer 250 to the area of the first electrode layer 282a exceeds 1:0.9, a structure substantially similar to that of the first embodiment may be achieved.

The second electrode layer 282b may be disposed on the first electrode layer 282a. Specifically, the second electrode layer 282b may be disposed on the second reflective layer 250 and the first electrode layer 282a.

The second electrode layer 282b may include a plurality of first regions and a plurality of second regions. In this case, the first regions of the second electrode layer 282b may be disposed between the nano patterns of the first electrode layer 282a and may be in contact with a portion of the upper surface of the second reflective layer 250. The second regions of the second electrode layer 282b may be in contact with the surfaces of the nano patterns of the first electrode layer 282a. That is, the second regions of the second electrode layer 282b may surround the nano patterns of the first electrode layer 282a. The nano patterns of the first electrode layer 282a may be separated by the second regions of the second electrode layer 282b.

According to the sixth embodiment, since the second electrode layer 282b is adhered not only to the second reflective layer 250 but also to the first electrode layer 282a, the adhesive force of the second electrode layer 282b may be improved, thereby preventing the second electrode 282 from being detached or removed.

According to the sixth embodiment, since the first reflective layer is formed with nano patterns having a random shape and the second electrode layer 282b is adhered to the surfaces of the nano patterns, the adhesion area of the second electrode 282 may increase, thereby further improving the adhesive force of the second electrode layer 282b.

According to the sixth embodiment, since a portion of the second electrode layer 282b having excellent electrical conductivity is in contact with the second reflective layer 250, current may directly flow from the second reflective layer 282b to the second reflective layer 250, and, since another portion of the second electrode layer 282b includes metal which minimizes the contact resistance with the second reflective layer 250, current may flow to the second reflective layer 250 through the first electrode layer 282a, thereby preventing current loss and reducing power consumption.

In the above description, the second electrode 282 includes the first to third electrode layers 282a, 282b and 282c. Additionally, the pad electrode electrically connected with the second electrode 282 may also include the first to third electrode layers 282a, 282b and 282c.

As another example, the pad electrode may include the second electrode layer 282b and the third electrode layer 282c or may not include the first electrode layer 282a. In this case, the second electrode layer 282b may be in contact with the upper surface of the passivation layer 270, without being limited thereto. Accordingly, the first electrode layer 282a may be disposed only in the second region of the second reflective layer 250 of each light emitter, and may not be disposed in the other region, that is, the first region of the second reflection layer and the passivation layer 270. The second region may surround the first region.

(Manufacturing Method)

Figure 30A:
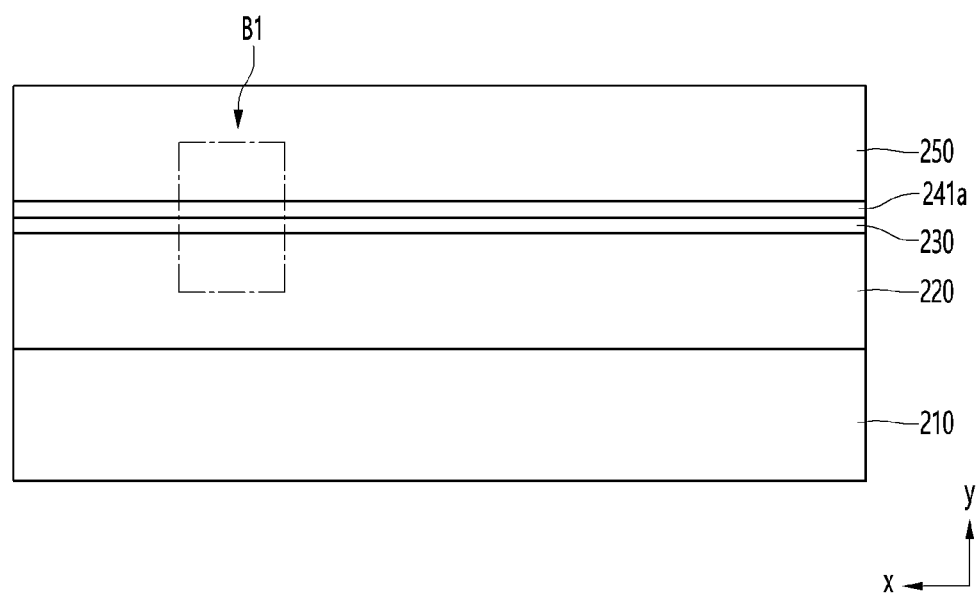
FIGS. 30a to 34c are views showing a method of manufacturing a surface-emitting laser device according to an embodiment.
Figure 30B:
Figure 31A:
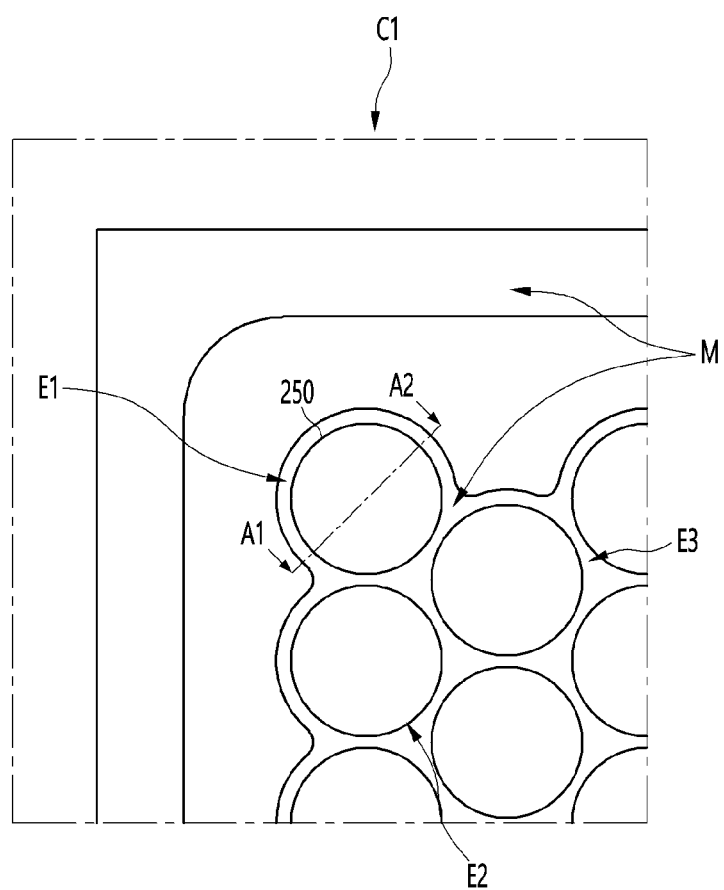
Figure 31B:
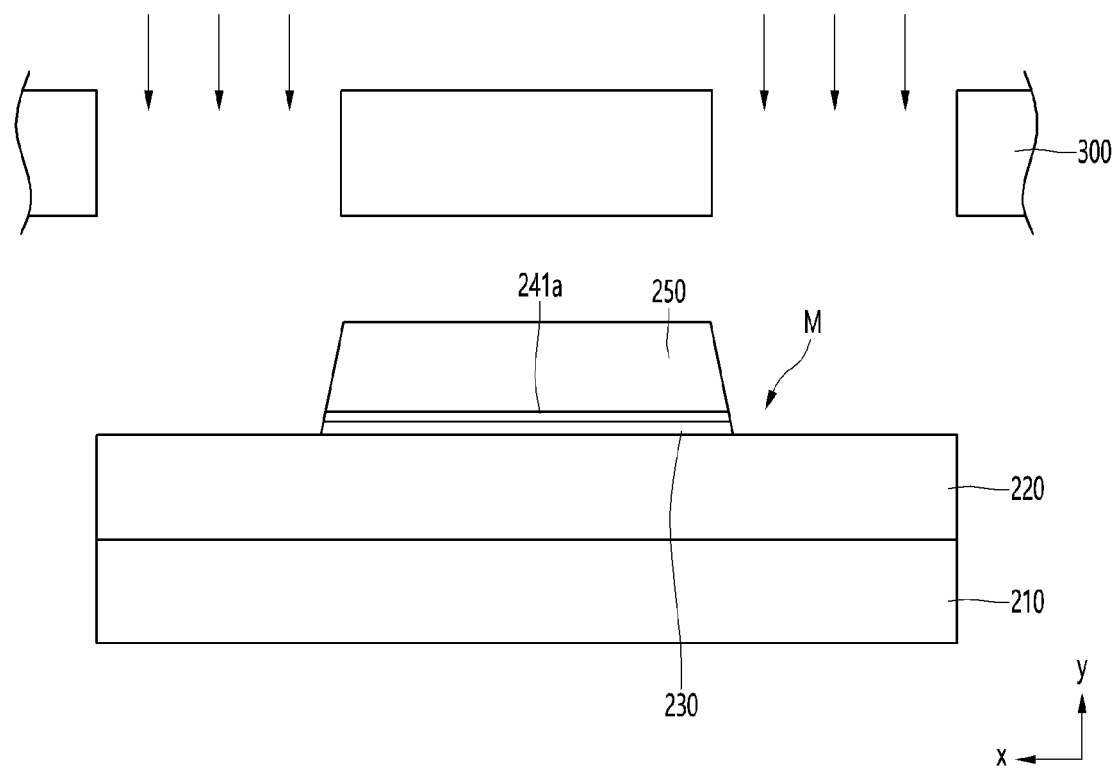
Figure 32A:
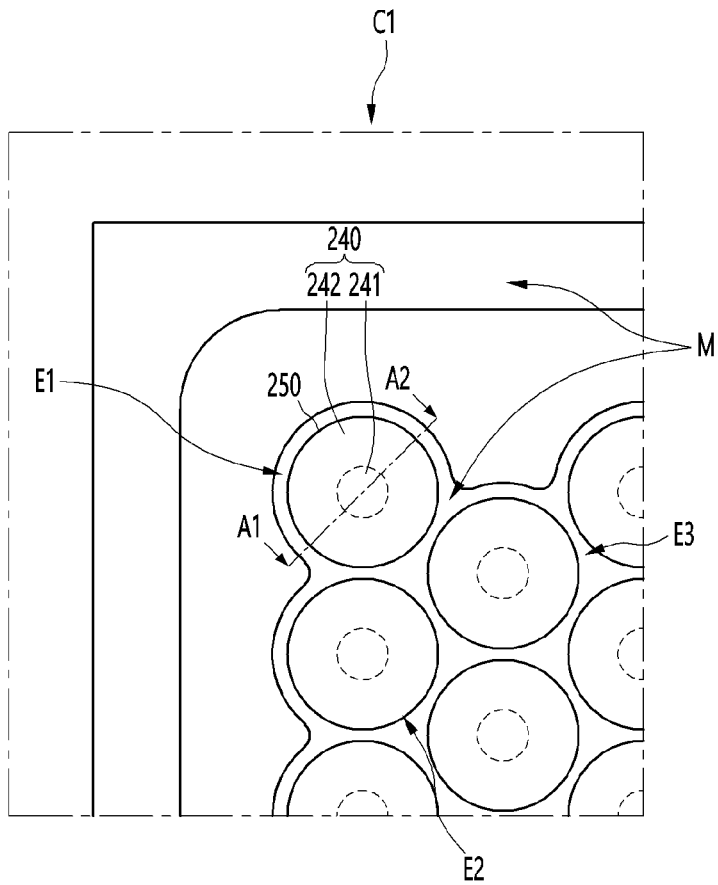
Figure 32B:
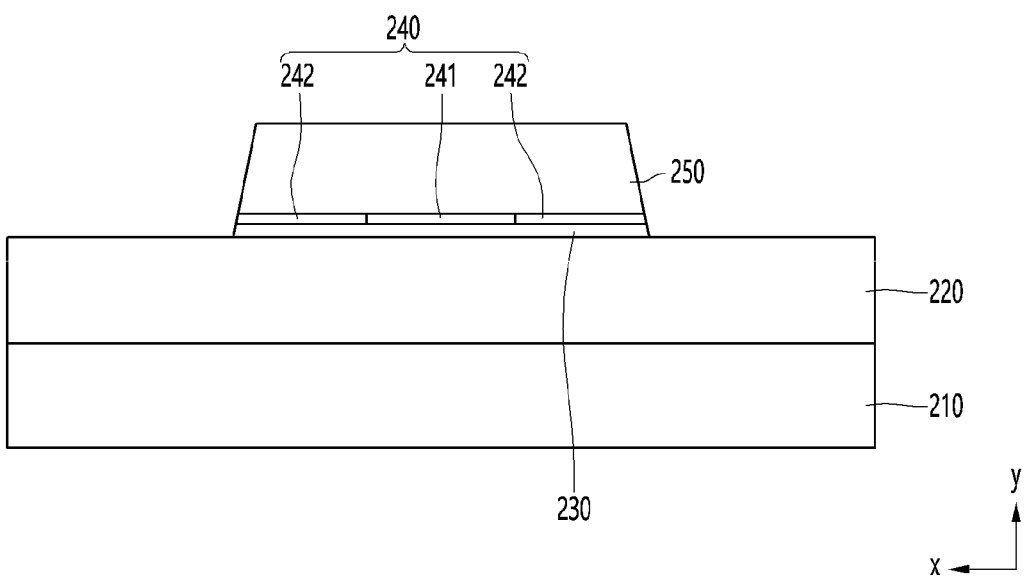
Figure 33A:
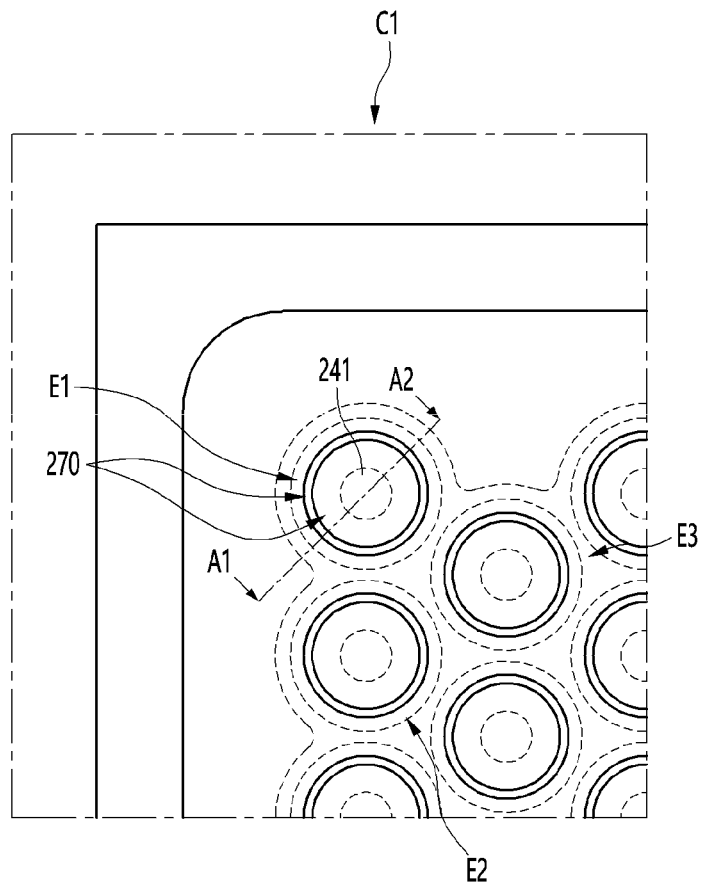
Figure 33B:
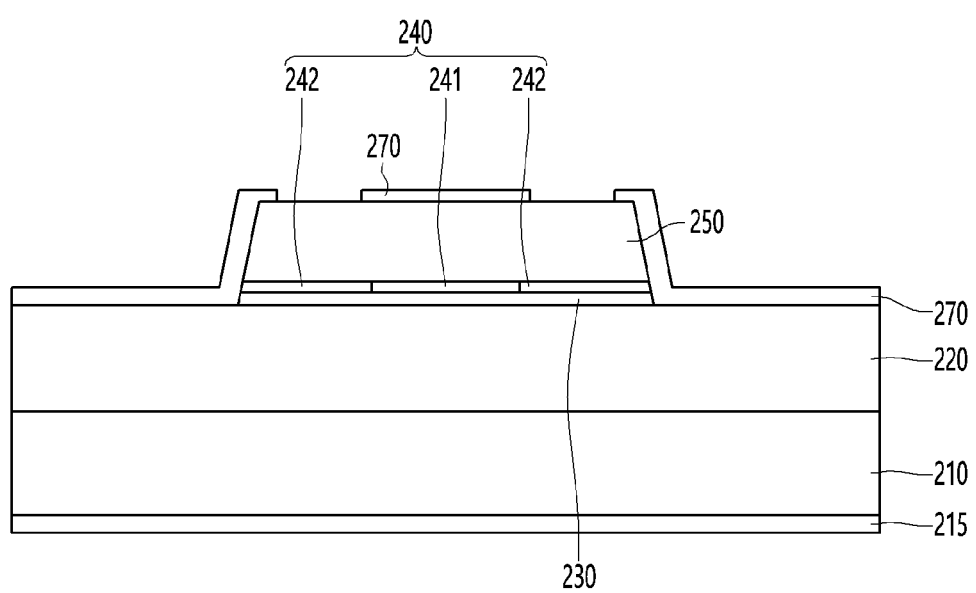

Hereinafter, a method of manufacturing the surface-emitting laser device according to the embodiment will be described with reference to FIGS. 30a and 34c. Meanwhile, the following manufacturing method is applicable to the manufacturing method of the first to sixth embodiments.

FIGS. 30a to 33b are similar or equal to FIGS. 18a to 21c and are easily understood from these drawings and thus a further description thereof will be omitted.

Figure 34A:
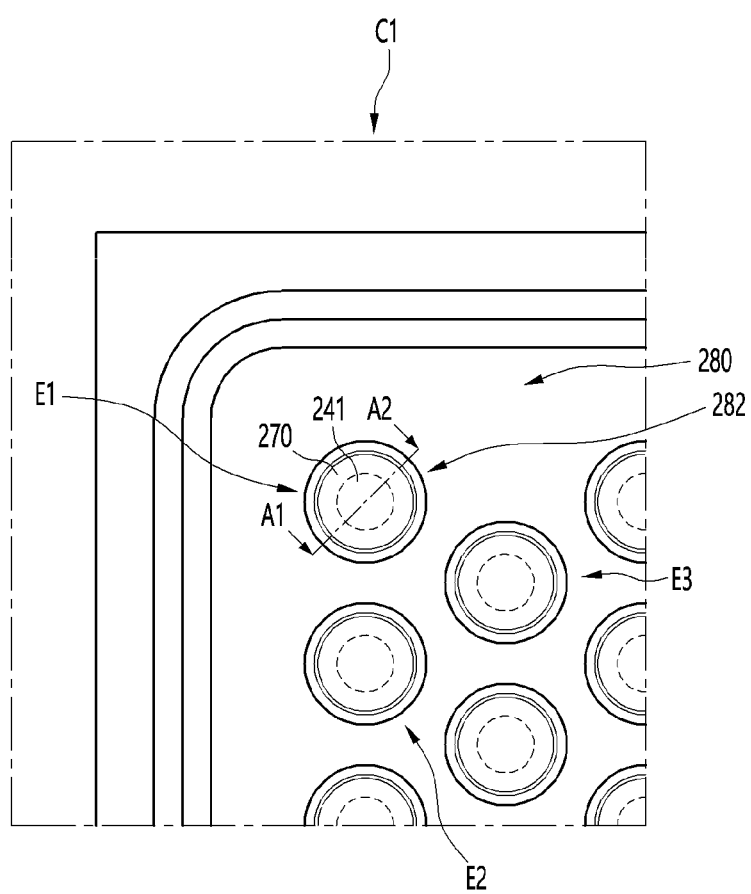
Figure 34B:
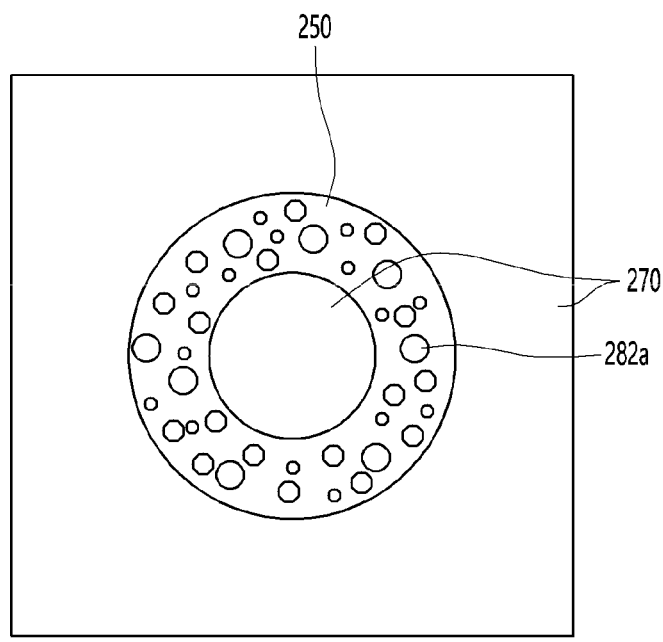
Figure 34C:
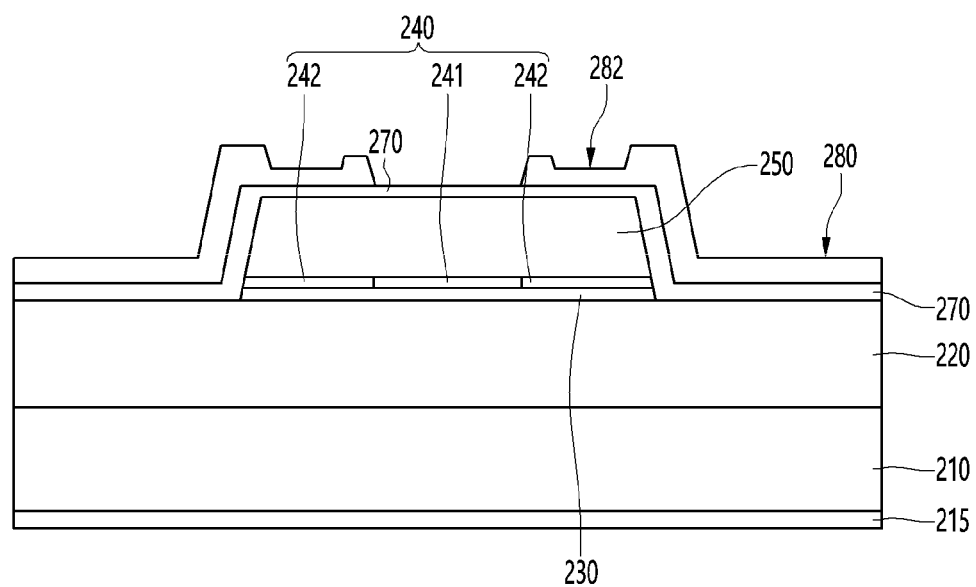

FIG. 34a is an enlarged view of a first region portion C1 of the surface-emitting laser device according to the embodiment, FIG. 34b is a plan view showing a state in which the first electrode layer 282a of the second electrode 282 is formed, and FIG. 34c is a cross-sectional view of the surface-emitting laser device according to the embodiment shown in FIG. 34a, taken along line A1-A2.

According to the embodiment, as shown in FIG. 34b, the second electrode 282 may be disposed on the second reflective layer 250. The second electrode 282 may be partially in contact with and electrically connected with the second reflective layer 250.

The second electrode 282 may include a plurality of electrode layers. The electrode layers may include, for example, the first electrode layer 282a, the second electrode layer 282b and the third electrode layer 282c described in the first to sixth embodiments.

The first electrode layer 282a may include a plurality of nano patterns having a random shape as shown in FIG. 34b (see FIGS. 28 and 29 related to the sixth embodiment).

Alternatively, the first electrode layer 282a may be disposed in the entire region of the second reflective layer 250 (see FIG. 24 related to the fifth embodiment).

The first electrode layer 282a has been described in the first and sixth embodiments and thus a further description thereof will be omitted.

The first reflective layer 282a including the plurality of nano patterns shown in FIG. 34b may be formed using a mask or an annealing process.

As an example, a mask having a fine opening may be provided in correspondence with an exposed region of the second reflective layer 250, and metal such as platinum (Pt) for forming the first electrode layer 282a may be formed on the mask using a sputtering process. Meal which has passed through the fine opening of the mask may be adhered to the exposed region of the second reflective layer 250, thereby forming nano patterns. The size of the metal adhered to the exposed region of the second reflective layer 250 may be determined by the diameter of the opening of the mask. For example, when all the plurality of openings of the mask is constant, all the sizes of the metal adhered to the exposed region of the second reflective layer 250 may be constant. For example, when the plurality of openings of the mask has different sizes, the metal adhered to the exposed region of the second reflective layer 250 may be formed with different sizes, that is, random shapes.

As another example, a metal film having a fine thickness may be formed in the exposed region of the second reflective layer 250 using a sputtering process. At this time, the metal film is fine and has bad film quality and thus may be formed with a plurality of first patterns spaced apart from each other. Thereafter, by applying heat using the annealing process, a plurality of second patterns having a greater size than the first patterns may be formed with nano patterns due to an aggregation phenomenon wherein the first patterns are adhered to each other. For example, in the annealing process, heat of 700° C. to 800° C. may be applied in the nitrogen atmosphere for 1 minute. The formed nano patterns may have a thickness of about 0.5 nm to about 30 nm and a diameter of 0.5 nm to 300 nm.

Thereafter, the second electrode layer 282b may be formed on the first electrode layer 282a and the third electrode layer 282c may be formed on the second electrode layer 282b, thereby forming the second electrode 282 including the first to third electrode layers 282a, 282b and 282c.

Next, the second electrode 280 which is electrically in contact with the second electrode 282 may be formed, and the second electrode 280 may extend to the upper portion of the passivation layer 270, thereby receiving current from the outside.

The second electrode 282 and the second electrode 280 may be made of a conductive material. For example, the second electrode 282 과 the second electrode 280 may include at least one of aluminum (Al), titanium (Ti), chromium (Cr), platinum (Pt), nickel (Ni), copper (Cu), and gold (Au), and may be formed in a single layer or multilayer structure.

Next, the first electrode 215 may be disposed under the substrate 210. Before the first electrode 215 is disposed, a portion of the bottom of the substrate 210 may be removed by a predetermined grinding process, thereby improving heat dissipation efficiency. The first electrode 215 may be made of a conductive material, such as metal. For example, the first electrode 215 may include at least one of aluminum (Al), titanium (Ti), chromium (Cr), platinum (Pt), nickel (Ni), copper (Cu), and gold (Au), and may be formed in a single layer or multilayer structure.

The above-described semiconductor device may be a laser diode, and the inside of two reflective layers may function as a resonator. At this time, when electrons and holes are supplied from the first reflective layer 220 of a first conductive type and the second reflective layer 250 of a second conductive type to an active layer such that light emitted from the active region 230 is reflected and amplified from the inside of the resonator to reach threshold current and is emitted to the outside through the aperture 241.

Light emitted from the semiconductor device according to the embodiment may be light having a single wavelength and a single phase, and a single wavelength region may be changed according to the composition of the first reflective layer 220, the second reflective layer 250 and the active region 230.

Figure 35:
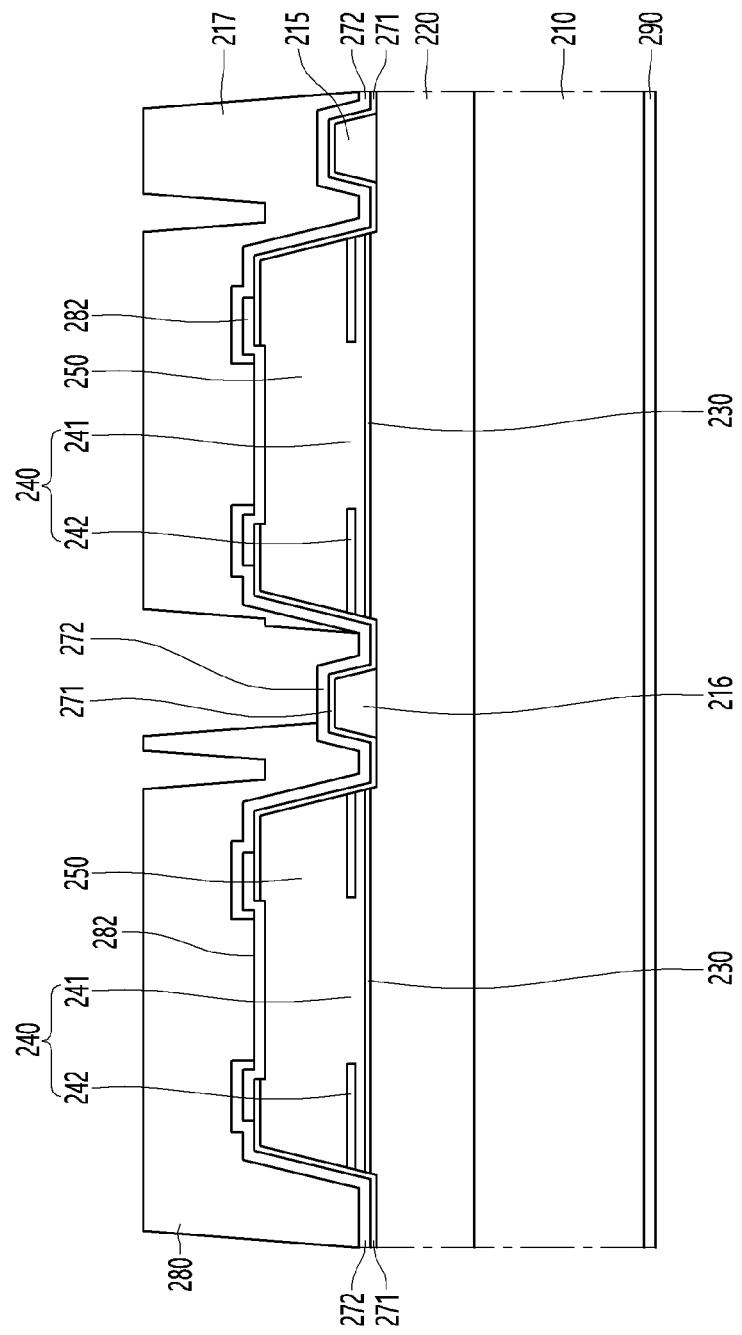
FIG. 35 is a cross-sectional view of a flip-chip type surface-emitting laser device according to an embodiment.

(Flip-Chip Type Surface-Emitting Laser Device)
FIG. 35 is a cross-sectional view of a flip-chip type surface-emitting laser device according to an embodiment.

The surface-emitting laser devices according to the first to sixth embodiments are applicable to the flip-chip type surface-emitting laser device shown in FIG. 35.

The surface-emitting laser device according to the embodiment may be of a flip-chip type in which the first electrode 215 and the second electrode 282 are directed in the same direction as shown in FIG. 35, in addition to a vertical type.

For example, as shown in FIG. 35, another surface-emitting laser device according to the embodiment may include one or more of first electrode portions 215 and 217, a substrate 210, a first reflective layer 220, an active region 230, an aperture region 240, a second reflective layer 250, second electrode portions 280 and 282, a first passivation layer 271, a second passivation layer 272, and a non-reflective layer 290. At this time, reflectivity of the second reflective layer 250 may be set to be higher than that of the first reflective layer 220.

At this time, the first electrode portions 215 and 217 may include the first electrode 215 and the first pad electrode 217, the first electrode 215 may be electrically connected to the first reflective layer 220 exposed through a predetermined mesa process, and the first pad electrode 217 may be electrically connected to the first electrode 215.

The first electrode portions 215 and 217 may be made of a conductive material such as metal. For example, the first electrode 215 may include at least one of aluminum (Al), titanium (Ti), chromium (Cr), platinum (Pt), nickel (Ni), copper (Cu), and gold (Au), and may be formed in a single layer or multilayer structure. the first electrode 215 and the first pad electrode 217 may include the same metal or different metals.

When the first reflective layer 220 is an n-type reflective layer, the first electrode 215 may be an electrode for the n-type reflective layer.

The second electrode portions 280 and 282 may include the contact electrode 282 and the second electrode 280, the second electrode 282 may be electrically connected to the second reflective layer 250, and the second electrode 280 may be electrically connected to the contact electrode 282.

When the second reflective layer 250 is a p-type reflective layer, the second electrode 282 may be a p-type electrode.

The second electrode according to the first to sixth embodiments are equally applicable to the second electrode 282 of the flip-chip type surface-emitting laser device.

The first insulating layer 271 and the second insulating layer 272 may be made of an insulating material such as nitride or oxide, and, for example, may include at least one of polyimide, silica ($SiO_2$) or silicon nitride ($Si_3N_4$).

Embodiments provide a surface-emitting laser device having an electrode structure having high reliability.

In addition, embodiments provide a surface-emitting laser device capable of solving optical problems such as pattern division of emitted beams or increase in divergence angle of emitted beams.

In addition, embodiments provide a surface-emitting laser device capable of improving ohmic characteristics.

Figure 36:
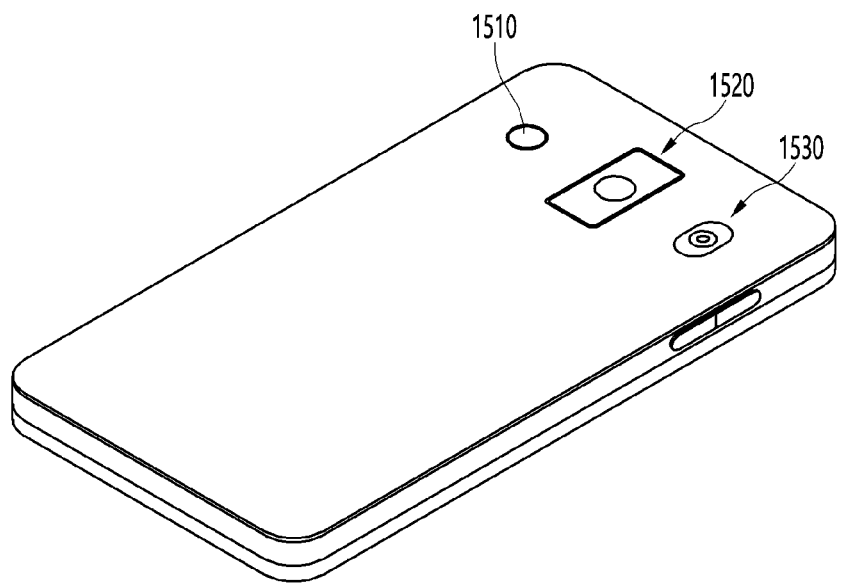
FIG. 36 is a perspective view of a mobile terminal, to which a surface-emitting laser device according to an embodiment is applied.

(Mobile Terminal)
FIG. 36 is a perspective view of a mobile terminal, to which a surface-emitting laser device according to an embodiment is applied.

The vertical type surface-emitting laser devices according to the first to sixth embodiments and the flip-chip type surface-emitting laser device shown in FIG. 35 are applicable to the mobile terminal shown in FIG. 36.

As shown in FIG. 36, the mobile terminal 1500 of the embodiment may include a camera module 1520 provided on a rear surface thereof, a flash module 1530 and an autofocus device 1510. Here, the autofocus device 1510 includes one of the packages of the surface-emitting laser devices according to the above-described embodiments as a light emitting layer.

The flash module 1530 may include a light emitting device for emitting light therein. The flash module 1530 may operate by operating the camera of the mobile terminal or by control of a user.

The camera module 1520 may include an image capturing function and an autofocus function. For example, the camera module 1520 may include an autofocus function using an image.

The autofocus device 1510 may include an autofocus function using laser. The autofocus device 1510 may be mainly used under the condition in which the autofocus function deteriorates, such as proximity of 10 m or less or a dark environment. The autofocus device 1510 may include a light emitting layer including the surface-emitting laser device of the above-described embodiment and a light receiving unit for converting light energy into electrical energy, such as a photodiode.

The above exemplary embodiments are therefore to be construed in all aspects as illustrative and not restrictive. The scope of the embodiments should be determined by the appended claims and their legal equivalents, not by the above description, and all changes coming within the meaning and equivalency range of the appended claims are intended to be embraced therein.

INDUSTRIAL APPLICABILITY

Embodiments are applicable to an electronic apparatus, to which a semiconductor light emitting device is applicable.

The invention claimed is:

1. A surface-emitting laser device comprising:
   a first reflective layer;
   an active region disposed on the first reflective layer;
   an aperture region disposed on the active region and including an aperture and an insulating region;
   a second reflective layer disposed on the aperture region;
   a second electrode formed on a top surface of the second reflective layer, and electrically connected to the second reflective layer;
   a passivation layer formed on the top surface and side surfaces of the second reflective layer, the passivation layer being formed between the second reflective layer and the second electrode,
   wherein at least a portion of the second reflective layer is directly between the aperture region and the second electrode, and
   wherein the second electrode includes:
      a first conductive layer;
      a second conductive layer on the first conductive layer;
      a third conductive layer on the second conductive layer;
      a fourth conductive layer on the third conductive layer;
      a fifth conductive layer on the fourth conductive layer; and
      a sixth conductive layer on the fifth conductive layer,
      wherein the first conductive layer includes Ti, and
      wherein the sixth conductive layer includes Au.

2. The surface-emitting laser device of claim 1, wherein at least one of the second to fifth conductive layers includes Ti.

3. The surface-emitting laser device of claim 1, wherein at least one of the second to fifth conductive layers includes Au.

4. The surface-emitting laser device of claim 1, wherein at least one of the second to fifth conductive layers includes Pt.

5. The surface-emitting laser device of claim 1, wherein at least two of the first to sixth conductive layers are stacked in pair.

6. The surface-emitting laser device of claim 1, wherein Ti and Au of the first to sixth conductive layers are stacked in pair.

7. The surface-emitting laser device of claim 1, wherein a thickness of the sixth conductive layer is greater than that of each of the first to fifth conductive layers.

8. The surface-emitting laser device of claim 1, wherein a thickness of a conductive layer including Ti is less than that of a conductive layer including Au.

9. The surface-emitting laser device of claim 1,
   wherein the second conductive layer includes Pt,
   wherein the third conductive layer includes Au,
   wherein the fourth conductive layer includes Ti, and
   wherein the fifth conductive layer incudes Pt.

10. The surface-emitting laser device of claim 1,
    wherein a thickness of the first conductive layer is 20 nm to 150 nm,
    wherein a thickness of the second conductive layer is 30 nm to 1200 nm,
    wherein a thickness of the third conductive layer is 80 nm to 1500 nm,
    wherein a thickness of the fourth conductive layer is 30 nm to 1200 nm,
    wherein a thickness of the fifth conductive layer is 30 nm to 150 nm, and
    wherein a thickness of the sixth conductive layer is 800 nm to 2000 nm.

11. The surface-emitting laser device of claim 1, wherein the second electrode includes a seventh conductive layer between the third conductive layer and the fourth conductive layer.

12. The surface-emitting laser device of claim 11, wherein at least one of the second to fifth conductive layers and the seventh conductive layer includes Ti.

13. The surface-emitting laser device of claim 11, wherein at least one of the second to fifth conductive layers and the seventh conductive layer includes Au.

14. The surface-emitting laser device of claim 11, wherein at least one of the second to fifth conductive layers and the seventh conductive layer includes Pt.

15. The surface-emitting laser device of claim 11, wherein at least one of the second to fifth conductive layers and the seventh conductive layer includes W.

16. The surface-emitting laser device of claim 11, wherein the second conductive layer includes Pt,
    wherein the third conductive layer includes Au,
    wherein the fourth conductive layer includes Ti,
    wherein the fifth conductive layer includes Pt, and
    wherein the seventh conductive layer includes W.

17. The surface-emitting laser device of claim 11,
    wherein a thickness of the first conductive layer 20 nm to 150 nm,
    wherein a thickness of the second conductive layer is 30 nm to 1200 nm,
    wherein a thickness of the third conductive layer is 80 nm to 200 nm,
    wherein a thickness of the seventh conductive layer is 70 nm to 200 nm,
    wherein a thickness of the fourth conductive layer is 30 nm to 1200 nm, wherein a thickness of the fifth conductive layer is 30 nm to 150 nm, and wherein a thickness of the sixth conductive layer is 800 nm to 4000 nm.

18. The surface-emitting laser device of claim 1, wherein the first conductive layer includes a bonding layer.

19. The surface-emitting laser device of claim 1, wherein the sixth conductive layer includes a current spreading layer.

20. The surface-emitting laser device of claim 1, wherein the second to fifth conductive layers include a barrier layer.

* * * * *